US012635573B2

(12) United States Patent
Hayashi et al.

(10) Patent No.: US 12,635,573 B2
(45) Date of Patent: May 19, 2026

(54) SEMICONDUCTOR DEVICE

(71) Applicant: ROHM CO., LTD., Kyoto (JP)

(72) Inventors: Kenji Hayashi, Kyoto (JP); Takumi Kanda, Kyoto (JP); Ryosuke Fukuda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 692 days.

(21) Appl. No.: 18/004,990

(22) PCT Filed: Jul. 27, 2021

(86) PCT No.: PCT/JP2021/027696
§ 371 (c)(1),
(2) Date: Jan. 10, 2023

(87) PCT Pub. No.: WO2022/025041
PCT Pub. Date: Feb. 3, 2022

(65) Prior Publication Data
US 2023/0343755 A1      Oct. 26, 2023

(30) Foreign Application Priority Data

Jul. 28, 2020   (JP) ................................. 2020-127637
Sep. 23, 2020   (JP) ................................. 2020-158985

(51) Int. Cl.
*H10W 90/00*        (2026.01)
*H10W 70/40*        (2026.01)
(Continued)

(52) U.S. Cl.
CPC ......... *H10W 90/00* (2026.01); *H10W 70/442* (2026.01); *H10W 70/481* (2026.01);
(Continued)

(58) Field of Classification Search
None
See application file for complete search history.

(56) References Cited

U.S. PATENT DOCUMENTS

2014/0027891 A1*   1/2014   Kimura ................... H01L 24/83
                                                              438/122
2020/0091130 A1*   3/2020   Taniguchi ........... H01L 23/3121

FOREIGN PATENT DOCUMENTS

DE        102013217801 A1        3/2015
JP          2006165322 A          6/2006
(Continued)

OTHER PUBLICATIONS

International Search Report and Written Opinion issued for International Patent Application No. PCT/JP2021/027696, Date of mailing: Oct. 12, 2021, 9 pages including English translation of Search Report.
Notice of Reasons for Refusal issued for Japanese Patent Application No. 2022-539481, Dispatched date: Apr. 22, 2025, 5 pages including English machine translation.

(Continued)

*Primary Examiner* — Sue A Purvis
*Assistant Examiner* — Jordan M Klein
(74) *Attorney, Agent, or Firm* — HSML P.C.

(57)        ABSTRACT

A semiconductor device includes two first switching elements mounted on a first die pad. Each of the two first switching elements includes a first control electrode connected to a first control lead by a first control connection member. The first control connection member includes a lead connector connected to the first control lead and electrode connectors connected between the lead connector and the first control electrodes of the first switching elements. The electrode connectors are equal in length. Thus, the connection members between the first control lead and the first control electrodes of the first switching elements are equal in length.

23 Claims, 64 Drawing Sheets

(51) Int. Cl.
  *H10W 72/00*        (2026.01)
  *H10W 72/30*        (2026.01)
  *H10W 72/60*        (2026.01)
  *H10W 74/10*        (2026.01)

(52) U.S. Cl.
  CPC .......... *H10W 72/60* (2026.01); *H10W 90/811*
        (2026.01); *H10W 72/352* (2026.01); *H10W*
        *72/355* (2026.01); *H10W 72/631* (2026.01);
          *H10W 72/634* (2026.01); *H10W 72/647*
        (2026.01); *H10W 72/886* (2026.01); *H10W*
        *74/114* (2026.01); *H10W 90/736* (2026.01);
          *H10W 90/763* (2026.01); *H10W 90/766*
                                    (2026.01)

(56)              References Cited

FOREIGN PATENT DOCUMENTS

JP      2007234690 A      9/2007
JP      2014120638 A      6/2014
JP      2015228445 A     12/2015
JP      2017174951 A      9/2017
JP      2020047658 A      3/2020
WO      2012137760 A1    10/2012

OTHER PUBLICATIONS

Office Action issued for German Patent Application No. 11 2021
002 918.5, dated Dec. 9, 2025, 15 pages including English machine
translation.

* cited by examiner

SEMICONDUCTOR DEVICE

TECHNICAL FIELD

The present disclosure relates to a semiconductor device.

BACKGROUND ART

A conventional semiconductor device includes a lead frame including a die pad and a plurality of leads, a transistor mounted on the die pad, wires connecting electrodes of the transistor to the leads, and an encapsulation resin encapsulating the transistor and the wires (for example, refer to Patent Literature 1).

CITATION LIST

Patent Literature

Patent Literature 1: Japanese Laid-Open Patent Publication No. 2017-174951

SUMMARY OF INVENTION

Technical Problem

A semiconductor device may include a plurality of transistors depending on the current flowing through the semiconductor device. The transistors are connected in parallel to each other. More specifically, each transistor has a control electrode and a drive electrode, and the control electrodes and the drive electrodes are connected to the same pad by wires. In this case, for example, the length of the wire connected to the control electrode differs between the transistors. This produces variations among the transistors in electrical properties such as inductance values (L) and resistance values (R) between the control electrode and the lead. Such variations in electrical properties affect operation of the transistors, for example, on-off timing. The semiconductor device described above is used in, for example, an inverter circuit or a DC-DC converter circuit. In such a case, taking into consideration variations of transistors included in the two semiconductor devices, a large margin needs to be designed.

It is an objective of the present disclosure to provide a semiconductor device that includes a plurality of switching elements and is configured to reduce variations in electric properties.

Solution to Problem

An aspect of the present disclosure is a semiconductor device that includes a die pad, switching elements, a control lead, and a control connection member. The die pad includes a main surface. Each of the switching elements includes an element main surface and an element back surface that face in opposite directions and further includes a control electrode and a main surface drive electrode that are formed on the element main surface and a back surface drive electrode that is formed on the element back surface. The back surface drive electrode is connected to the main surface. The control lead is disposed separate from the die pad. The control connection member connects the control electrodes of the switching elements to the control lead. The control connection member includes a lead connector and electrode connectors. The lead connector includes a first end and a second end. The first end of the lead connector is connected to the control lead. The electrode connectors are connected between the second end of the lead connector and the control electrodes of the switching elements. The electrode connectors are equal in length.

In this specification, "equal" includes an error due to manufacturing variations and includes values that are not exactly equal.

In this structure, the switching elements are equal in the electrical length from the control electrode to the control lead. This reduces variations in electrical properties such as inductance values and resistance values among the switching elements.

Another aspect of the present disclosure is a semiconductor device that includes a die pad, switching elements, a control lead, and a control connection member. The die pad includes a main surface. Each of the switching elements includes an element main surface and an element back surface that face in opposite directions and further includes a control electrode and a main surface drive electrode that are formed on the element main surface and a back surface drive electrode that is formed on the element back surface. The back surface drive electrode is connected to the element main surface. The control lead is disposed separate from the die pad. The control connection member connects the control electrodes of the switching elements to the control lead. The switching elements are disposed so that the control electrodes align in a first direction that is parallel to the main surface. The control connection member includes an electrode connector, a lead connector, and a joint. The electrode connector linearly extends in the first direction and is connected to the control electrodes of the switching elements. The lead connector is disposed parallel to the electrode connector and is connected to the control lead. The joint joins an end of the electrode connector and an end of the lead connector located opposite from the control lead.

In this structure, current flows in opposite directions to the lead connector and the electrode connector, which are disposed parallel to each other. The currents flowing in opposite directions produce a magnetic field, which reduces mutual inductance. Thus, variations among the switching elements in inductance value, which is an electrical property, are reduced.

Another aspect of the present disclosure is a semiconductor device that includes a die pad, switching elements, a control lead, and a control connection member. The die pad includes a main surface. Each of the switching elements includes an element main surface and an element back surface that face in opposite directions and further includes a control electrode and a main surface drive electrode that are formed on the element main surface and a back surface drive electrode that is formed on the element back surface. The back surface drive electrode is connected to the element main surface. The control lead is disposed separate from the die pad. The control connection member connects the control electrodes of the switching elements to the control lead. The switching elements are disposed so that the control electrodes align in a first direction that is parallel to the main surface. The switching elements include a first element, a second element, and a third element. The second element and the third element are located at opposite sides of the first element in the first direction. The control connection member includes a lead connector including a distal end and a proximal end, the proximal end being connected to the control lead, a first branch part and a second branch part connected to the distal end of the lead connector, a first connection part connected between a distal end of the first branch part and the control electrode of the first element, a second connection part connected between a distal end of the second branch part and the control electrode of the first element, a third connection part connected between the distal end of the first branch part and the control electrode of the second element, and a fourth connection part connected between the distal end of the second branch part and the control electrode of the third element.

In this structure, among the switching elements, the difference in the resistance value between the control electrode of each switching element and the control lead is reduced. Thus, variations among the switching elements in the resistance value, which is an electrical property, are reduced.

Advantageous Effects of Invention

According to an aspect of the present disclosure, the semiconductor device includes a plurality of switching elements and is configured to reduce variations in electrical properties.

BRIEF DESCRIPTION OF DRAWINGS

FIG. 14 is a plan view showing a semiconductor device in a modified example.

FIG. 15 is a plan view showing a semiconductor device in a fourth embodiment.

FIG. 17.

FIG. 17 is a plan view showing a semiconductor device in a fifth embodiment.

FIG. 19 is a plan view showing a semiconductor device in a sixth embodiment.

DESCRIPTION OF EMBODIMENTS

Figure 1:
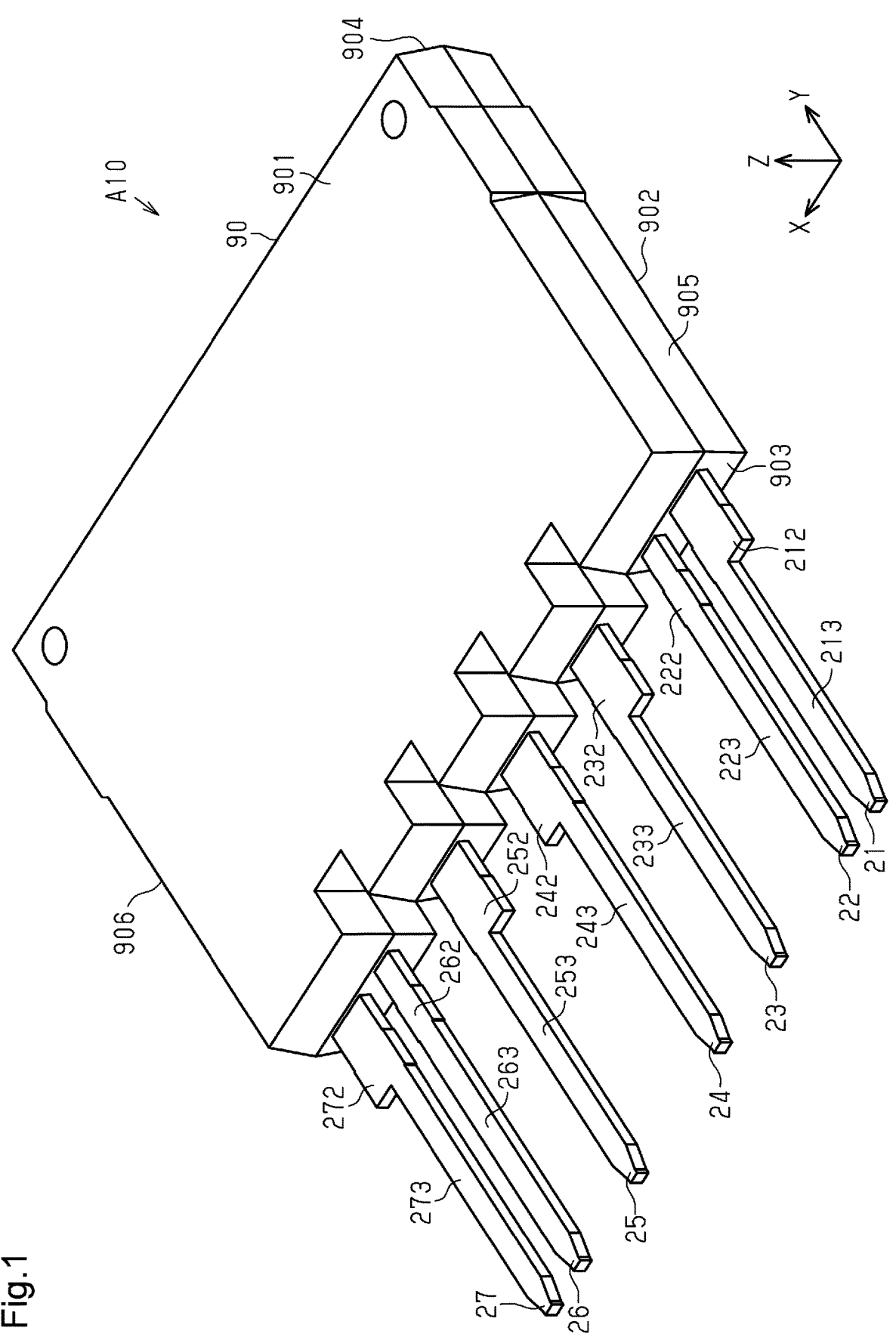
FIG. 1 is a perspective view showing a semiconductor device in a first embodiment.

Embodiments and modified examples will hereafter be described with reference to the drawings. The embodiments and modified examples described below exemplify configurations and methods for embodying a technical concept and are not intended to limit the material, shape, structure, arrangement, dimensions, and the like of each component to those described below. The embodiments and modified examples described below may undergo various modifications. The embodiments and modified examples described below may be combined as long as the combined modified examples remain technically consistent with each other.

In this specification, "a state in which member A is connected to member B" includes a case in which member A and member B are directly connected physically and a case in which member A and member B are indirectly connected by another member that does not affect the electric connection state.

Similarly, "a state in which member C is disposed between member A and member B" includes a case in which member A is directly connected to member C or member B is directly connected to member C and a case in which member A is indirectly connected to member C by another member that does not affect the electric connection state or member B is indirectly connected to member C by another member that does not affect the electric connection state.

First Embodiment

A first embodiment of a semiconductor device A10 will now be described with reference to FIGS. 1 to 6.

As shown in FIGS. 1 to 6, the semiconductor device A10 includes a first die pad 11, a second die pad 12, leads 21 to 27, first switching elements 30*a* and 30*b*, second switching elements 40*a* and 40*b*, and an encapsulation resin 90. The semiconductor device A10 further includes first drive connection members 53, a second drive connection member 54, a first control connection member 51, a second control connection member 57, a first source connection member 52, and a second source connection member 56.

Encapsulation Resin

The encapsulation resin 90 covers the first die pad 11, the second die pad 12, the first switching elements 30*a* and 30*b*, and the second switching elements 40a and 40b. The encapsulation resin 90 also covers part of the leads 21 to 27.

Figure 2:
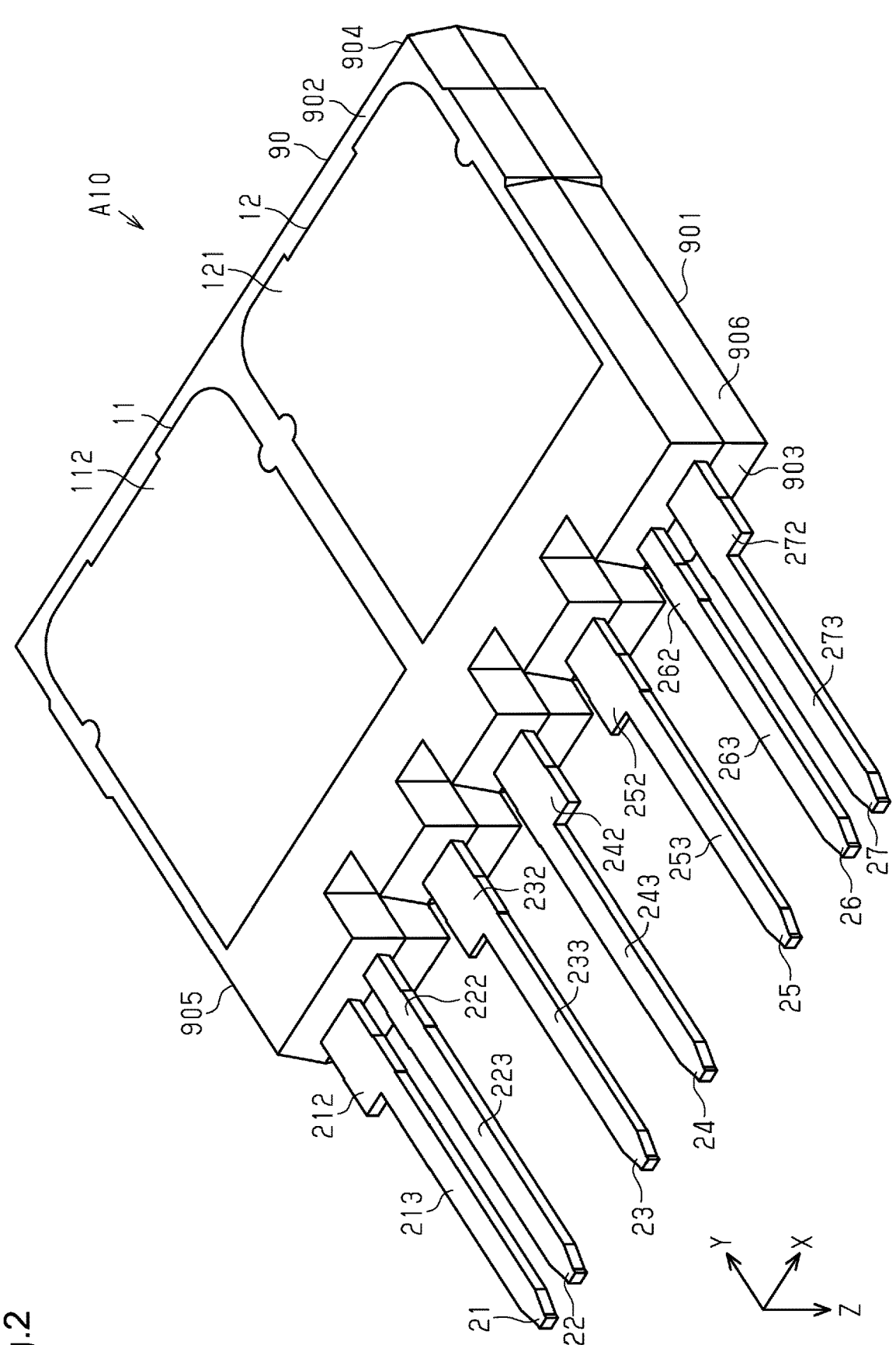
FIG. 2 is a perspective view showing the semiconductor device in the first embodiment.

As shown in FIGS. 1 and 2, the encapsulation resin 90 is low-profile-rectangular-box-shaped. In this specification, "rectangular-box-shaped" includes the shape of a rectangular box having a chamfered corner or a chamfered edge and the shape of a rectangular box having a rounded corner or a rounded edge. In addition, the structure may have a surface partially or entirely having irregularities, a curved surface, or multiple surfaces.

The encapsulation resin 90 is formed of an electrically-insulative synthetic resin. In an example, the encapsulation resin 90 is epoxy resin. The synthetic resin forming the encapsulation resin 90 is, for example, colored black. In FIGS. 3 to 6, the encapsulation resin 90 is shown by single-dashed lines, and members disposed in the encapsulation resin 90 are shown by solid lines. In the description hereafter, the thickness-wise direction of the encapsulation resin 90 is referred to as a thickness-wise direction Z. A direction orthogonal to the thickness-wise direction Z is referred to as a width-wise direction X. A direction orthogonal to the thickness-wise direction Z and the width-wise direction X is referred to as a length-wise direction Y. The width-wise direction X corresponds to a second direction. The length-wise direction Y corresponds to a first direction.

The encapsulation resin 90 includes a resin main surface 901, a resin back surface 902, and first to fourth resin side surfaces 903 to 906. The resin main surface 901 and the resin back surface 902 face in opposite directions in the thickness-wise direction Z. The first to fourth resin side surfaces 903 to 906 face in any direction that is parallel to the resin main surface 901 and the resin back surface 902. The first resin side surface 903 and the second resin side surface 904 face in opposite directions in the length-wise direction Y. The third resin side surface 905 and the fourth resin side surface 906 face in opposite directions in the width-wise direction X.

Figure 3:
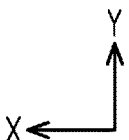
FIG. 3 is a plan view showing the semiconductor device in the first embodiment.
Figure 4:
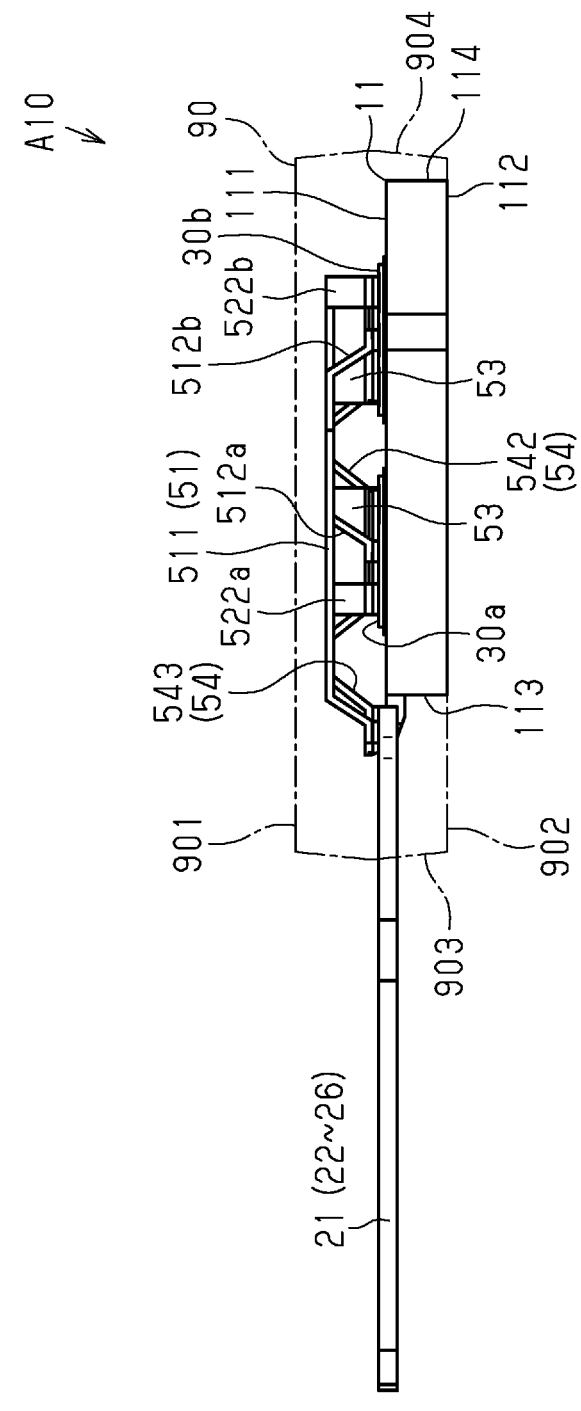
FIG. 4 is a side view showing the semiconductor device in the first embodiment.
Figure 4:
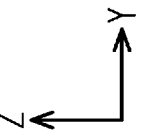

FIG. 3 shows the semiconductor device A10 as viewed from the resin main surface 901 of the encapsulation resin 90. As shown in FIG. 3, as the semiconductor device A10 is viewed in the thickness-wise direction Z, the encapsulation resin 90 is rectangular such that the long sides extend in the width-wise direction X and the short sides extend in the length-wise direction Y The first resin side surface 903 and the second resin side surface 904 are side surfaces extending in the width-wise direction X. The third resin side surface 905 and the fourth resin side surface 906 are side surfaces extending in the length-wise direction Y.

First Die Pad and Second Die Pad

The first die pad 11 and the second die pad 12 are rectangular. The first die pad 11 and the second die pad 12 are formed of, for example, copper (Cu). In the present embodiment, "formed of Cu" is intended as being formed of Cu or an alloy including Cu. In addition, an object formed of Cu includes an object, the surface of which is partially or entirely covered with a plating layer.

The first die pad 11 includes a main surface 111, a back surface 112, and first to fourth side surfaces 113 to 116. The main surface 111 and the back surface 112 face in opposite directions in the thickness-wise direction Z. The main surface 111 of the first die pad 11 and the resin main surface 901 of the encapsulation resin 90 face in the same direction. The first to fourth side surfaces 113 to 116 face in one of the width-wise direction X and the length-wise direction Y. In the present embodiment, the first side surface 113 and the second side surface 114 face in opposite directions in the length-wise direction Y. The third side surface 115 and the fourth side surface 116 face in opposite directions in the width-wise direction X.

The second die pad 12 includes a main surface 121, a back surface 122, and first to fourth side surfaces 123 to 126. The main surface 121 and the back surface 122 face in opposite directions in the thickness-wise direction Z. The main surface 121 of the second die pad 12 and the resin main surface 901 of the encapsulation resin 90 face in the same direction. The first to fourth side surfaces 123 to 126 face in one of the width-wise direction X and the length-wise direction Y. In the present embodiment, the first side surface 123 and the second side surface 124 face in opposite directions in the length-wise direction Y. The third side surface 125 and the fourth side surface 126 face in opposite directions in the width-wise direction X.

The first die pad 11 and the second die pad 12 are disposed so that the main surfaces 111 and 121 are located at the same position in the thickness-wise direction Z. The first die pad 11 and the second die pad 12 have the same thickness. The thickness of the first die pad 11 and the second die pad 12 is greater than or equal to 1 mm and less than or equal to 3 mm. Preferably, the thickness of the first die pad 11 and the second die pad 12 is, for example, greater than or equal to 2 mm and less than or equal to 3 mm. The back surface 112 of the first die pad 11 and the back surface 122 of the second die pad 12 are located at the same position in the thickness-wise direction Z. As shown in FIG. 2, the back surface 112 of the first die pad 11 and the back surface 122 of the second die pad 12 are exposed from the resin back surface 902 of the encapsulation resin 90. In the present embodiment, the back surface 112 of the first die pad 11, the back surface 122 of the second die pad 12, and the resin back surface 902 of the encapsulation resin 90 are flush with each other.

The first die pad 11 and the second die pad 12 are arranged in order in the width-wise direction X. The fourth side surface 116 of the first die pad 11 and the third side surface 125 of the second die pad 12 are opposed to each other. The distance between the first die pad 11 and the second die pad 12 is less than or equal to the thickness of the first die pad 11 and the second die pad 12 and is, for example, greater than or equal to 1 mm and less than or equal to 3 mm. The first die pad 11 and the second die pad 12 are disposed so that the first side surfaces 113 and 123 are located at the same position in the length-wise direction Y.

Lead

As shown in FIGS. 1 to 3, the semiconductor device A10 includes multiple (in the present embodiment, seven) leads 21 to 27. The leads 21 to 27 project from the first resin side surface 903 of the encapsulation resin 90. The leads 21 to 27 extend in the length-wise direction Y. The leads 21 to 27 are arranged in the width-wise direction X. In the present embodiment, the leads 21 to 27 are arrange in order from the third resin side surface 905 toward the fourth resin side surface 906 of the encapsulation resin 90. The width-wise direction X is the direction in which the first die pad 11 and the second die pad 12 are arranged in order. Thus, the leads 21 to 27 are arranged in the arrangement direction of the first die pad 11 and the second die pad 12. The leads 21 to 27 are formed of Cu. In the present embodiment, the semiconductor device A10 includes a first control lead 21, a first source lead 22, a first drive lead 23, a second drive lead 24, an output lead 25, a second source lead 26, and a second control lead 27 as the leads.

First Control Lead

As shown in FIG. 3, the first control lead 21 includes a pad portion 211, a base portion 212, and a substrate connector 213. The pad portion 211 is located separate from the first die pad 11 toward the first resin side surface 903 of the encapsulation resin 90 in the length-wise direction Y. The base portion 212 extends from the pad portion 211 in the length-wise direction Y and projects from the first resin side surface 903 of the encapsulation resin 90. The substrate connector 213 extends from a distal end of the base portion 212 in the length-wise direction Y. In the width-wise direction X, the width of the base portion 212 is larger than the width of the substrate connector 213. In the width-wise direction X, the base portion 212 projects beyond the substrate connector 213 toward the third resin side surface 905 of the encapsulation resin 90.

First Source Lead

The first source lead 22 includes a pad portion 221, a base portion 222, and a substrate connector 223. The pad portion 221 is located separate from the first die pad 11 toward the first resin side surface 903 of the encapsulation resin 90 in the length-wise direction Y. The base portion 222 extends from the pad portion 221 in the length-wise direction Y and projects from the first resin side surface 903 of the encapsulation resin 90. The substrate connector 223 extends from a distal end of the base portion 222 in the length-wise direction Y. In the present embodiment, the base portion 222 and the substrate connector 223 of the first source lead 22 have the same width.

First Drive Lead

The first drive lead 23 includes a connection portion 231, a base portion 232, and a substrate connector 233. The connection portion 231 is connected to the first die pad 11. In the present embodiment, the first drive lead 23 is formed integrally with the first die pad 11. The first drive lead 23 and the first die pad 11 form an integrated first lead frame 14. The base portion 232 extends from the connection portion 231 in the length-wise direction Y and projects from the first resin side surface 903 of the encapsulation resin 90. The substrate connector 233 extends from a distal end of the base portion 232 in the length-wise direction Y. In the width-wise direction X, the width of the base portion 232 is larger than the width of the substrate connector 233. In the width-wise direction X, the base portion 232 projects beyond the substrate connector 233 toward the first source lead 22.

Second Drive Lead

The second drive lead 24 includes a pad portion 241, a base portion 242, and a substrate connector 243. The pad portion 241 is located separate from the second die pad 12 toward the first resin side surface 903 of the encapsulation resin 90 in the length-wise direction Y. The pad portion 241 extends along the first side surface 123 of the second die pad 12. The base portion 242 extends from the pad portion 241 in the length-wise direction Y and projects from the first resin side surface 903 of the encapsulation resin 90. The substrate connector 243 extends from a distal end of the base portion 242 in the length-wise direction Y. In the width-wise direction X, the width of the base portion 242 is larger than the width of the substrate connector 243. In the width-wise direction X, the base portion 242 projects beyond the substrate connector 243 toward the output lead 25.

Output Lead

The output lead 25 includes a connection portion 251, a base portion 252, and a substrate connector 253. The connection portion 251 is connected to the second die pad 12. In the present embodiment, the output lead 25 is formed integrally with the second die pad 12. The output lead 25 and the second die pad 12 form an integrated second lead frame 15. The base portion 252 extends from the connection portion 251 in the length-wise direction Y and projects from the first resin side surface 903 of the encapsulation resin 90. The substrate connector 253 extends from a distal end of the base portion 252 in the length-wise direction Y. In the width-wise direction X, the width of the base portion 252 is larger than the width of the substrate connector 253. In the width-wise direction X, the base portion 252 projects beyond the substrate connector 253 toward the second drive lead 24.

Second Source Lead

The second source lead 26 includes a pad portion 261, a base portion 262, and a substrate connector 263. The pad portion 261 is located separate from the second die pad 12 toward the first resin side surface 903 of the encapsulation resin 90 in the length-wise direction Y. The base portion 262 extends from the pad portion 261 in the length-wise direction Y and projects from the first resin side surface 903 of the encapsulation resin 90. The substrate connector 263 extends from a distal end of the base portion 262 in the length-wise direction Y. In the present embodiment, the base portion 262 and the substrate connector 263 of the second source lead 26 have the same width.

Second Control Lead

The second control lead 27 includes a pad portion 271, a base portion 272, and a substrate connector 273. The pad portion 271 is located separate from the second die pad 12 toward the first resin side surface 903 of the encapsulation resin 90 in the length-wise direction Y. The base portion 272 extends from the pad portion 271 in the length-wise direction Y and projects from the first resin side surface 903 of the encapsulation resin 90. The substrate connector 273 extends from a selection of the base portion 272 in the length-wise direction Y. In the width-wise direction X, the width of the base portion 272 is larger than the width of the substrate connector 273. In the width-wise direction X, the base portion 272 projects beyond the substrate connector 273 toward the fourth resin side surface 906 of the encapsulation resin 90.

In the present embodiment, the leads 21 to 27 are equal to each other in thickness. The thickness of each of the leads 21 to 27 is less than or equal to the thickness of the first die pad 11 and the second die pad 12. The thickness of each of the leads 21 to 27 is, for example, 0.6 mm. In the leads 21 to 27, the substrate connectors 213, 223, 233, 243, 253, 263, and 273 are equal to each other in width. In this specification, "equal" includes an error due to manufacturing variations and includes values that are not exactly equal. The width of the substrate connectors is, for example, 1.2 mm. The substrate connectors are inserted into component holes in a mount substrate and connected to conductive wires of the mount substrate by solder or the like (not shown).

In the present embodiment, the leads 21 to 27 are located so that adjacent leads in the width-wise direction X located between the first source lead 22 and the second source lead 26 are separated from each other by a larger distance than the distance between the first control lead 21 and the first source lead 22 and the distance between the second source lead 26 and the second control lead 27. In addition, in the present embodiment, the leads 22 to 26 are located so that the base portions 222, 232, 242, 252, and 262 are separated from one another by an equal distance.

First Switching Element and Second Switching Element

The first switching elements 30a and 30b are mounted on the main surface 111 of the first die pad 11. The second switching elements 40a and 40b are mounted on the main surface 121 of the second die pad 12. The first switching elements 30a and 30b and the second switching elements 40a and 40b are silicon carbide (SiC) chips. In the present embodiment, metal-oxide-semiconductor field-effect transistors (SiCMOSFETs) are used as the first switching elements 30a and 30b and the second switching elements 40a and 40b. The first switching elements 30a and 30b and the second switching elements 40a and 40b are capable of performing high-speed switching.

First Switching Element

As shown in FIG. 3, the first switching elements 30a and 30b have the shape of a flat plate. In the present embodiment, the first switching elements 30a and 30b are rectangular and elongated in the width-wise direction X as viewed in the thickness-wise direction Z. The first switching elements 30a and 30b include a first element main surface 301 and a first element back surface 302. The first element main surface 301 and the first element back surface 302 face in opposite directions in the thickness-wise direction Z. The first element main surface 301 and the resin main surface 901 face in the same direction. That is, the element main surface faces in the same direction as the main surface 111 of the first die pad 11. The first element back surface 302 is opposed to the main surface 111 of the first die pad 11. The two first switching elements 30a and 30b are arranged in a center of the first die pad 11 in the width-wise direction X. The two first switching elements 30a and 30b are arranged beside each other in the length-wise direction Y on the main surface 111 of the first die pad 11.

The first switching elements 30a and 30b each include a first main surface drive electrode 31 and a first control electrode 32 of the first element main surface 301 and a first back surface drive electrode 33 of the first element back surface 302. The first main surface drive electrode 31 is a source electrode. In the present embodiment, the first main surface drive electrode 31 includes a main source electrode 311 and two first source electrodes 312. The first control electrode 32 is a gate electrode. The first source electrodes 312 is a driver source electrode electrically connected to, for example, a circuit (driver) that drives the first switching elements 30a and 30b.

The first switching elements 30a and 30b are disposed so that the first control electrodes 32 face in the same direction. In the present embodiment, the two first switching elements 30a and 30b are disposed so that the first control electrodes 32 are located toward the third side surface 115 of the first die pad 11. The two first switching elements 30a and 30b are disposed so that the first control electrodes 32 align on a straight line. In addition, the first control electrodes 32 are located at a center of the first switching elements 30a and 30b in the length-wise direction Y. The main source electrode 311 of the first main surface drive electrode 31 is located beside the first control electrodes 32 in the width-wise direction X. The two first source electrodes 312 are located at opposite sides of the first control electrodes 32 in the length-wise direction Y. The first back surface drive electrode 33 is a drain electrode. The first back surface drive electrode 33 is electrically connected to the first die pad 11 by solder.

Second Switching Element

As shown in FIG. 3, the second switching elements 40a and 40b have the shape of a flat plate. In the present embodiment, the second switching elements 40a and 40b are rectangular and elongated in the width-wise direction X as viewed in the thickness-wise direction Z. Each of the second switching elements 40a and 40b includes a second element main surface 401 and a second element back surface 402. The second element main surface 401 and the second element back surface 402 face in opposite directions in the thickness-wise direction Z. The second element main surface 401 faces the resin main surface 901. That is, the element main surface faces in the same direction as the main surface 121 of the second die pad 12. The second element back surface 402 is opposed to the main surface 121 of the second die pad 12.

The second switching elements 40a and 40b each include a second main surface drive electrode 41 and a second control electrode 42 of the second element main surface 401 and a second back surface drive electrode 43 of the second element back surface 402. The second main surface drive electrode 41 is a source electrode. In the present embodiment, the second main surface drive electrode 41 includes a main source electrode 411 and two second source electrodes 412. The second control electrode 42 is a gate electrode. The second source electrodes 412 are driver source electrodes electrically connected to, for example, a circuit (driver) that drives the second switching elements 40a and 40b.

The second switching elements 40a and 40b are disposed so that the second control electrodes 42 face in the same direction. In the present embodiment, the two second switching elements 40a and 40b are disposed so that the second control electrodes 42 are located toward the fourth side surface 126 of the second die pad 12. The two second switching elements 40a and 40b are disposed so that the second control electrodes 42 align on a straight line. In addition, the second control electrodes 42 are located at a center of the second switching elements 40a and 40b in the length-wise direction Y. The main source electrode 411 of the second main surface drive electrode 41 is located beside the second control electrodes 42 in the width-wise direction X. The two second source electrodes 412 are located at opposite sides of the second control electrodes 42 in the length-wise direction Y The second back surface drive electrode 43 is a drain electrode. The second back surface drive electrode 43 is electrically connected to the second die pad 12 by solder.

Connection Member

Figure 7:
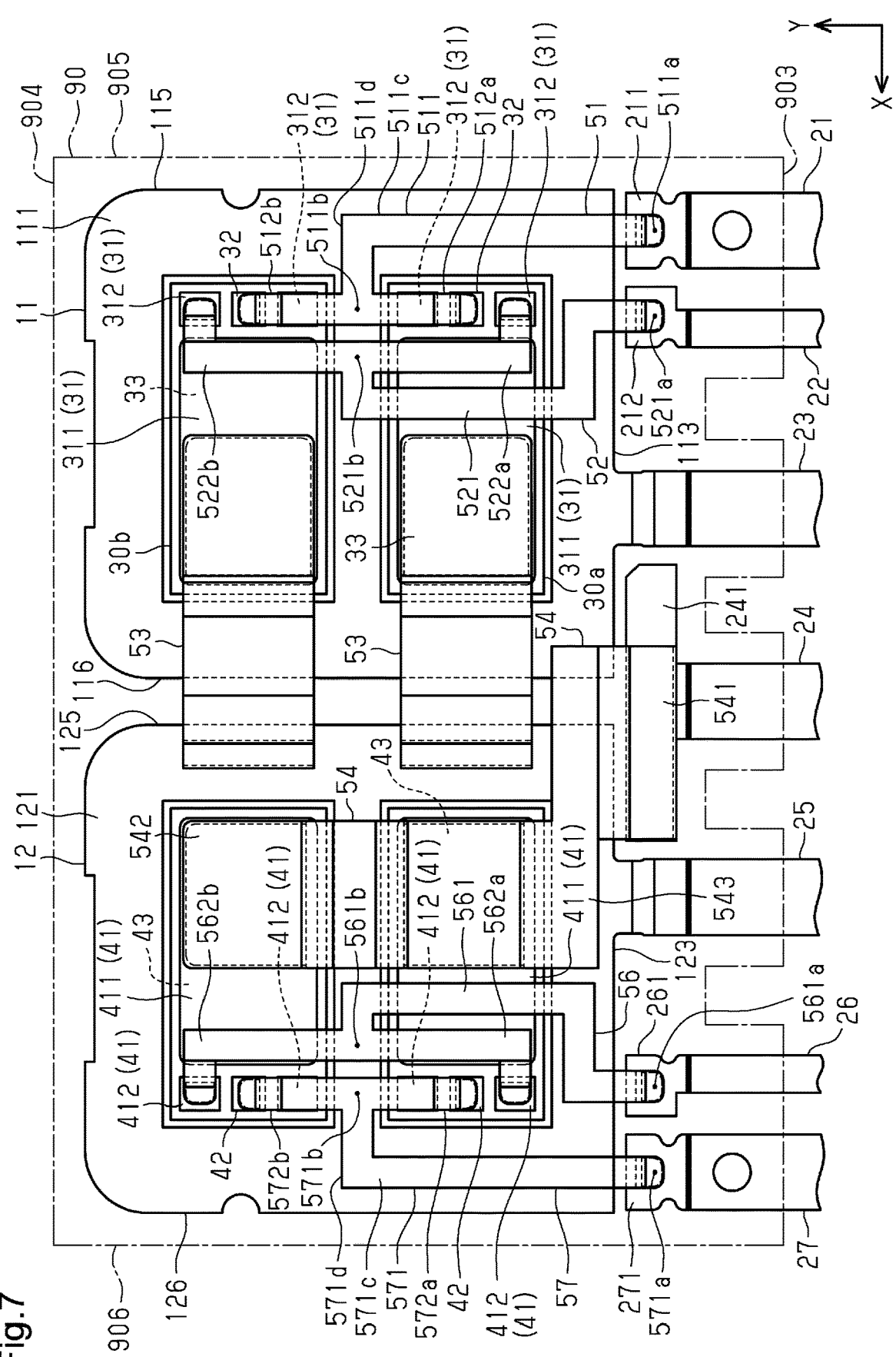
FIG. 7 is an enlarged partial view of FIG. 3.

As shown in FIGS. 3 and 7, the semiconductor device A10 includes the first control connection member 51 and the second control connection member 57.

The first control connection member 51 connects the first control electrodes 32 of the first switching elements 30a and 30b to the first control lead 21.

As shown in FIG. 7, the first control connection member 51 is a plate-shaped conductive member. The first control connection member 51 includes a lead connector 511 and two electrode connectors 512a and 512b. The lead connector 511 includes a first end 511a and a second end 511b. The first end 511a is connected to the first control lead 21 by solder. As viewed in the width-wise direction X, the second end 511b is disposed between the two first switching elements 30a and 30b.

The electrode connectors 512a and 512b are connected between the second end 511b of the lead connector 511 and the first control electrodes 32 of the first switching elements 30a and 30b, respectively. More specifically, the electrode connector 512a is connected between the second end 511b of the lead connector 511 and the first control electrode 32 of the first switching element 30a. The electrode connector 512a is connected to the first control electrode 32 by solder. The electrode connector 512b is connected between the second end 511b of the lead connector 511 and the first control electrode 32 of the first switching element 30b. The electrode connector 512b is connected to the first control electrode 32 by solder.

In the present embodiment, as viewed in the thickness-wise direction Z, the second end 511b of the lead connector

511 is located on a straight line extending between the first control electrodes 32 of the two first switching elements 30*a* and 30*b*. That is, the lead connector 511 includes a first connection part 511*c* extending in the length-wise direction Y and a second connection part 511*d* extending from a distal end of the first connection part 511*c*, as viewed in the width-wise direction X, between the two first switching elements 30*a* and 30*b* in the width-wise direction X. More specifically, the second end 511*b* of the lead connector 511 is located at an intermediate point between the first control electrodes 32 of the two first switching elements 30*a* and 30*b*.

The electrode connector 512*a* extends from the second end 511*b* toward the first control electrode 32 of the first switching element 30*a*. The electrode connector 512*b* extends from the second end 511*b* toward the first control electrode 32 of the first switching element 30*b*. Thus, the two electrode connectors 512*a* and 512*b* extend from the second end 511*b* of the lead connector 511 in opposite directions.

The first control electrode 32 of the first switching element 30*a* is connected to the first control lead 21 by the electrode connector 512*a* and the lead connector 511. The first control electrode 32 of the first switching element 30*b* is connected to the first control lead 21 by the electrode connector 512*b* and the lead connector 511. The two electrode connectors 512*a* and 512*b* are equal in length. The electrode connector 512*a* has a length that extends from the second end 511*b* of the lead connector 511 to the first control electrode 32 of the first switching element 30*a*. The electrode connector 512*b* has a length that extends from the second end 511*b* of the lead connector 511 to the first control electrode 32 of the first switching element 30*b*. The two electrode connectors 512*a* and 512*b* are equal in thickness and width. The first control connection member 51 is formed of Cu. The thickness of the first control connection member 51 is greater than or equal to 0.05 mm and less than or equal to 1.0 mm and is, preferably, greater than or equal to 0.5 mm.

As shown in FIGS. 3 and 7, the second control connection member 57 connects the second control electrodes 42 of the second switching elements 40*a* and 40*b* to the second control lead 27.

As shown in FIG. 7, the second control connection member 57 is a plate-shaped conductive member. The second control connection member 57 includes a lead connector 571 and two electrode connectors 572*a* and 572*b*.

The lead connector 571 includes a first end 571*a* and a second end 571*b*. The first end 571*a* is connected to the second control lead 27 by solder. As viewed in the width-wise direction X, the second end 571*b* is disposed between the two second switching elements 40*a* and 40*b*.

The electrode connectors 572*a* and 572*b* are connected between the second end 571*b* of the lead connector 571 and the second control electrodes 42 of the second switching elements 40*a* and 40*b*, respectively. More specifically, the electrode connector 572*a* is connected between the second end 571*b* of the lead connector 571 and the second control electrode 42 of the second switching element 40*a*. The electrode connector 572*a* is connected to the second control electrode 42 by solder. The electrode connector 572*b* is connected between the second end 571*b* of the lead connector 571 and the second control electrode 42 of the second switching element 40*b*. The electrode connector 572*b* is connected to the second control electrode 42 by solder.

In the present embodiment, as viewed in the thickness-wise direction Z, the second end 571*b* of the lead connector 571 is located on a straight line extending between the second control electrodes 42 of the two second switching elements 40*a* and 40*b*. That is, the lead connector 571 includes a first connection part 571*c* extending in the length-wise direction Y and a first connection part 571*d* extending from a distal end of the first connection part 571*c*, as viewed in the width-wise direction X, between the two second switching elements 40*a* and 40*b* in the width-wise direction X. More specifically, the second end 571*b* of the lead connector 571 is located at an intermediate point between the second control electrodes 42 of the two second switching elements 40*a* and 40*b*.

The electrode connector 572*a* extends from the second end 571*b* toward the first control electrode 32 of the second switching element 40*a*. The electrode connector 572*b* extends from the second end 571*b* toward the first control electrode 32 of the second switching element 40*b*. Thus, the two electrode connectors 572*a* and 572*b* extend from the second end 571*b* of the lead connector 571 in opposite directions.

The second control electrode 42 of the second switching element 40*a* is connected to the second control lead 27 by the electrode connector 572*a* and the lead connector 571. The second control electrode 42 of the second switching element 40*b* is connected to the second control lead 27 by the electrode connector 572*b* and the lead connector 571. The two electrode connectors 572*a* and 572*b* are equal in length. The electrode connector 572*a* has a length that extends from the second end 571*b* of the lead connector 571 to the second control electrode 42 of the second switching element 40*a*. The electrode connector 572*b* has a length that extends from the second end 571*b* of the lead connector 571 to the second control electrode 42 of the second switching element 40*a*. The two electrode connectors 572*a* and 572*b* are equal in thickness and width. The second control connection member 57 is formed of Cu. The thickness of the second control connection member 57 is greater than or equal to 0.05 mm and less than or equal to 1.0 mm and is, preferably, greater than or equal to 0.5 mm.

As shown in FIGS. 3 and 7, the semiconductor device A10 includes the first source connection member 52 and the second source connection member 56.

The first source connection member 52 connects the first source electrodes 312 of the first switching elements 30*a* and 30*b* to the first source lead 22.

As shown in FIG. 7, the first source connection member 52 is a plate-shaped conductive member. The first source connection member 52 includes a lead connector 521 and two electrode connectors 522*a* and 522*b*. The lead connector 521 includes a first end 521*a* and a second end 521*b*. The first end 521*a* is connected to the first source lead 22 by solder. The second end 521*b* is disposed between the two first switching elements 30*a* and 30*b*. The electrode connectors 522*a* and 522*b* are connected between the second end 521*b* of the lead connector 521 and the source electrodes 312 of the first switching elements 30*a* and 30*b*, respectively. More specifically, the electrode connector 522*a* is connected between the second end 521*b* of the lead connector 521 and the source electrode 312 of the first switching element 30*a*. The electrode connector 522*a* is connected to the source electrode 312 by solder. The electrode connector 522*b* is connected between the second end 521*b* of the lead connector 521 and the source electrode 312 of the first switching element 30*b*. The electrode connector 522*b* is connected to the source electrode 312 by solder. In the present embodiment, the first source connection member 52 is connected to the source electrodes 312, which are located at an outer side of the first control electrodes 32 on the two first switching elements 30a and 30b.

The source electrode 312 of the first switching element 30a is connected to the first source lead 22 by the electrode connector 522a and the lead connector 521. The source electrode 312 of the first switching element 30b is connected to the first source lead 22 by the electrode connector 522b and the lead connector 521. The two electrode connectors 522a and 522b are equal in length. The electrode connector 522a has a length that extends from the second end 521b of the lead connector 521 to the source electrode 312 of the first switching element 30a. The electrode connector 522b has a length that extends from the second end 521b of the lead connector 521 to the source electrode 312 of the first switching element 30b. The two electrode connectors 522a and 522b are equal in thickness and width. The first source connection member 52 is formed of Cu. The thickness of the first source connection member 52 is greater than or equal to 0.05 mm and less than or equal to 1.0 mm and is, preferably, greater than or equal to 0.5 mm.

As shown in FIGS. 3 and 7, the second source connection member 56 connects the second source electrodes 412 of the second switching elements 40a and 40b to the second source lead 26.

As shown in FIG. 7, the second source connection member 56 is a plate-shaped conductive member. The second source connection member 56 includes a lead connector 561 and two electrode connectors 562a and 562b. The lead connector 561 includes a first end 561a and a second end 561b. The first end 561a is connected to the first source lead 22 by solder. The second end 561b is disposed between the two second switching elements 40a and 40b. The electrode connectors 562a and 562b are connected between the second end 561b of the lead connector 561 and the source electrodes 412 of the second switching elements 40a and 40b, respectively. More specifically, the electrode connector 562a is connected between the second end 561b of the lead connector 561 and the source electrodes 412 of the second switching element 40a. The electrode connector 562a is connected to the source electrode 412 by solder. The electrode connector 562b is connected between the second end 561b of the lead connector 561 and the source electrode 412 of the second switching element 40b. The electrode connector 562b is connected to the source electrode 412 by solder. In the present embodiment, the second source connection member 56 is connected to the source electrodes 412, which are located at an outer side of the second control electrodes 42 on the second switching elements 40a and 40b.

The source electrode 412 of the second switching element 40a is connected to the first source lead 22 by the electrode connector 562a and the lead connector 561. The source electrode 412 of the second switching element 40b is connected to the first source lead 22 by the electrode connector 562b and the lead connector 561. The two electrode connectors 562a and 562b are equal in length. The electrode connector 562a has a length that extends from the second end 561b of the lead connector 561 to the source electrode 412 to the second switching element 40a. The electrode connector 562b has a length that extends from the second end 561b of the lead connector 561 to the source electrode 412 to the second switching element 40b. The two electrode connectors 562a and 562b are equal in thickness and width. The second source connection member 56 is formed of Cu. The thickness of the second source connection member 56 is greater than or equal to 0.05 mm and less than or equal to 1.0 mm and is, preferably, greater than or equal to 0.5 mm.

As shown in FIGS. 3 and 7, the semiconductor device A10 includes the first drive connection members 53 and the second drive connection member 54.

The first drive connection members 53 connect the first main surface drive electrodes 31 (main source electrodes 311) of the first switching elements 30a and 30b to the second die pad 12. The second back surface drive electrodes 43 (drain electrodes) of the second switching elements 40a and 40b are connected to the second die pad 12. The output lead 25 is also connected to the second die pad 12. That is, the output lead 25 connects the source electrodes of the first switching elements 30a and 30b and the drain electrodes of the second switching elements 40a and 40b.

Figure 5:
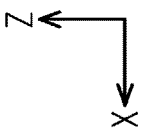
FIG. 5 is a cross-sectional view taken along line 5-5 in FIG. 3.

As shown in FIG. 7, the first drive connection members 53 are plate-shaped conductive members and are referred to as a clip. A conductive plate is bent to form the first drive connection members 53. The first drive connection members 53 are belt-shaped and extend in the width-wise direction X. In the present embodiment, the first main surface drive electrodes 31 of the two first switching elements 30a and 30b are connected to the second die pad 12 by the first drive connection members 53. As shown in FIG. 5, one end of the first drive connection members 53 is connected to the first main surface drive electrode 31 of the first switching elements 30a and 30b, respectively. The other end of the first drive connection members 53 is connected to the second die pad 12 by solder. The first drive connection members 53 are formed of Cu. The thickness of the first drive connection members 53 is greater than or equal to 0.05 mm and less than or equal to 1.0 mm and is, preferably, greater than or equal to 0.5 mm.

As shown in FIGS. 3 and 7, the second drive connection member 54 connects the second main surface drive electrodes 41 (the main source electrodes 411) of the second switching elements 40a and 40b to the second drive lead 24.

Figure 6:
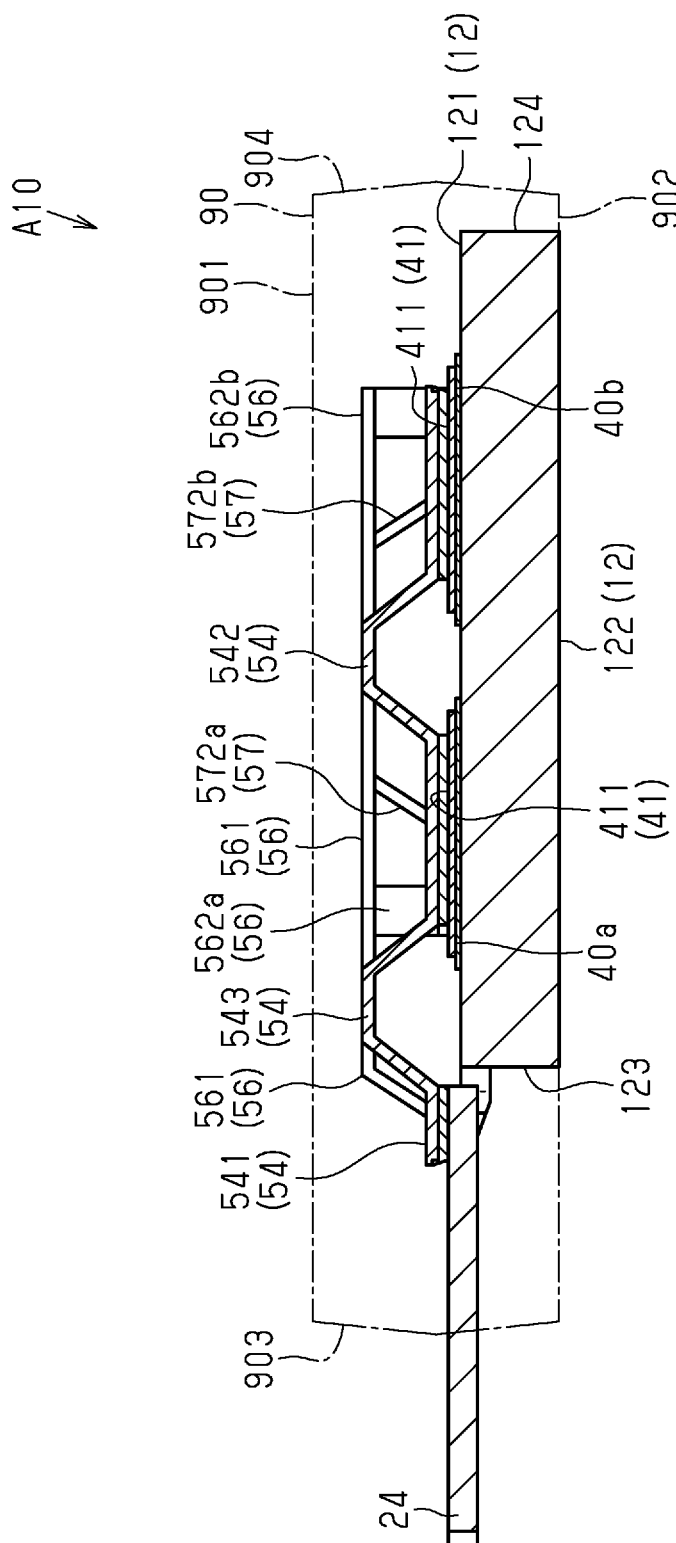
FIG. 6 is a cross-sectional view taken along line 6-6 in FIG. 3.
Figure 6:
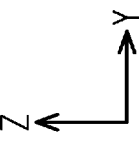

As shown in FIG. 7, the second drive connection member 54 is a plate-shaped conductive member and is referred to as a clip. A conductive plate is bent to form the second drive connection member 54. The second drive connection member 54 includes a lead connector 541, electrode connectors 542, and a joint 543. The lead connector 541 extends in the width-wise direction X in the same manner as the pad portion 241 of the second drive lead 24. As shown in FIG. 6, the lead connector 541 is connected to the pad portion 241 by solder. As shown in FIGS. 3 and 7, the electrode connectors 542 are rectangular. As shown in FIG. 6, the electrode connectors 542 are connected to the second main surface drive electrodes 41 by solder. As shown in FIGS. 3 and 7, the joint 543 joins the lead connector 541 and the electrode connectors 542. The joint 543 extends from, the lead connector 541 in the length-wise direction Y. The joint 543 is connected to an end of each electrode connector 542 located at the first die pad 11. That is, the electrode connectors 542 extend from the joint 543 in the width-wise direction X. The second drive connection member 54 is formed of Cu. The thickness of the second drive connection member 54 is greater than or equal to 0.05 mm and less than or equal to 1.0 mm and is, preferably, greater than or equal to 0.5 mm.

Operation

The semiconductor device A10 includes the two first switching elements 30a and 30b mounted on the first die pad 11. The first control electrodes 32 of the two first switching elements 30a and 30b are connected to the first control lead 21 by the first control connection member 51. The first control connection member 51 includes the lead connector 511, which is connected to the first control lead 21, and the electrode connectors 512a and 512b, which are respectively connected between the lead connector 511 and the first control electrodes 32 of the first switching elements 30*a* and 30*b*. The electrode connectors 512*a* and 512*b* are equal in length. Therefore, the lead connector 511 and the electrode connector 512*a* form a connection member that connects the first control electrode 32 of the first switching element 30*a* to the first control lead 21, and the lead connector 511 and the electrode connector 512*b* form a connection member that connects the first control electrode 32 of the first switching element 30*a* to the first control lead 21, so that the connection members are equal in length. This reduces variations in electrical properties such as inductance values and resistance values between the first control lead 21 and the first control electrodes 32 of the first switching elements 30*a* and 30*b*.

The semiconductor device A10 includes the two second switching elements 40*a* and 40*b* mounted on the second die pad 12. The second control electrodes 42 of the two second switching elements 40*a* and 40*b* are connected to the second control lead 27 by the second control connection member 57. The second control connection member 57 includes the lead connector 571, which is connected to the second control lead 27, and the electrode connectors 572*a* and 572*b*, which are respectively connected between the lead connector 571 and the second control electrodes 42 of the second switching elements 40*a* and 40*b*. The electrode connectors 572*a* and 572*b* are equal in length. Therefore, the lead connector 571 and the electrode connector 572*a* form a connection member that connects the second control electrode 42 of the second switching element 40*a* to the second control lead 27, and the lead connector 571 and the electrode connector 572*b* form a connection member that connects the second control electrode 42 of the second switching element 40*a* to the second control lead 27, so that the connection members are equal in length. This recues variations in electrical properties such as inductance values and resistance values between the second control lead 27 and the second control electrodes 42 of the second switching elements 40*a* and 40*b*.

The source electrodes 312 of the two first switching elements 30*a* and 30*b* are connected to the first source lead 22 by the first source connection member 52. The first source connection member 52 includes the lead connector 521, which is connected to the first source lead 22, and the electrode connectors 522*a* and 522*b*, which are connected between the lead connector 521 and the respective source electrodes 312. The electrode connectors 522*a* and 522*b* are equal in length.

The source electrodes 312 of the first switching elements 30*a* and 30*b* are electrodes (driver source electrodes) connected to a drive circuit of the first switching elements 30*a* and 30*b*. The source electrodes 312 and the main source electrodes 311 have the same electrical potential. The main source electrodes 311 of the two first switching elements 30*a* and 30*b* are electrically connected to each other. Hence, the source electrode 312 of one of the two switching elements 30*a* and 30*b* may be connected to the drive circuit. Preferably, the two source electrodes 312 are connected to the drive circuit.

In the prior art, in the same manner as the first control electrodes 32, the source electrodes of the two first switching elements 30*a* and 30*b* are connected to the first source lead 22 by wires. This produces variations in electrical properties between the first source lead 22 and the source electrodes 312 depending on the length of wires. In the present embodiment, the connection member that connects the source electrode 312 of the first switching element 30*a* to the first source lead 22 and the connection member that connects the source electrode 312 of the first switching element 30*b* to the first source lead 22 are equal in length. This reduces variations in electrical properties between the first source lead 22 and the source electrodes 312 of the first switching elements 30*a* and 30*b*.

The source electrodes 412 of the two second switching elements 40*a* and 40*b* are connected to the second source lead 26 by the second source connection member 56. The second source connection member 56 includes the lead connector 561, which is connected to the second source lead 26, and the electrode connectors 562*a* and 562*b*, which are connected between the lead connector 561 and the respective source electrodes 412. The electrode connectors 562*a* and 562*b* are equal in length. This reduces variations in electrical properties such as inductance values and resistance values between the second source lead 26 and the source electrodes 412 of the second switching elements 40*a* and 40*b*.

Advantages

As described above, the present embodiment has the following advantages.

(1-1) The semiconductor device A10 includes the two first switching elements 30*a* and 30*b* mounted on the first die pad 11. The first control electrodes 32 of the two first switching elements 30*a* and 30*b* are connected to the first control lead 21 by the first control connection member 51. The first control connection member 51 includes the lead connector 511, which is connected to the first control lead 21, and the electrode connectors 512*a* and 512*b*, which are respectively connected between the lead connector 511 and the first control electrodes 32 of the first switching elements 30*a* and 30*b*. The electrode connectors 512*a* and 512*b* are equal in length. Thus, the connection members connecting the first control electrodes 32 of the first switching elements 30*a* and 30*b* to the first control lead 21 are equal in length. Accordingly, variations in electrical properties such as inductance values and resistance values between the first control lead 21 and the first control electrodes 32 of the first switching elements 30*a* and 30*b* are reduced.

(1-2) The semiconductor device A10 includes the two second switching elements 40*a* and 40*b* mounted on the second die pad 12. The second control electrodes 42 of the two second switching elements 40*a* and 40*b* are connected to the second control lead 27 by the second control connection member 57. The second control connection member 57 includes the lead connector 571, which is connected to the second control lead 27, and the electrode connectors 572*a* and 572*b*, which are respectively connected between the lead connector 571 and the second control electrodes 42 of the second switching elements 40*a* and 40*b*. The electrode connectors 572*a* and 572*b* are equal in length. Thus, the connection members connecting the second control electrodes 42 of the second switching elements 40*a* and 40*b* to the second control lead 27 are equal in length. This reduces variations in electrical properties such as inductance values and resistance values between the second control lead 27 and the second control electrodes 42 of the second switching elements 40*a* and 40*b*.

(1-3) The source electrodes 312 of the two first switching elements 30*a* and 30*b* are connected to the first source lead 22 by the first source connection member 52. The first source connection member 52 includes the lead connector 521, which is connected to the first source lead 22, and the electrode connectors 522*a* and 522*b*, which are connected between the lead connector 521 and the respective source electrodes 312. The electrode connectors 522*a* and 522*b* are equal in length. Thus, variations in electrical properties between the first source lead 22 and the source electrodes 312 of the first switching elements 30*a* and 30*b* are reduced.

(1-4) The source electrodes 412 of the two second switching elements 40*a* and 40*b* are connected to the second source lead 26 by the second source connection member 56. The second source connection member 56 includes the lead connector 561, which is connected to the second source lead 26, and the electrode connectors 562*a* and 562*b*, which are connected between the lead connector 561 and the respective source electrodes 412. The electrode connectors 562*a* and 562*b* are equal in length. Thus, variations in electrical properties such as inductance values and resistance values between the second source lead 26 and the source electrodes 412 of the second switching elements 40*a* and 40*b* are reduced.

(1-5) The semiconductor device A10 includes the first switching elements 30*a* and 30*b* and the second switching elements 40*a* and 40*b* that are disposed in the same encapsulation resin 90. The first main surface drive electrodes 31 (the main source electrodes 311) of the first switching elements 30*a* and 30*b* are connected to the second die pad 12 by the first drive connection members 53. The second back surface drive electrodes 43 of the second switching elements 40*a* and 40*b* and the output lead 25 are also connected to the second die pad 12. The back surface drive electrodes 33 of the first switching elements 30*a* and 30*b* are connected to the first drive lead 23. The second main surface drive electrodes 41 (the main source electrodes 411) of the second switching elements 40*a* and 40*b* are connected to the second drive lead 24. Thus, in the semiconductor device A10 of the present embodiment, the first switching elements 30*a* and 30*b* and the second switching elements 40*a* and 40*b* may be configured to be an inverter circuit or a DC-DC converter circuit. Reduction in the length of a conductor between the first drive lead 23 (drain lead), the second drive lead 24 (source lead), and the output lead 25 (output lead) reduces the inductance of the semiconductor device A10.

(1-6) In the semiconductor device A10, the first drive lead 23, which is connected to the first back surface drive electrodes 33 of the first switching elements 30*a* and 30*b*, is disposed next to the second drive lead 24, which is connected to the second main surface drive electrodes 41 (the main source electrodes 411) of the second switching elements 40*a* and 40*b*. When the semiconductor device A10 is used as, for example, an inverter circuit, a high potential voltage is supplied to the first drive lead 23, and a low potential voltage is supplied to the second drive lead 24. When the first switching elements 30*a* and 30*b* are switched on and the second switching elements 40*a* and 40*b* are switched off, current flows from the first drive lead 23 toward the output lead 25. When the first switching elements 30*a* and 30*b* are switched off and the second switching elements 40*a* and 40*b* are switched on, current flows from the output lead 25 toward the second drive lead 24. When the semiconductor device A10 configured as described above is operated by high-speed control signals (for example, 1 MHz), currents flow to the semiconductor device A10 in opposite directions through the first drive lead 23 and the second drive lead 24, which are located adjacent to each other. The currents produce magnetic flux, which reduces mutual inductance. As a result, parasitic inductance is reduced in the semiconductor device A10.

Modified Example of First Embodiment

The first embodiment may be modified as follows.

Figure 8:
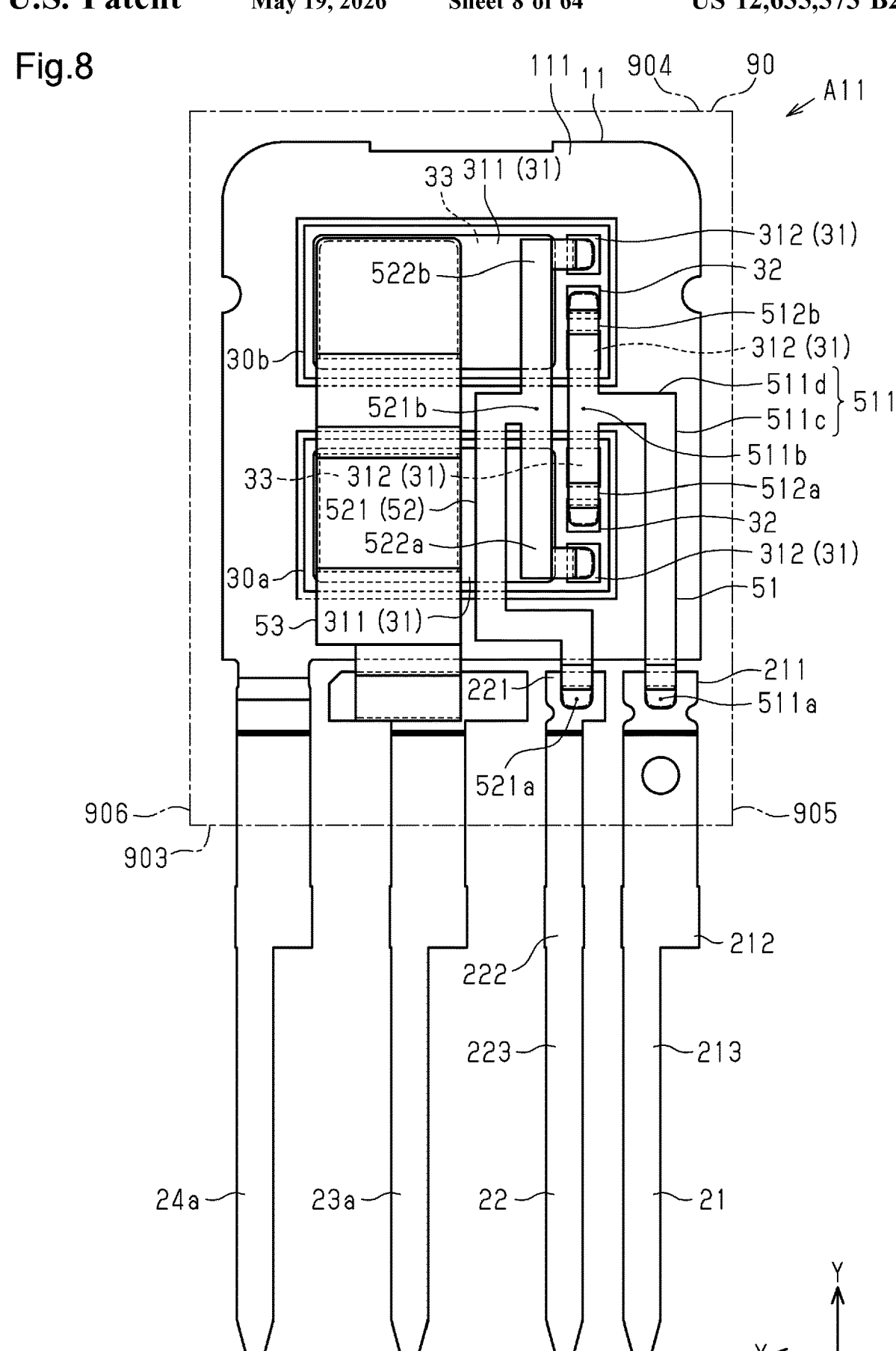
FIG. 8 is a plan view showing a semiconductor device in a modified example.

The number of die pads may be changed from that described in the embodiment. FIG. 8 shows a semiconductor device A11 that includes a single die pad 11. Two switching elements 30*a* and 30*b* are mounted on the die pad 11. The semiconductor device A11 includes a control lead 21, a source lead 22, a first drive lead 23*a* (source lead), and a second drive lead 24*a* (drain lead). The second drive lead 24*a* is connected to the die pad 11. The two switching elements 30*a* and 30*b* each have a control electrode 32 connected to the pad portion 211 of the control lead 21 by one first control connection member 51. The switching elements 30*a* and 30*b* each have a main surface drive electrode 31 (main source electrode 311) connected to the first drive lead 23*a* by the first drive connection member 53. In the same manner as the first embodiment, in the semiconductor device A11, the control electrodes 32 of the two switching elements 30*a* and 30*b* are equal in inductance and resistance. Thus, variations in the electrical properties of the switching elements 30*a* and 30*b* are reduced. Further, a semiconductor device may include three or more die pads.

Second Embodiment

A second embodiment of a semiconductor device A20 will now be described with reference to FIG. 9.

The semiconductor device A20 of the second embodiment differs from the semiconductor device A11 described in the modified example of the first embodiment in the shape of a control connection member. In the description hereafter, same reference characters are given to those components that are the same as the corresponding components of the semiconductor device A10 in the first embodiment and the semiconductor device A11 in the modified example. Such components will not be described in detail.

Figure 9:
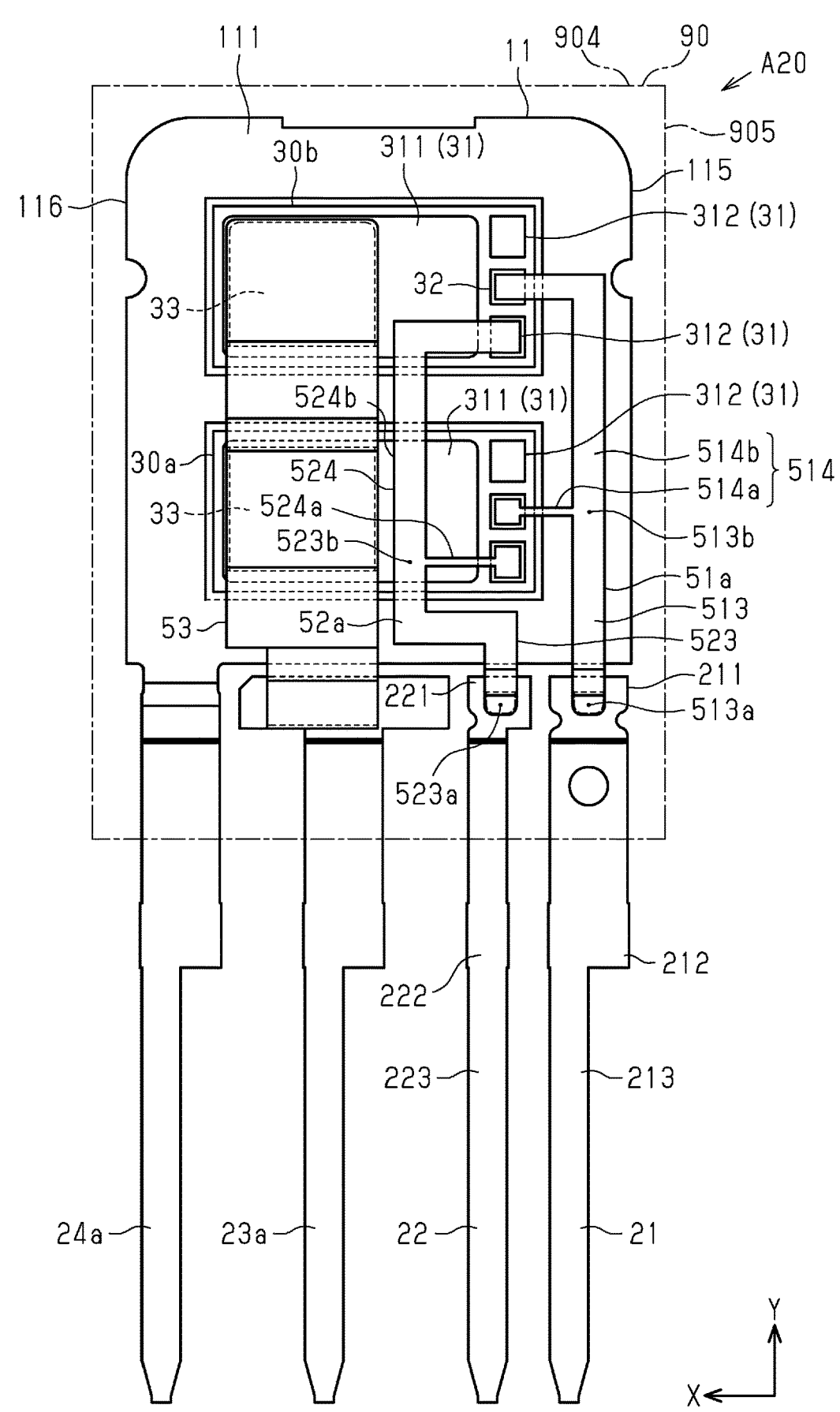
FIG. 9 is a plan view showing a semiconductor device in a second embodiment.

In the semiconductor device A20 shown in FIG. 9, the two switching elements 30*a* and 30*b* each have a control electrode 32 connected to the pad portion 211 of the control lead 21 by a single control connection member 51*a*. Also, the two switching elements 30*a* and 30*b* each include a source electrode 311 connected to the pad portion 221 of the source lead 22 by a single source connection member 52*a*.

The control connection member 51*a* includes a lead connector 513 and electrode connectors 514 (514*a*, 514*b*) extending from the lead connector 513 toward the control electrodes 32 of the respective switching elements 30*a* and 30*b*. In the semiconductor device A20 of the present embodiment, the lead connector 513 extends in the length-wise direction Y The lead connector 513 includes a first end 513*a* connected to the control lead 21. The lead connector 513 includes a second end 513*b* located at the same position as the control electrode 32 of the first switching element 30*a* in the length-wise direction Y. The electrode connectors 514*a* and 514*b* branch off from the second end 513*b* of the lead connector 513 defining a branch point. The electrode connectors 514*a* and 514*b* extend from the branch point 513*b*, that is, the distal end of the lead connector 513, to the respective control electrodes 32 of the switching elements 30*a* and 30*b*.

The electrode connector 514*a* extends from the branch point 513*b* of the lead connector 513 in the width-wise direction X and connects to the control electrode 32 of the switching element 30*a*. The electrode connectors 514*a* and 514*b* are equal in thickness. The electrode connector 514*b* is longer than the electrode connector 514*a* and wider than the electrode connector 514*a*.

In the second embodiment, the width of the electrode connectors 514*a* and 514*b* is set in accordance with the length of the electrode connectors 514*a* and 514*b* so that the electrode connectors 514*a* and 514*b* are equal in resistance value. The electrode connector 514*a* has a length that extends from the branch point 513*b* of the lead connector 513 to the control electrode 32 of the switching element 30*a*. The electrode connector 514*b* has a length that extends from the branch point 513*b* of the lead connector 513 to the control electrode 32 of the switching element 30*b*. For example, the width of the electrode connectors 514*a* and 514*b* is set to be inversely proportional to the length of the electrode connectors 514*a* and 514*b*. In addition to the width, the thickness of the electrode connectors 514*a* and 514*b* may be changed.

The source connection member 52*a* includes a lead connector 523 and electrode connectors 524*a* and 524*b* extending from the lead connector 523 toward the respective source electrodes 312 of the switching elements 30*a* and 30*b*. The lead connector 523 includes a first end 523*a* connected to the source lead 22. The lead connector 523 includes a second end 523*b* located at the same position as the source electrode 312 of the first switching element 30*a* in the length-wise direction Y. The electrode connectors 524*a* and 524*b* branch off from the second end 523*b* of the lead connector 523 defining as a branch point. The electrode connectors 524*a* and 524*b* extend from the branch point 523*b*, that is, the distal end of the lead connector 523, to the respective source electrodes 312 of the switching elements 30*a* and 30*b*.

The electrode connector 524*a* extends from the branch point 523*b* of the lead connector 523 in the width-wise direction X and connects to the source electrode 312 of the switching element 30*a*. The electrode connectors 524*a* and 524*b* are equal in thickness. The electrode connector 524*b* is longer than the electrode connector 524*a* and wider than the electrode connector 524*a*.

In the second embodiment, the width of the electrode connectors 524*a* and 524*b* is set in accordance with the length of the electrode connectors 524*a* and 524*b* so that the electrode connectors 524*a* and 524*b* are equal in resistance value. The electrode connector 524*a* has a length that extends from the branch point 523*b* of the lead connector 523 to the source electrode 312 of the switching element 30*a*. The electrode connector 524*b* has a length that extends from the branch point 523*b* of the lead connector 523 to the source electrode 312 of the switching element 30*b*. For example, the width of the electrode connectors 524*a* and 524*b* is set to be inversely proportional to the length of the electrode connectors 524*a* and 524*b*. In addition to the width, the thickness of the electrode connectors 524*a* and 524*b* may be changed.

Advantages

As described above, the present embodiment has the following advantages.

(2-1) In the control connection member 51*a*, the width of the electrode connectors 514*a* and 514*b*, which are connected to the control electrodes 32 of the switching elements 30*a* and 30*b*, is set so as to be equal in resistance value. This reduces variations in electrical properties from the control lead 21 and the control electrodes 32 of the switching elements 30*a* and 30*b*.

(2-2) In the source connection member 52*a*, the width of the electrode connectors 524*a* and 524*b*, which are connected to the source electrodes 312 of the switching elements 30*a* and 30*b*, is set so as to be equal in resistance value. This reduces variations in electrical properties from the source lead 22 and the control electrodes 32 of the switching elements 30*a* and 30*b*.

Modified Examples of Second Embodiment

In FIG. 9, the semiconductor device A20 includes one single die pad 11. However, as shown in the semiconductor device A10 of the first embodiment, a semiconductor device may include two die pads. Further, a semiconductor device may include three or more die pads.

Third Embodiment

A third embodiment of a semiconductor device A30 will now be described with reference to FIGS. 10 to 13.

In the semiconductor device A30 of the third embodiment, the same reference characters are given to those components that are the same as the corresponding components of the semiconductor device A10 in the first embodiment. Such components will not be described in detail.

As shown in FIGS. 10 to 13, the semiconductor device A30 includes a first die pad 11, a second die pad 12, a first lead group 20*a*, a second lead group 20*b*, first switching elements 30*a* and 30*b*, second switching elements 40*a* and 40*b*, and an encapsulation resin 90. The semiconductor device A30 further includes a first drive connection member 53, a second drive connection member 54, a first control connection member 51, a second control connection member 57, a first source connection member 52, and a second source connection member 56.

First Lead Group

Figure 10:
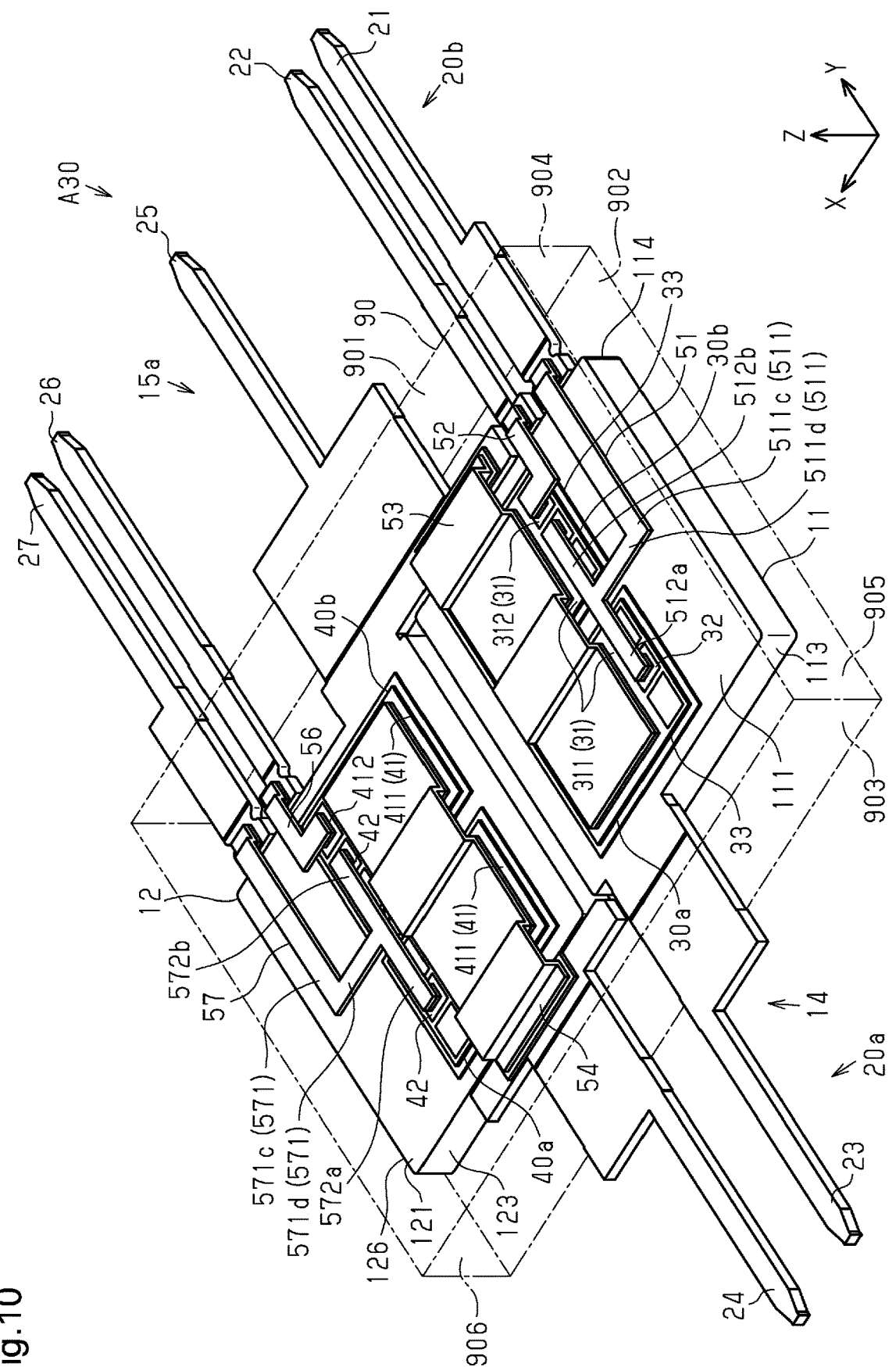
FIG. 10 is a perspective view showing a semiconductor device in a third embodiment.
Figure 11:
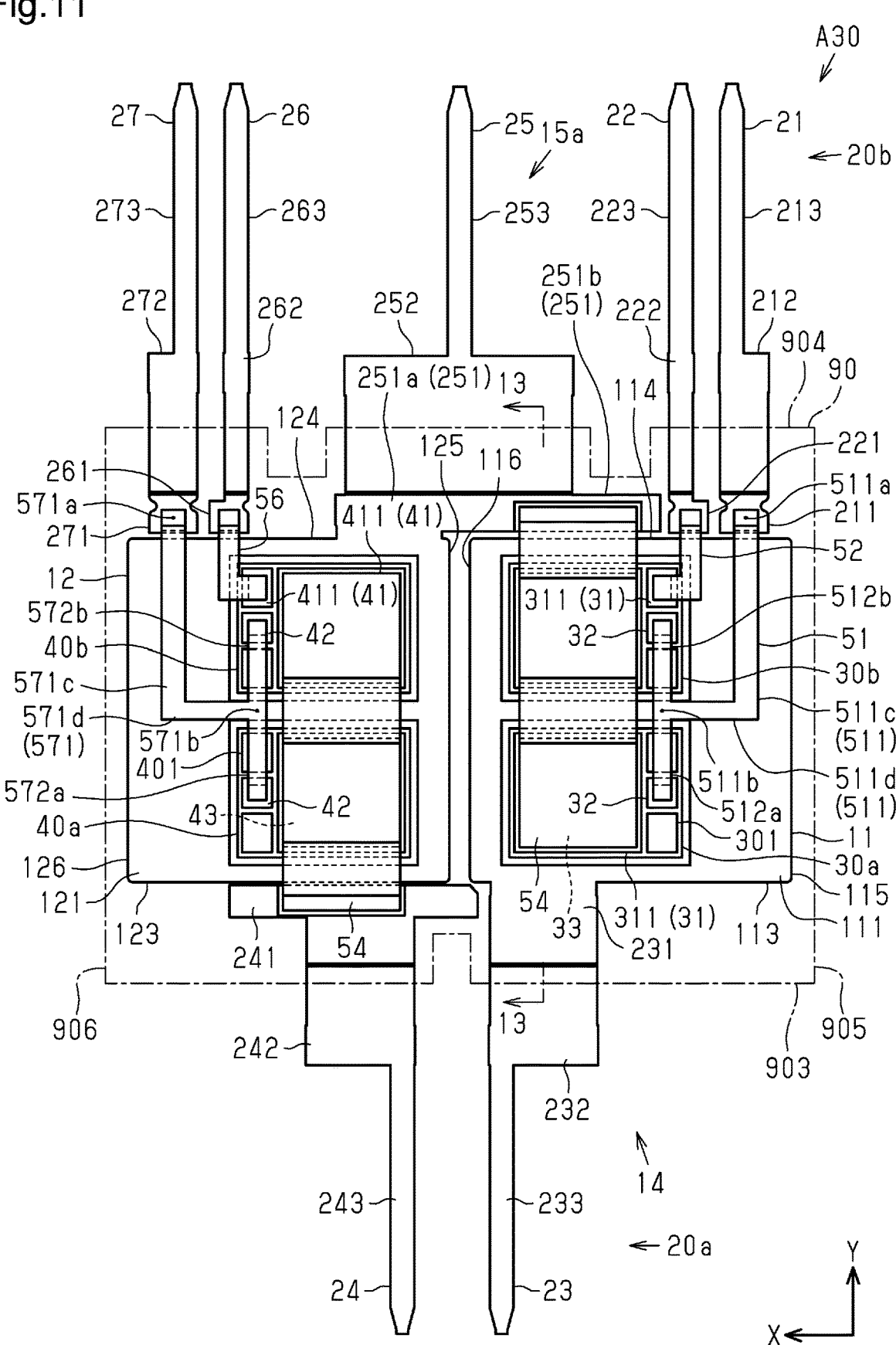
FIG. 11 is a plan view of the semiconductor device shown in FIG. 10.

As shown in FIGS. 10 and 11, the first lead group 20*a* includes the first drive lead 23 and the second drive lead 24. The lead 23 and the second drive lead 24, included in the first lead group 20*a*, project from the first resin side surface 903 of the encapsulation resin 90.

As shown in FIG. 11, the first drive lead 23 is located close to the fourth side surface 116 of the first die pad 11 in the width-wise direction X. The second drive lead 24 is located close to the third side surface 125 of the second die pad 12 in the width-wise direction X. In the present embodiment, an intermediate point between the first drive lead 23 and the second drive lead 24 is located at a center of the encapsulation resin 90.

The first drive lead 23 includes a connection portion 231, a base portion 232, and a substrate connector 233. The connection portion 231 is connected to the first side surface 113 of the first die pad 11. In the present embodiment, the first drive lead 23 is formed integrally with the first die pad 11. The first drive lead 23 and the first die pad 11 form an integrated first lead frame 14.

The base portion 232 extends from the connection portion 231 in the length-wise direction Y and projects from the first resin side surface 903 of the encapsulation resin 90. The substrate connector 233 extends from a distal end of the base portion 232 in the length-wise direction Y. In the width-wise direction X, the width of the base portion 232 is larger than the width of the substrate connector 233. In the width-wise direction X, the base portion 232 projects beyond the substrate connector 233 toward the third resin side surface 905 of the encapsulation resin 90.

The second drive lead 24 includes a pad portion 241, a base portion 242, and a substrate connector 243. The pad portion 241 is located separate from the second die pad 12 toward the first resin side surface 903 of the encapsulation resin 90 in the length-wise direction Y. The pad portion 241 extends along the first side surface 113 of the first die pad 11 and the first side surface 123 of the second die pad 12. That is, the pad portion 241 extends over from the first side surface 113 of the first die pad 11 to the first side surface 123 of the second die pad 12. The pad portion 241 is a connector to which the second drive connection member 54 is connected.

The base portion 242 extends from the pad portion 241 in the length-wise direction Y and projects from the first resin side surface 903 of the encapsulation resin 90. The substrate connector 243 extends from a distal end of the base portion 242 in the length-wise direction Y. In the width-wise direction X, the width of the base portion 242 is larger than the width of the substrate connector 243. In the width-wise direction X, the base portion 242 projects beyond the substrate connector 243 toward the first drive lead 23.

Second Lead Group

The second lead group 20b includes the first control lead 21, the first source lead 22, the output lead 25, the second source lead 26, and the second control lead 27. The leads 21, 22, and 25 to 27, which are included in the second lead group 20b, project from the second resin side surface 904 of the encapsulation resin 90.

As shown in FIG. 11, the first control lead 21 includes a pad portion 211, a base portion 212, and a substrate connector 213. The pad portion 211 is located separate from the first die pad 11 toward the second resin side surface 904 of the encapsulation resin 90 in the length-wise direction Y. The base portion 212 extends from the pad portion 211 in the length-wise direction Y and projects from the second resin side surface 904 of the encapsulation resin 90. The substrate connector 213 extends from a distal end of the base portion 212 in the length-wise direction Y. As shown in FIG. 11, the width of the base portion 212 is greater than the width of the substrate connector 213 in the width-wise direction X. In the width-wise direction X, the base portion 212 projects beyond the substrate connector 213 toward the third resin side surface 905 of the encapsulation resin 90.

As shown in FIG. 11, the first source lead 22 includes the pad portion 221, the base portion 222, and the substrate connector 223. The pad portion 221 is located separate from the first die pad 11 toward the second resin side surface 904 of the encapsulation resin 90 in the length-wise direction Y. The base portion 222 extends from the pad portion 221 in the length-wise direction Y and projects from the second resin side surface 904 of the encapsulation resin 90. The substrate connector 223 extends from a distal end of the base portion 222 in the length-wise direction Y.

As shown in FIG. 11, the second source lead 26 includes the pad portion 261, the base portion 262, and the substrate connector 263. The pad portion 261 is located separate from second first die pad 12 toward the second resin side surface 904 of the encapsulation resin 90 in the length-wise direction Y. The base portion 262 extends from the pad portion 261 in the length-wise direction Y and projects from the second resin side surface 904 of the encapsulation resin 90. The substrate connector 263 extends from a distal end of the base portion 262 in the length-wise direction Y.

As shown in FIG. 11, the second control lead 27 includes the pad portion 271, the base portion 272, and the substrate connector 273. The pad portion 271 is located separate from second first die pad 12 toward the second resin side surface 904 of the encapsulation resin 90 in the length-wise direction Y. The base portion 272 extends from the pad portion 271 in the length-wise direction Y and projects from the second resin side surface 904 of the encapsulation resin 90. The substrate connector 273 extends from a selection of the base portion 272 in the length-wise direction Y. In the width-wise direction X, the width of the base portion 272 is larger than the width of the substrate connector 273. In the width-wise direction X, the base portion 272 projects beyond the substrate connector 273 toward the fourth resin side surface 906 of the encapsulation resin 90.

The output lead 25 includes a connection portion 251, a base portion 252, and a substrate connector 253. The connection portion 251 is connected to the second side surface 124 of the second die pad 12. In the present embodiment, the output lead 25 is formed integrally with the second die pad 12. The output lead 25 and the second die pad 12 form an integrated second lead frame 15.

The connection portion 251 includes a die connection portion 251a and a pad portion 251b. The die connection portion 251a is connected to the second side surface 124 of the second die pad 12 at a location close to the third side surface 125. The pad portion 251b extends from the die connection portion 251a toward the first source lead 22 in the width-wise direction X. As viewed in the length-wise direction Y, the pad portion 251b is located overlapping the first drive lead 23.

The base portion 252 extends from the connection portion 251 in the length-wise direction Y and projects from the second resin side surface 904 of the encapsulation resin 90. The substrate connector 253 extends from a distal end of the base portion 252 in the length-wise direction Y. In the width-wise direction X, the width of the base portion 252 is larger than the width of the substrate connector 253. The base portion 252 has a large width so that a part of the base portion 252 overlaps the first drive lead 23 and another part of the base portion 252 overlaps the second drive lead 24 in the length-wise direction Y. The substrate connector 253 is located at a center of the base portion 252 in the width-wise direction X. The substrate connector 253 is located at a center of the encapsulation resin 90 in the width-wise direction X.

Figure 12:
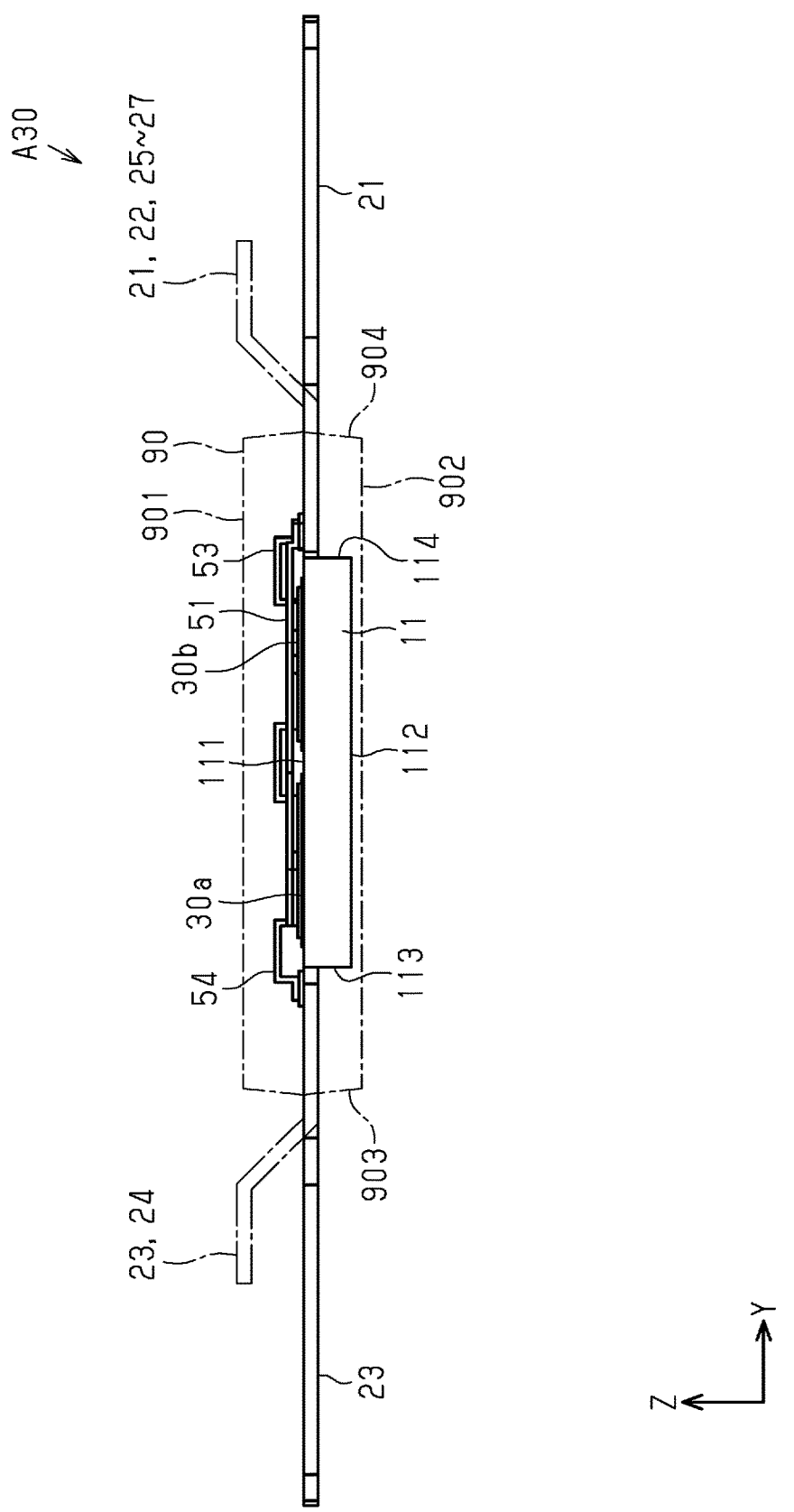
FIG. 12 is a side view of the semiconductor device shown in FIG. 10.
Figure 13:
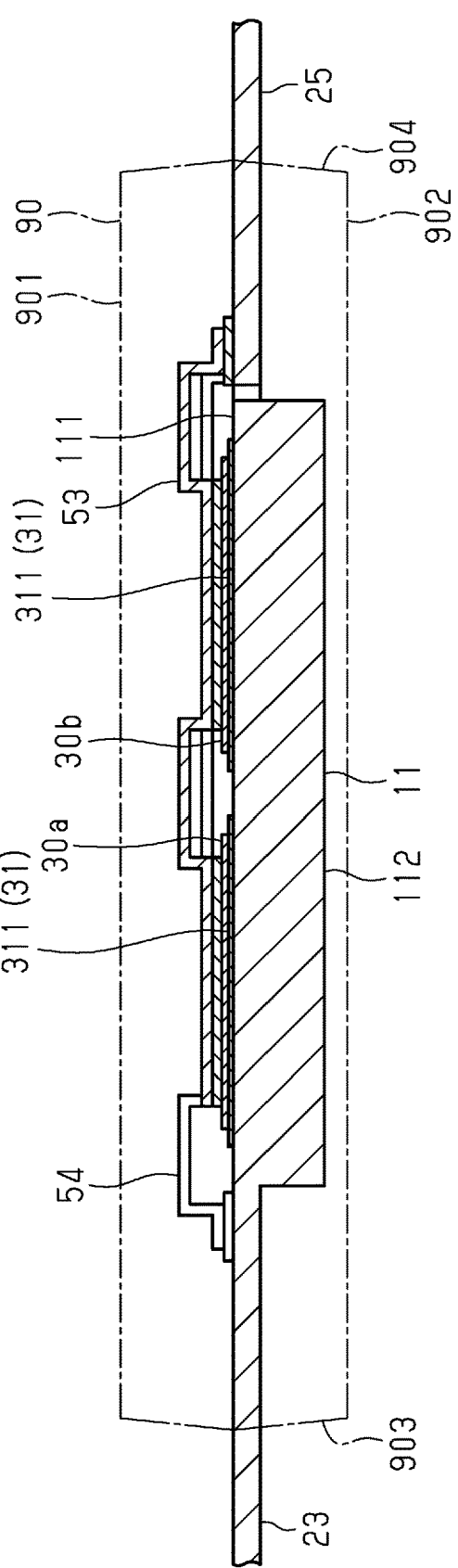
FIG. 13 is a cross-sectional view taken along line 13-13 in FIG. 11.
Figure 13:
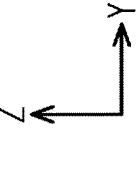

As shown in FIG. 12, the leads 23 and 24 of the first lead group 20a and the leads 21, 22, and 25 to 27 of the second lead group 20b are bent toward the resin main surface 901 of the encapsulation resin 90 as indicated by single-dashed lines. The semiconductor device A10 including the leads 21 to 25 is a semiconductor package configured to be surface-mounted on a mount substrate.

Connection Member

As shown in FIGS. 10 and 11, the semiconductor device A30 includes the first control connection member 51 and the second control connection member 57.

The first control connection member 51 connects the first control lead 21 of the second lead group 20b to the first control electrodes 32 of the first switching elements 30a and 30b. The first control connection member 51 includes the lead connector 511 and the electrode connectors 512a and 512b, which are disposed between the lead connector 511 and the respective first control electrodes 32 of the first switching elements 30a and 30b. The electrode connectors 512a and 512b are equal in length.

The second control connection member 57 connects the second control lead 27 of the second lead group 20b to the second control electrodes 42 of the second switching elements 40a and 40b. The second control connection member 57 includes the lead connector 571 and the electrode connectors 572*a* and 572*b*, which are disposed between the lead connector 571 and the second control electrodes 42 of the second switching elements 40*a* and 40*b*. The electrode connectors 572*a* and 572*b* are equal in length.

As shown in FIGS. 10 and 11, the semiconductor device A30 includes the first source connection member 52 and the second source connection member 56.

The first source connection member 52 of the present embodiment connects the source electrode 312 of the first switching element 30*b* and the first source lead 22. The second source connection member 56 of the present embodiment electrically connects the source electrode 412 of the second switching element 40*b* to the second source lead 26.

As shown in FIGS. 10 and 11, the semiconductor device A30 includes the first drive connection member 53 and the second drive connection member 54.

The first drive connection member 53 of the present embodiment is a belt-shaped plate member extending in the arrangement direction of the first switching elements 30*a* and 30*b* (the length-wise direction Y). The first drive connection member 53 connects the main surface drive electrodes 31 (main source electrodes 311) of the first switching elements 30*a* and 30*b* to the pad portion 251*b* of the output lead 25. Thus, the first main surface drive electrodes 31 of the first switching elements 30*a* and 30*b* are connected to the second die pad 12 by the first drive connection member 53 and the pad portion 251*b* of the output lead 25. The first drive connection member 53 is formed of Cu. The thickness of the first drive connection member 53 is greater than or equal to 0.05 mm and less than or equal to 1.0 mm and is, preferably, greater than or equal to 0.5 mm.

The second drive connection member 54 of the present embodiment is a belt-shaped plate member extending in the arrangement direction of the second switching elements 40*a* and 40*b* (the length-wise direction Y). The second drive connection member 54 connects the second main surface drive electrodes 41 (the main source electrodes 411) of the second switching elements 40*a* and 40*b* to the pad portion 241 of the second drive lead 24. The second drive connection member 54 is formed of Cu. The thickness of the second drive connection member 54 is greater than or equal to 0.05 mm and less than or equal to 1.0 mm and is, preferably, greater than or equal to 0.5 mm.

As described above, the semiconductor device A30 of the third embodiment has the following advantages.

(3-1) The first control connection member 51 reduces variations in electrical properties such as inductance values and resistance values between the first control lead 21 and the first control electrodes 32 of the first switching elements 30*a* and 30*b*. The second control connection member 57 also reduces variations in electrical properties such as inductance values and resistance values between the second control lead 27 and the second control electrodes 42 of the second switching elements 40*a* and 40*b*.

(3-2) The first lead group 20*a*, including the drive leads 23 and 24, projects from the first resin side surface 903 of the encapsulation resin 90. The second lead group 20*b*, which includes the control leads 21 and 27, the source leads 22 and 26, and the output lead 25, projects from the second resin side surface 904 of the encapsulation resin 90. That is, the first lead group 20*a* and the second lead group 20*b* project from different resin side surfaces. This ensures the distance between leads and also limits enlargement of the encapsulation resin 90, that is, enlargement of the semiconductor device A30.

(3-3) The drive leads 23 and 24 are located projecting from the first resin side surface 903 of the encapsulation resin 90. The output lead 25 is located projecting from the second resin side surface 904, which is located opposite from the first resin side surface 903. Thus, the first drive lead 23, the first switching elements 30*a* and 30*b*, and the pad portion 251*b* of the output lead 25 overlap in the length-wise direction Y. This allows the current to substantially linearly flow between the first drive lead 23 and the output lead 25 in the semiconductor device A30. Part of the output lead 25 overlaps the second drive lead 24 in the length-wise direction Y. This allows the current to substantially linearly flow between the second drive lead 24 and the output lead 25 in the semiconductor device A30.

Modified Examples

The second embodiment may be modified as follows.

Figure 14:
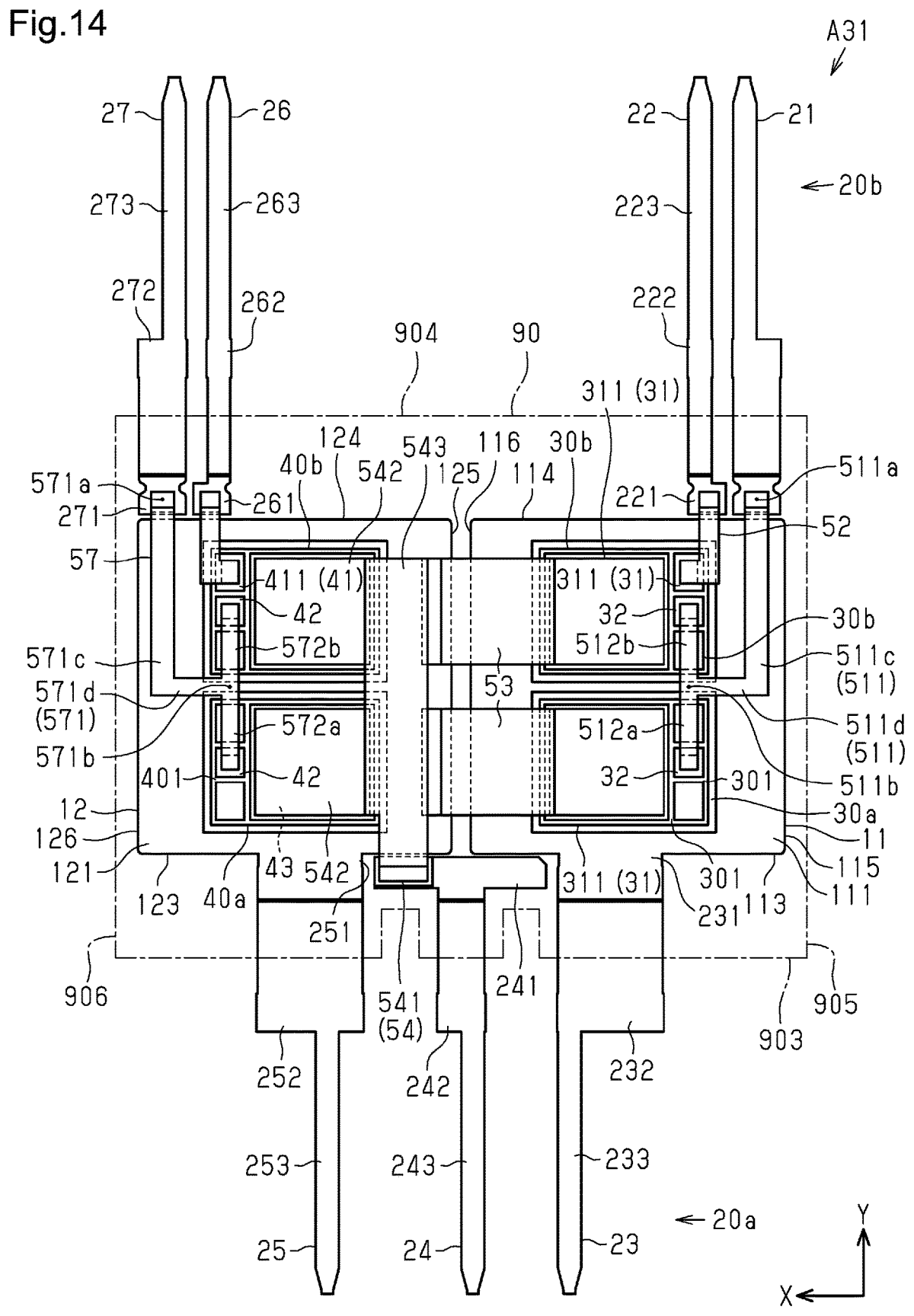

FIG. 14 shows a semiconductor device A31 in which the first lead group 20*a* includes the drive leads 23 and 24 and the output lead 25, and the second lead group 20*b* includes the control leads 21 and 27 and the source leads 22 and 26. The drive leads 23 and 24 are disposed adjacent to each other. Thus, as described in the advantage (1-6) of the first embodiment, parasitic inductance is reduced in the semiconductor device A31, and variations in inductance values as electrical properties are reduced.

Fourth Embodiment

A fourth embodiment of a semiconductor device A40 will now be described with reference to FIGS. 15 and 16.

In the semiconductor device A40 of the fourth embodiment, the same reference characters are given to those components that are the same as the corresponding components of the semiconductor device A30 in the third embodiment. Such components will not be described in detail.

Figure 15:
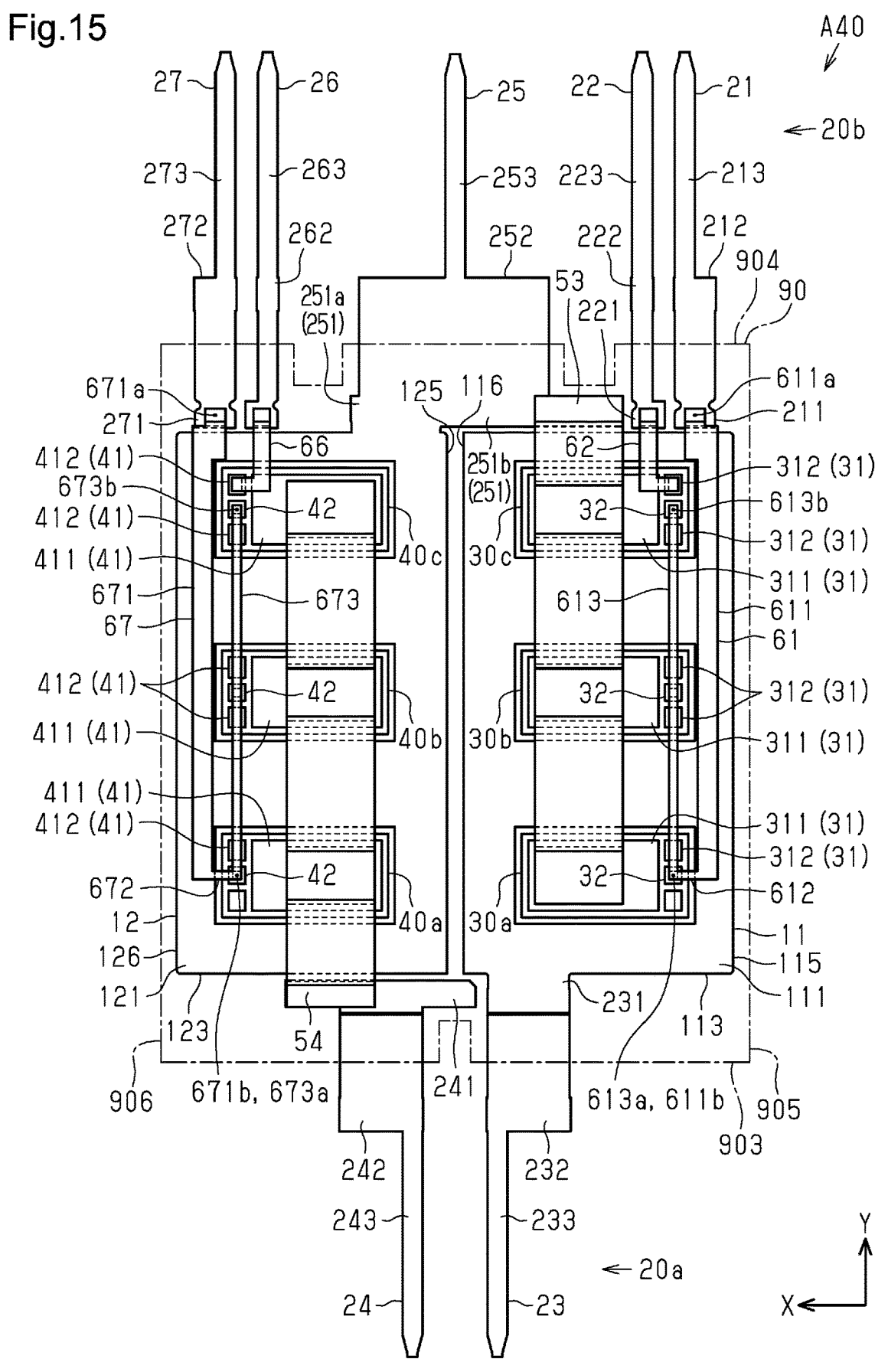
Figure 16:
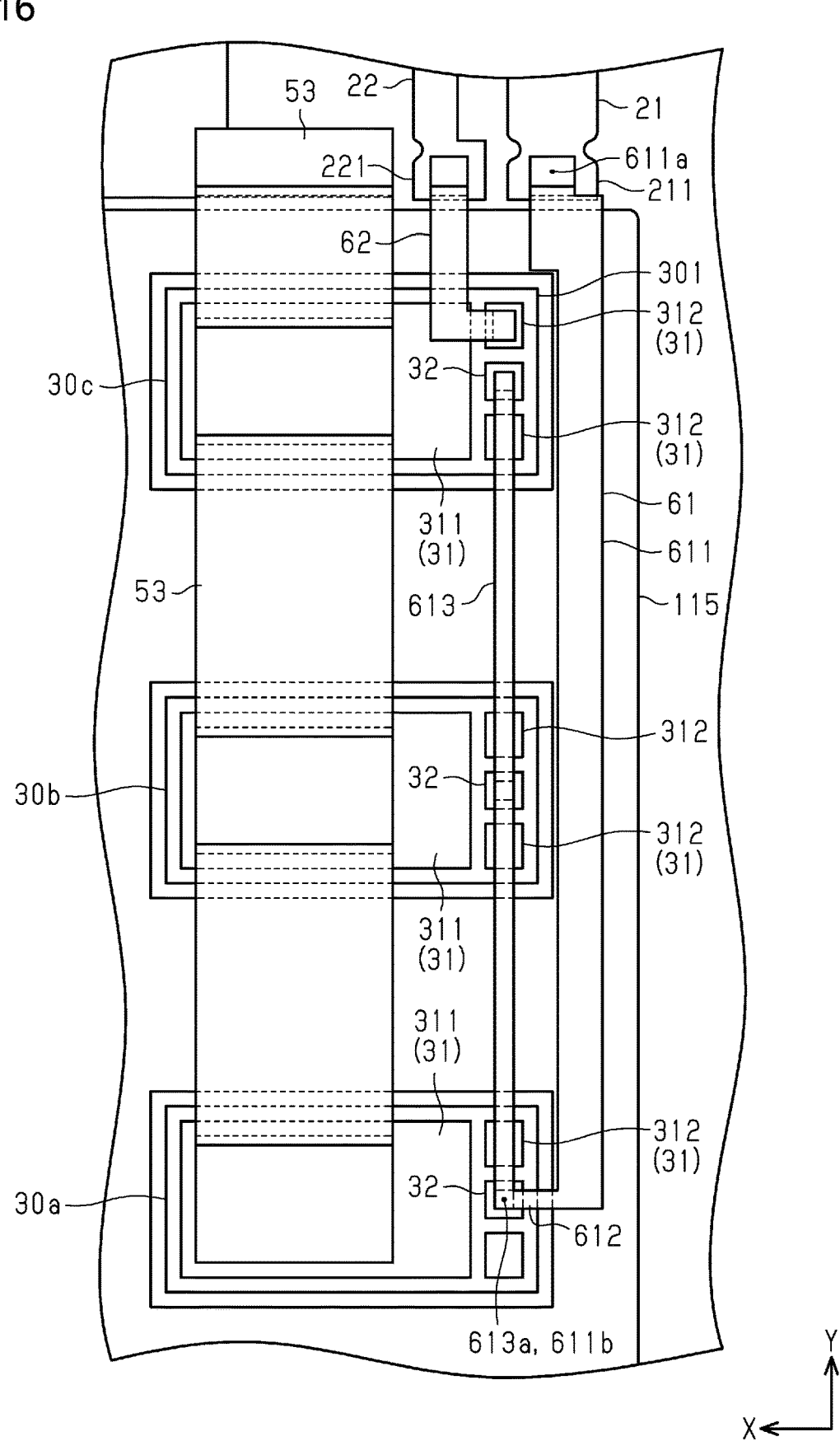
FIG. 16 is an enlarged plan view showing part of the semiconductor device shown in FIG. 15.

As shown in FIGS. 15 and 16, the semiconductor device A40 of the fourth embodiment includes three first switching elements 30*a*, 30*b*, and 30*c* mounted on the first die pad 11 and three second switching elements 40*a*, 40*b*, and 40*c* mounted on the second die pad 12.

The three first switching elements 30*a*, 30*b*, and 30*c* are arranged in the length-wise direction Y. Each of the first switching elements 30*a*, 30*b*, and 30*c* includes a first control electrode 32, a first main surface drive electrode 31, and a first back surface drive electrode 33. The three first switching elements 30*a*, 30*b*, and 30*c* are disposed so that the first control electrodes 32 face in the same direction. In the present embodiment, the three first switching elements 30*a*, 30*b*, and 30*c* are disposed so that the first control electrodes 32 are located toward the third side surface 115 of the first die pad 11. The three first switching elements 30*a*, 30*b*, and 30*c* are disposed so that the first control electrodes 32 align on a straight line.

The three second switching elements 40*a*, 40*b*, and 40*c* are arranged in the length-wise direction Y. Each of the second switching elements 40*a*, 40*b*, and 40*c* includes a second control electrode 42, a second main surface drive electrode 41, and a second back surface drive electrode 43. The three second switching elements 40*a*, 40*b*, and 40*c* are disposed so that the second control electrodes 42 face in the same direction. In the present embodiment, the three second switching elements 40*a*, 40*b*, and 40*c* are disposed so that the second control electrodes 42 are located toward the fourth side surface 126 of the second die pad 12. The three second switching elements 40*a*, 40*b*, and 40*c* are disposed so that the second control electrodes 42 align on a straight line.

The semiconductor device A40 includes a first control connection member 61 and a second control connection member 67.

The first control connection member 61 connects the first control electrodes 32 of the first switching elements 30a, 30b, and 30c to the first control lead 21. The first control connection member 61 is a plate-shaped conductive member. The first control connection member 61 includes a lead connector 611, a joint 612, and an electrode connector 613.

The lead connector 611 is linearly formed. The lead connector 611 is located so as to extend in the length-wise direction Y, in which the first switching elements 30a, 30b, and 30c are arranged. The lead connector 611 is located toward the first control electrodes 32 of the first switching elements 30a, 30b, and 30c. In the present embodiment, as viewed in the thickness-wise direction Z, the lead connector 611 is located so as not to overlap the first switching elements 30a, 30b, and 30c. That is, the lead connector 611 of the present embodiment is disposed between the third side surface 115 of the first die pad 11 and the first switching elements 30a, 30b, and 30c as viewed in the thickness-wise direction Z.

The lead connector 611 includes a first end 611a and a second end 611b. The first end 611a is connected to the pad portion 211 of the first control lead 21. Thus, the second end 611b is located opposite from the first control lead 21 in the length-wise direction Y. In the present embodiment, the second end 611b of the lead connector 611 is located at the same position as the first control electrode 32 of the first switching element 30a, which is located farthest from the first control lead 21 among the first switching elements 30a, 30b, and 30c in the length-wise direction Y, in which the first switching elements 30a, 30b, and 30c are arranged. That is, as viewed in the width-wise direction X, the second end 611b of the lead connector 611 overlaps the first control electrode 32 of the first switching element 30a, which is located farthest from the first control lead 21.

The joint 612 is connected to the second end 611b of the lead connector 611. The joint 612 extends from the second end 611b of the lead connector 611 in the width-wise direction X. In the present embodiment, the joint 612 extends from the lead connector 611 toward the first control electrode 32 of the first switching element 30a.

The electrode connector 613 is connected to a distal end of the joint 612. The electrode connector 613 linearly extends in the length-wise direction Y. The electrode connector 613 is disposed parallel to the lead connector 611. The electrode connector 613 is disposed on the straight line on which the first control electrodes 32 of the first switching elements 30a, 30b, and 30c are arranged. The electrode connector 613 overlaps the first control electrodes 32 of the first switching elements 30a, 30b, and 30c as viewed in the thickness-wise direction Z.

The electrode connector 613 includes a first end 613a and a second end 613b. The first end 613a of the electrode connector 613 is connected to a distal end of the joint 612. The first end 613a of the electrode connector 613 is located overlapping the first control electrode 32 of the first switching element 30a in the thickness-wise direction Z. The first end 613a of the electrode connector 613 is connected to the first control electrode 32 of the first switching element 30a by solder.

The second end 613b of the electrode connector 613 is located overlapping the first control electrode 32 of the first switching element 30c, which is located closest to the first control lead 21, in the thickness-wise direction Z. The second end 613b of the electrode connector 613 is connected to the first control electrode 32 of the first switching element 30c by solder.

At an intermediate part of the electrode connector 613, the electrode connector 613 overlaps the first control electrode 32 of the first switching element 30b, which is located at the center among the three first switching elements 30a, 30b, and 30c, as viewed in the thickness-wise direction Z. The electrode connector 613 is connected to the first control electrode 32 of the first switching element 30b by solder. The first control connection member 61 is formed of Cu. The thickness of the first control connection member 61 is greater than or equal to 0.05 mm and less than or equal to 1.0 mm and is, preferably, greater than or equal to 0.5 mm.

The second control connection member 67 connects the second control electrodes 42 of the second switching elements 40a, 40b, and 40c to the second control lead 27. The second control connection member 67 is a plate-shaped conductive member. The second control connection member 67 includes a lead connector 671, a joint 672, and an electrode connector 673.

The lead connector 671 is linearly formed. The lead connector 671 is located so as to extend in the length-wise direction Y, in which the second switching elements 40a, 40b, and 40c are arranged. The lead connector 671 is located toward the second control electrodes 42 of the second switching elements 40a, 40b, and 40c. In the present embodiment, as viewed in the thickness-wise direction Z, the lead connector 671 is located so as not to overlap the second switching elements 40a, 40b, and 40c. That is, the lead connector 671 of the present embodiment is disposed between the fourth side surface 126 of the second die pad 12 and the second switching elements 40a, 40b, and 40c as viewed in the thickness-wise direction Z.

The lead connector 671 includes a first end 671a and a second end 671b. The first end 671a is connected to the pad portion 271 of the second control lead 27. Thus, the second end 671b is located opposite from the second control lead 27 the length-wise direction Y. In the present embodiment, the second end 671b of the lead connector 671 is located at the same position as the second control electrode 42 of the second switching element 40a, which is located farthest from the second control lead 27 among the second switching elements 40a, 40b, and 40c in the length-wise direction Y, in which the second switching elements 40a, 40b, and 40c are arranged. That is, as viewed in the width-wise direction X, the second end 671b of the lead connector 671 overlaps the second control electrode 42 of the second switching element 40a, which is located farthest from the second control lead 27.

The joint 672 is connected to the second end 671b of the lead connector 671. The joint 672 extends from the second end 671b of the lead connector 671 in the width-wise direction X. In the present embodiment, the joint 672 extends from the lead connector 671 toward the second control electrode 42 of the second switching element 40a.

The electrode connector 673 is connected to a distal end of the joint 672. The electrode connector 673 linearly extends in the length-wise direction Y. The electrode connector 673 is disposed parallel to the lead connector 671. The electrode connector 673 is disposed on the straight line in which the second control electrodes 42 of the second switching elements 40a, 40b, and 40c are arranged. The electrode connector 673 overlaps the second control electrodes 42 of the second switching elements 40a, 40b, and 40c as viewed in the thickness-wise direction Z.

The electrode connector 673 includes a first end 673a and a second end 673b. The first end 673a of the electrode connector 673 is connected to a distal end of the joint 672. The first end 673a of the electrode connector 673 is located overlapping the second control electrode 42 of the second switching element 40a in the thickness-wise direction Z. The first end 673a of the electrode connector 673 is connected to the second control electrode 42 of the second switching element 40a by solder.

The second end 673b of the electrode connector 673 is located overlapping the second control electrode 42 of the second switching element 40c, which is located closest to the second control lead 27, in the thickness-wise direction Z. The second end 673b of the electrode connector 673 is connected to the second control electrode 42 of the second switching element 40c by solder.

At an intermediate part of the electrode connector 673, the electrode connector 673 overlaps the second control electrode 42 of the second switching element 40b, which is located at the center among the three second switching elements 40a, 40b, and 40c, as viewed in the thickness-wise direction Z. The electrode connector 673 is connected to the second control electrode 42 of the second switching element 40b by solder. The second control connection member 67 is formed of Cu. The thickness of the second control connection member 67 is greater than or equal to 0.05 mm and less than or equal to 1.0 mm and is, preferably, greater than or equal to 0.5 mm.

The semiconductor device A40 includes a first source connection member 62 and a second source connection member 66.

The first source connection member 62 of the present embodiment connects the first source lead 22 and the source electrode 312 of the first switching element 30c, which is located closest to the first source lead 22 among the three first switching elements 30a, 30b, and 30c. The first source connection member 62 includes a lead connector extending from the first source lead 22 in the length-wise direction Y, and an electrode connector extending from a distal end of the lead connector in the width-wise direction X and connected to the source electrode 312 of the first switching element 30c. The first source connection member 62 is connected to the first source lead 22 and the first source electrode 312 of the first switching element 30c by solder. The first source connection member 62 is formed of Cu. The thickness of the first source connection member 62 is greater than or equal to 0.05 mm and less than or equal to 1.0 mm and is, preferably, greater than or equal to 0.5 mm.

The second source connection member 66 of the present embodiment connects the second source lead 26 to the source electrode 412 of the second switching element 40c, which is located closest to the second source lead 26 among the three second switching elements 40a, 40b, and 40c. The second source connection member 66 includes a lead connector extending from the second source lead 26 in the length-wise direction Y, and an electrode connector extending from a distal end of the lead connector in the width-wise direction X and connected to the source electrode 412 of the second switching element 40c. The second source connection member 66 is connected to the second source lead 26 and the second source electrode 412 of the second switching element 40c by solder. The second source connection member 66 is formed of Cu. The thickness of the second source connection member 66 is greater than or equal to 0.05 mm and less than or equal to 1.0 mm and is, preferably, greater than or equal to 0.5 mm.

As shown in FIG. 15, the semiconductor device A40 includes a first drive connection member 53 and a second drive connection member 54.

The first drive connection member 53 is a belt-shaped plate member extending in the arrangement direction of the first switching elements 30a, 30b, and 30c (length-wise direction Y). The first drive connection member 53 connects the main surface drive electrodes 31 (main source electrodes 311) of the first switching elements 30a, 30b, and 30c to the pad portion 251b of the output lead 25. Thus, the first main surface drive electrodes 31 of the first switching elements 30a, 30b, and 30c are connected to the second die pad 12 by the first drive connection member 53 and the pad portion 251b of the output lead 25. The first drive connection member 53 is formed of Cu. The thickness of the first drive connection member 53 is greater than or equal to 0.05 mm and less than or equal to 1.0 mm and is, preferably, greater than or equal to 0.5 mm.

The second drive connection member 54 is a belt-shaped plate member extending in the arrangement direction of the second switching elements 40a, 40b, and 40c (length-wise direction Y). The second drive connection member 54 connects the second main surface drive electrodes 41 (the main source electrodes 411) of the second switching elements 40a, 40b, and 40c to the pad portion 241 of the second drive lead 24. The second drive connection member 54 is formed of Cu. The thickness of the second drive connection member 54 is greater than or equal to 0.05 mm and less than or equal to 1.0 mm and is, preferably, greater than or equal to 0.5 mm.

Operation

The operation of the semiconductor device A40 of the present embodiment will now be described.

As shown in FIG. 15, the semiconductor device A40 includes the three first switching elements 30a, 30b, and 30c mounted on the first die pad 11. The first switching elements 30a, 30b, and 30c are disposed so that the first control electrodes 32 align on a straight line. The semiconductor device A40 includes the first control connection member 61 connecting the first control lead 21 to the first control electrodes 32 of the first switching elements 30a, 30b, and 30c. The first control connection member 61 includes the lead connector 611 and the electrode connector 613, which are located adjacent to each other and extend parallel to each other, and the joint 612, which connects the second end 611b of the lead connector 611 and the first end 613a of the electrode connector 613.

When the three first switching elements 30a, 30b, and 30c are driven, current for the gate voltage flows between the first control lead 21 and the first control electrodes 32 of the first switching elements 30a, 30b, and 30c through the first control connection member 61. For example, when the current flows from the first control connection member 61 toward the first control electrode 32, currents I1 and I2 flow to the lead connector 611 and the electrode connector 613 in opposite directions. The currents I1 and I2 flowing to the lead connector 611 and the electrode connector 613, which are disposed adjacent and parallel to each other, produce magnetic flux, which reduces mutual inductance. As a result, parasitic inductance is reduced in the first control connection member 61. This reduces variations in the parasitic inductance between the first control lead 21 and the first switching elements 30a, 30b, and 30c as compared to a structure in which the first control electrodes 32 of the first switching elements 30a, 30b, and 30c are separately connected to the first control lead 21 by wires.

As shown in FIG. 14, the semiconductor device A40 includes the three second switching elements 40a, 40b, and 40c mounted on the second die pad 12. The second switching elements 40a, 40b, and 40c are disposed so that the second control electrodes 42 align on a straight line. The semiconductor device A40 further includes the second control connection member 67 connecting the second control lead 27 to the second control electrodes 42 of the second switching elements 40a, 40b, and 40c. The second control connection member 67 includes the lead connector 671 and the electrode connector 673, which are located adjacent to each other and extend parallel to each other, and the joint 672, which connects an end of the lead connector 671 and an end of the electrode connector 673. That is, the second control connection member 67 is configured in the same manner as the first control connection member 61. Hence, in the same manner as the first control connection member 61, the second control connection member 67 reduces variations in parasitic inductance between the second control lead 27 and the second control electrodes 42 of the second switching elements 40a, 40b, and 40c.

As described above, the semiconductor device A40 of the fourth embodiment has the following advantages.

(4-1) The semiconductor device A40 includes the first switching elements 30a, 30b, and 30c, which are disposed so that the first control electrodes 32 align on a straight line, and the first control connection member 61, which connects the first control lead 21 to the first control electrodes 32 of the first switching elements 30a, 30b, and 30c The first control connection member 61 includes the lead connector 611 and the electrode connector 613, which are located adjacent to each other and extend parallel to each other, and the joint 612, which connects an end of the lead connector 611 and an end of the electrode connector 613. This reduces variations in the parasitic inductance between the first control lead 21 and the first switching elements 30a, 30b, and 30c as compared to a structure in which the first control electrodes 32 of the first switching elements 30a, 30b, and 30c are separately connected to the first control lead 21 by wires.

(4-2) The semiconductor device A40 includes the second switching elements 40a, 40b, and 40c, which are disposed so that the second control electrodes 42 align on a straight line, and the second control connection member 67, which connects the second control lead 27 to the second control electrodes 42 of the second switching elements 40a, 40b, and 40c. The second control connection member 67 includes the lead connector 671 and the electrode connector 673, which are located adjacent to each other and extend parallel to each other, and the joint 672, which connects an end of the lead connector 671 and an end of the electrode connector 673. This reduces variations in the parasitic inductance between the second control lead 27 and the second switching elements 40a, 40b, and 40c as compared to a structure in which the second control electrodes 42 of the second switching elements 40a, 40b, and 40c are separately connected to the second control lead 27 by wires.

Fifth Embodiment

A fifth embodiment of a semiconductor device A50 will now be described with reference to FIGS. 17 and 18.

The semiconductor device A50 of the fifth embodiment differs from the semiconductor device A40 of the fourth embodiment mainly in the structure of a control connection member. In the description hereafter, the same reference characters are given to those components that are the same as the corresponding components of the semiconductor device A30 in the third embodiment and the semiconductor device A40 in the fourth embodiment. Such components will not be described in detail.

Figure 17:
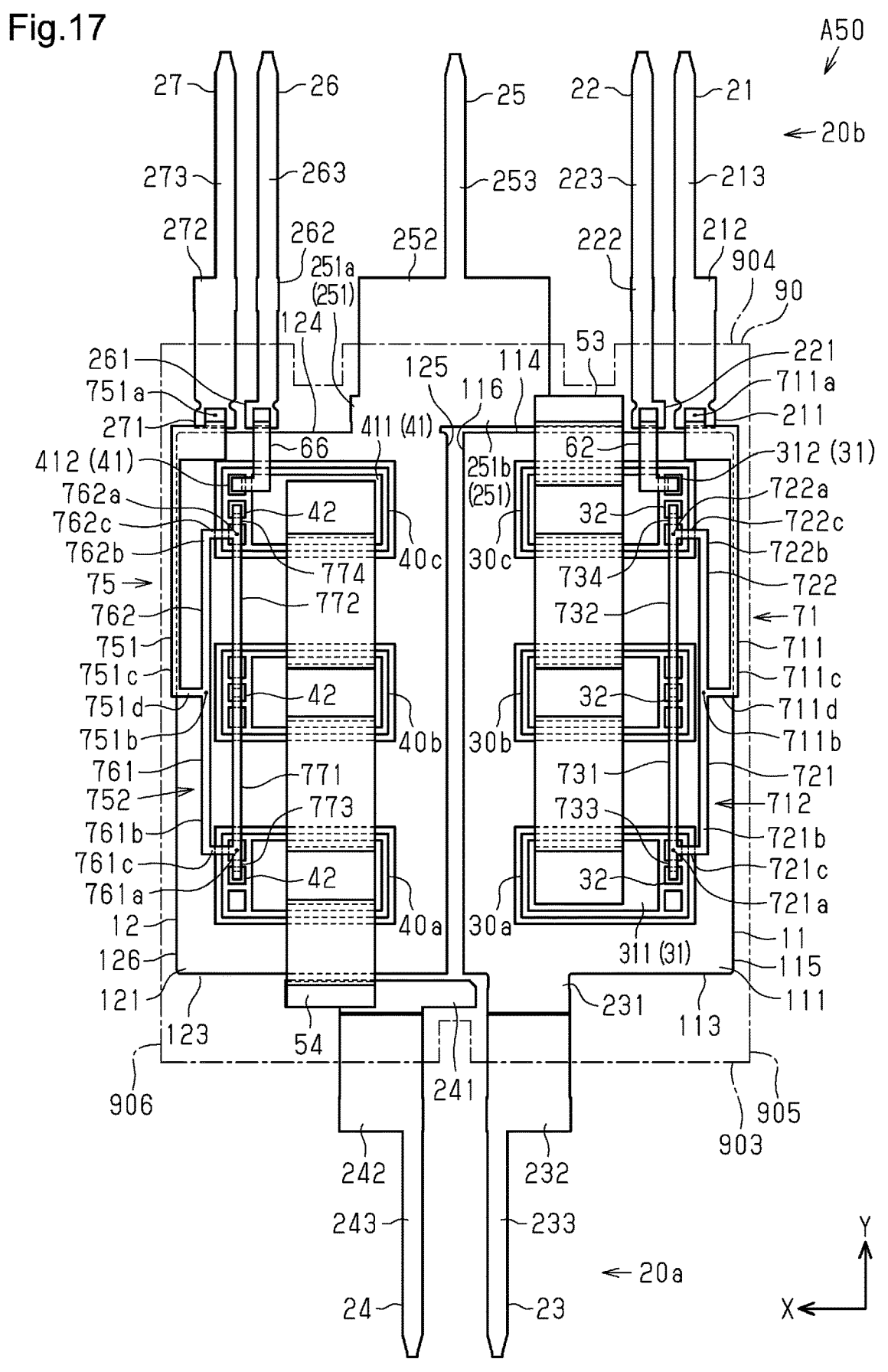

As shown in FIG. 17, the semiconductor device A50 of the fifth embodiment includes three first switching elements 30a, 30b, and 30c mounted on the first die pad 11 and three second switching elements 40a, 40b, and 40c mounted on the second die pad 12. The first switching elements 30a, 30b, and 30c are arranged in the length-wise direction Y. To distinguish between the first switching elements 30a, 30b, and 30c, the first switching element 30b located in the center is referred to as a first element 30b. The first switching elements 30a and 30c located at opposite sides of the first element 30b are referred to as a second element 30a and a third element 30c. The second switching elements 40a, 40b, and 40c are arranged in the length-wise direction Y. To distinguish between the second switching elements 40a, 40b, and 40c, the second switching element 40b located in the center is referred to as a fourth element 40b. The second switching elements 40a and 40c located at opposite sides of the fourth element 40b are referred to as a fifth element 40a and a sixth element 40c.

Figure 18:
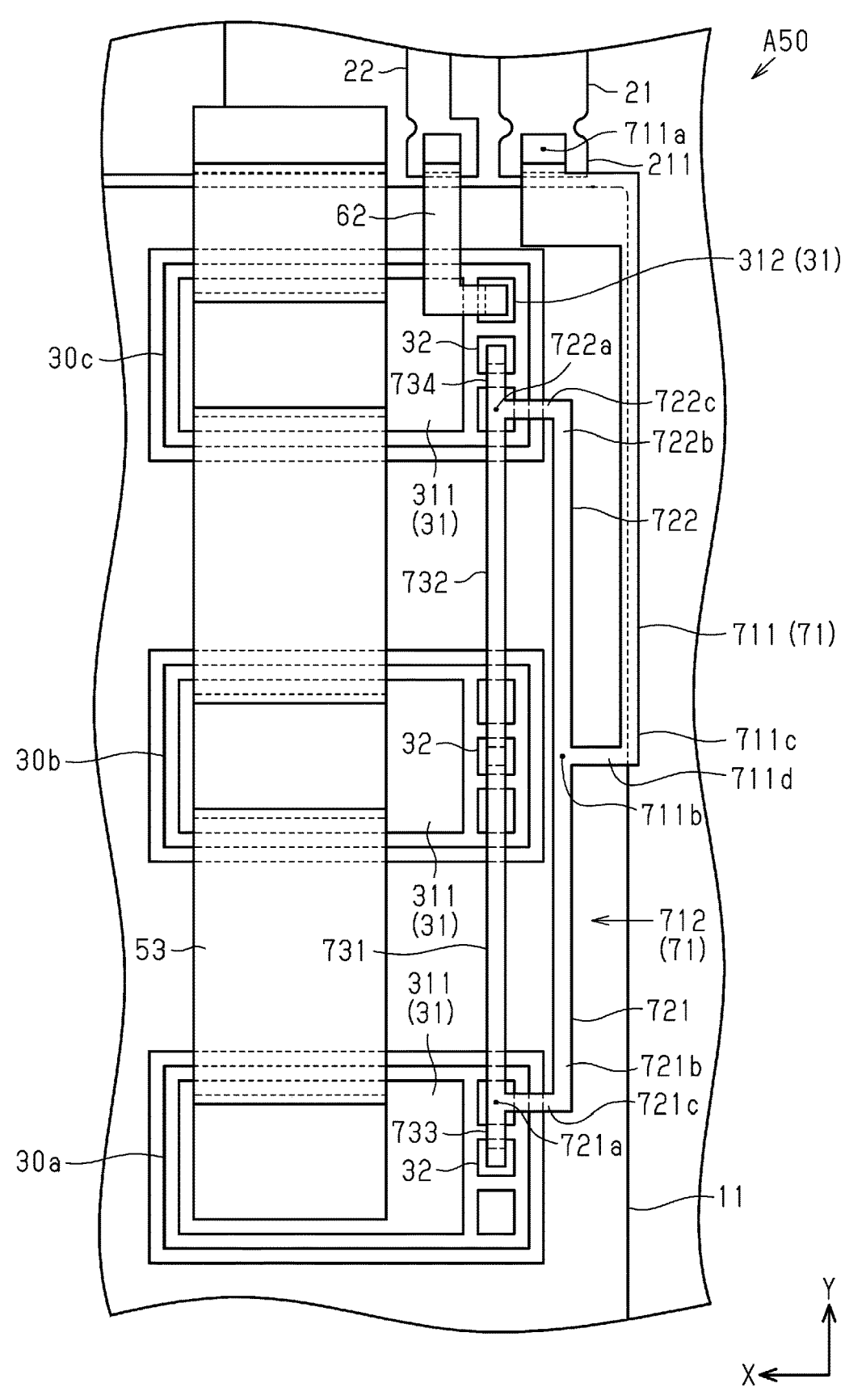
FIG. 18 is an enlarged plan view showing part of the semiconductor device shown in FIG. 17.

As shown in FIGS. 17 and 18, the semiconductor device A50 of the fifth embodiment includes a first control connection member 71 and a second control connection member 75.

The first control connection member 71 includes a first lead connector 711 and a first electrode connector 712.

The first lead connector 711 includes a first end 711a and a second end 711b. The first end 711a is connected to the pad portion 211 of the first control lead 21.

The first lead connector 711 includes a first connection part 711c extending in the length-wise direction Y and a second connection part 711d extending from a distal end of the first connection part 711c in the width-wise direction X. The first lead connector 711 is located so as not to overlap the first switching elements 30a, 30b, and 30c as viewed in the thickness-wise direction Z. That is, the first connection part 711c of the present embodiment is disposed between the third side surface 115 of the first die pad 11 and the first switching elements 30a, 30b, and 30c as viewed in the thickness-wise direction Z. The second connection part 711d is located at the same position as the first control electrode 32 of the first element 30b in the length-wise direction Y.

The first electrode connector 712 includes a first branch part 721, a second branch part 722, a first connection part 731, a second connection part 732, a third connection part 733, and a fourth connection part 734.

The first branch part 721 and the second branch part 722 are connected to a distal end of the second connection part 711d, that is, the second end 711b of the first lead connector 711. In the present embodiment, the first branch part 721 and the second branch part 722 extend from the second end 711b of the first lead connector 711 in opposite directions in the length-wise direction and then extend in the width-wise direction X at a predetermined position. More specifically, the first branch part 721 includes a first section 721b extending from the second end 711b of the first lead connector 711 toward the first side surface 113 of the first die pad 11 in the length-wise direction Y and a second section 721c extending from a distal end of the first section 721b in the width-wise direction X. The second branch part 722 includes a first section 722b extending from the second end 711b of the first lead connector 711 in a direction opposite from the first branch part 721, that is, toward the second side surface 114 of the first die pad 11, and a second section 722c extending from a distal end of the first section 721b in the width-wise direction X. As shown in FIG. 18, the first branch part 721 includes a distal end 721*a*, and the second branch part 722 includes a distal end 722*a*. As viewed in the thickness-wise direction Z, the distal end 721*a* and the distal end 722*a* are disposed on a line extending between the first control electrodes 32 of the first switching elements 30*a*, 30*b*, and 30*c*. The first branch part 721 has a length that extends from the second end 711*b* of the first lead connector 711 to the distal end 721*a* of the first branch part 721. The second branch part 722 has a length that extends from the second end 711*b* of the first lead connector 711 to the distal end 722*a* of the second branch part 722.

The first connection part 731 is connected between the distal end 721*a* of the first branch part 721 and the first control electrode 32 of the first element 30*b*. The first connection part 731 is disposed adjacent and parallel to the first branch part 721 (the first section 721*b*). The first connection part 731 has a length that extends from the distal end 721*a* of the first branch part 721 to the first control electrode 32 of the first element 30*b*.

The second connection part 732 is connected between the distal end 722*a* of the second branch part 722 and the first control electrode 32 of the first element 30*b*. The second connection part 732 is disposed adjacent and parallel to the second branch part 722 (the first section 722*b*). The first connection part 731 has a length that extends from the distal end 722*a* of the second branch part 722 to the first control electrode 32 of the first element 30*b*.

The first branch part 721 and the first connection part 731 are connected in series between the second end 711*b* of the first lead connector 711 and the first control electrode 32 of the first element 30*b*. The second branch part 722 and the second connection part 732 are connected in series between the second end 711*b* of the first lead connector 711 and the first control electrode 32 of the first element 30*b*. Thus, the first control electrode of the first element 30*b* is connected to the second end 711*b* of the first lead connector 711 by the first connection part 731 and the first branch part 721 and connected to the second end 711*b* of the first lead connector 711 by the second connection part 732 and the second branch part 722. In other words, the first control electrode 32 of the first element 30*b* is connected to the second end 711*b* of the first lead connector 711 by the first connection part 731 and the first branch part 721 that are connected in series and the second connection part 732 and the second branch part 722 that are connected in series. That is, the first connection part 731 and the first branch part 721 are connected in parallel to the second connection part 732 and the second branch part 722.

The third connection part 733 is connected between the distal end 721*a* of the first branch part 721 and the first control electrode 32 of the second element 30*a*. That is, the first control electrode 32 of the second element 30*a* is connected to the second end 711*b* of the first lead connector 711 by the third connection part 733 and the first branch part 721. The third connection part 733 has a length that extends from the distal end 721*a* of the first branch part 721 to the first control electrode 32 of the second element 30*a*.

The fourth connection part 734 is connected between the distal end 722*a* of the second branch part 722 and the first control electrode 32 of the third element 30*c*. That is, the first control electrode 32 of the third element 30*c* is connected to the second end 711*b* of the first lead connector 711 by the fourth connection part 734 and the second branch part 722. The fourth connection part 734 has a length that extends from the distal end 722*a* of the second branch part 722 to the first control electrode 32 of the third element 30*c*.

In the first electrode connector 712, the first branch part 721, the second branch part 722, the first connection part 731, the second connection part 732, the third connection part 733, and the fourth connection part 734 are equal in width. The first branch part 721 and the second branch part 722 are equal in length. The first connection part 731 and the second connection part 732 are equal in length. The third connection part 733 and the fourth connection part 734 are equal in length. The first connection part 731 and the first section 721*b* of the first branch part 721 are disposed adjacent and parallel to each other. The first connection part 731 and the first section 721*b* of the first branch part 721 are equal in length. Also, the second connection part 732 and the first section 722*b* of the second branch part 722 are disposed adjacent and parallel to each other. The second connection part 732 and the first section 722*b* of the second branch part 722 are equal in length.

The second control connection member 75 includes a second lead connector 751 and a second electrode connector 752.

The second lead connector 751 includes a first end 751*a* and a second end 751*b*. The first end 751*a* is connected to the pad portion 271 of the second control lead 27.

The second lead connector 751 includes a first connection part 751*c* extending in the length-wise direction Y and a second connection part 751*d* extending from a distal end of the first connection part 751*c* in the width-wise direction X. The second lead connector 751 is located so as not to overlap the first switching elements 30*a*, 30*b*, and 30*c* as viewed in the thickness-wise direction Z. That is, the first connection part 751*c* of the present embodiment is disposed between the fourth side surface 126 of the second die pad 12 and the first switching elements 30*a*, 30*b*, and 30*c* as viewed in the thickness-wise direction Z. The second connection part 751*d* is located at the same position as the second control electrode 42 of the fourth element 40*b* in the length-wise direction Y.

The second electrode connector 752 includes a third branch part 761, a fourth branch part 762, a fifth connection part 771, a sixth connection part 772, a seventh connection part 773, and an eighth connection part 774.

The third branch part 761 and the fourth branch part 762 are connected to a distal end of the second lead connector 751, that is, the second end 751*b* of the second lead connector 751. In the present embodiment, the third branch part 761 and the fourth branch part 762 extend from the second end 751*b* of the second lead connector 751 in opposite directions in the length-wise direction and then extend in the width-wise direction X at a predetermined position. More specifically, the third branch part 761 includes a first section 761*b* extending from the second end 751*b* of the second lead connector 751 toward the first side surface 123 of the second die pad 12 in the length-wise direction Y and a second section 761*c* extending from a distal end of the first section 761*b* in the width-wise direction X. The fourth branch part 762 includes a first section 762*b* extending from the second end 751*b* of the second lead connector 751 in a direction opposite from the third branch part 761, that is, toward the second side surface 124 of the second die pad 12, and a second section 762*c* extending from a distal end of the first section 761*b* in the width-wise direction X. As shown in FIG. 18, the third branch part 761 includes a distal end 761*a*, and the fourth branch part 762 includes a distal end 762*a*. As viewed in the thickness-wise direction Z, the distal end 761*a* and the distal end 762*a* are disposed on a line extending between the second control electrodes 42 of the first switching elements 30*a*, 30*b*, and 30c. The third branch part 761 has a length that extends from the second end 751b of the second lead connector 751 to the distal end 761a of the third branch part 761. The fourth branch part 762 has a length that extends from the second end 751b of the second lead connector 751 to the distal end 762a of the fourth branch part 762.

The fifth connection part 771 is connected between the distal end 761a of the third branch part 761 and the second control electrode 42 of the fourth element 40b. The fifth connection part 771 is disposed adjacent and parallel to the third branch part 761 (the first section 761b). The fifth connection part 771 has a length that extends from the distal end 761a of the third branch part 761 to the second control electrode 42 of the fourth element 40b.

The sixth connection part 772 is connected between the distal end 762a of the fourth branch part 762 and the second control electrode 42 of the fourth element 40b. The sixth connection part 772 is disposed adjacent and parallel to the fourth branch part 762 (the first section 762b). The sixth connection part 772 has a length that extends from the distal end 762a of the fourth branch part 762 to the second control electrode 42 of the fourth element 40b.

The third branch part 761 and the fifth connection part 771 are connected in series between the second end 751b of the second lead connector 751 and the second control electrode 42 of the fourth element 40b. The fourth branch part 762 and the sixth connection part 772 are connected in series between the second end 751b of the second lead connector 751 and the second control electrode 42 of the fourth element 40b. Thus, the second control electrode of the fourth element 40b is connected to the second end 751b of the second lead connector 751 by the fifth connection part 771 and the third branch part 761 and connected to the second end 751b of the second lead connector 751 by the sixth connection part 772 and the fourth branch part 762. In other words, the second control electrode 42 of the fourth element 40b is connected to the second end 751b of the second lead connector 751 by the fifth connection part 771 and the third branch part 761 that are connected in series and the fifth connection part 771 and the fourth branch part 762 that are connected in series. That is, the fifth connection part 771 and the third branch part 761 are connected in parallel to the sixth connection part 772 and the fourth branch part 762.

The seventh connection part 773 is connected between the distal end 761a of the third branch part 761 and the second control electrode 42 of the fifth element 40a. That is, the second control electrode 42 of the fifth element 40a is connected to the second end 751b of the second lead connector 751 by the seventh connection part 773 and the third branch part 761. The seventh connection part 773 has a length that extends from the distal end 761a of the third branch part 761 to the second control electrode 42 of the fifth element 40a.

The eighth connection part 774 is connected between the distal end 762a of the fourth branch part 762 and the second control electrode 42 of the sixth element 40c. That is, the second control electrode 42 of the sixth element 40c is connected to the second end 751b of the second lead connector 751 by the eighth connection part 774 and the fourth branch part 762. The eighth connection part 774 has a length that extends from the distal end 762a of the fourth branch part 762 to the second control electrode 42 of the sixth element 40c.

In the second electrode connector 752, the third branch part 761, the fourth branch part 762, the fifth connection part 771, the sixth connection part 772, the seventh connection part 773, and the eighth connection part 774 are equal in width. The third branch part 761 and the fourth branch part 762 are equal in length. The fifth connection part 771 and the sixth connection part 772 are equal in length. The seventh connection part 773 and the eighth connection part 774 are equal in length. The fifth connection part 771 and the first section 761b of the third branch part 761 are disposed adjacent and parallel to each other. The fifth connection part 771 and the first section 761b of the third branch part 761 are equal in length. The sixth connection part 772 and the first section 762b of the fourth branch part 762 are disposed adjacent and parallel to each other. The sixth connection part 772 and the first section 762b of the fourth branch part 762 are equal in length.

Operation

The operation of the semiconductor device A50 of the present embodiment will now be described.

As shown in FIG. 18, the first control connection member 71 includes the first lead connector 711 and the first electrode connector 712. The first electrode connector 712 includes the first branch part 721, the second branch part 722, the first connection part 731, the second connection part 732, the third connection part 733, and the fourth connection part 734.

The first control electrode 32 of the first element 30b is connected to the second end 711b of the first lead connector 711 by the first connection part 731 and the first branch part 721 that are connected in series and the second connection part 732 and the second branch part 722 that are connected in series. The first connection part 731 and the first branch part 721 are connected in parallel to the second connection part 732 and the second branch part 722. Therefore, the resistance value between the first control electrode 32 of the first element 30b and the second end 711b of the first lead connector 711 is a combined resistance of the resistance values of the first branch part 721, the second branch part 722, the first connection part 731, and the second connection part 732. The first connection part 731 and the second connection part 732 are equal in resistance value. The first branch part 721 and the second branch part 722 are equal in resistance value. The resistance value of the first connection part 731 and the first branch part 721 is equal to the resistance value of the second connection part 732 and the second branch part 722. In the present embodiment, the first branch part 721 is greater in length than the first connection part 731 by the section extending in the width-wise direction X. Therefore, the resistance value between the first control electrode 32 of the first element 30b and the second end 711b of the first lead connector 711 is greater than the resistance value of the first connection part 731 and less than the resistance value of the first branch part 721.

The first control electrode 32 of the second element 30a is connected to the second end 711b of the first lead connector 711 by the third connection part 733 and the first branch part 721. Therefore, the difference of the resistance value between the first control electrode 32 of the second element 30a and the second end 711b of the first lead connector 711 from the resistance value between the first control electrode 32 of the first element 30b and the second end 711b of the first lead connector 711 is less than the resistance value of the third connection part 733.

The first control electrode 32 of the third element 30c is connected to the second end 711b of the first lead connector 711 by the fourth connection part 734 and the second branch part 722. Therefore, the difference of the resistance value between the first control electrode 32 of the third element 30c and the second end 711b of the first lead connector 711 from the resistance value between the first control electrode 32 of the first element 30b and the second end 711b of the first lead connector 711 is less than the resistance value of the fourth connection part 734.

The distal end 721a of the first branch part 721 and the distal end 722a of the second branch part 722 are disposed on the straight line extending between the first control electrodes 32 of the first element 30b, the second element 30a, and the third element 30c. The first connection part 731 and the third connection part 733 extend from the distal end 721a of the first branch part 721 in opposite directions. The second connection part 732 and the fourth connection part 734 extend from the distal end 722a of the second branch part 722 in opposite directions. Thus, the length of the third connection part 733 is less than an arrangement pitch between the first element 30b and the second element 30a. The length of the fourth connection part 734 is less than an arrangement pitch between the first element 30b and the third element 30c. This allows the resistance values of the second element 30a and the third element 30c to be proximate to the resistance value of the first element 30b, thereby reducing variations in resistance value among the first element 30b, the second element 30a, and the third element 30c. When the ratio of the length of the third connection part 733 to the length of the first connection part 731 is decreased (for example, 9:1), the resistance value of the second element 30a becomes equal to the resistance value of the first element 30b. Also, when the ratio of the length of the fourth connection part 734 to the length of the second connection part 732 is decreased (for example, 9:1), the resistance value of the third element 30c becomes equal to the resistance value of the first element 30b.

The second control connection member 75 is configured in the same manner as the first control connection member 71. More specifically, the first control electrode 32 of the fourth element 40b is connected to the second end 751b of the second lead connector 751 by the fifth connection part 771 and the third branch part 761 that are connected in series and the sixth connection part 772 and the fourth branch part 762 that are connected in series. Therefore, the resistance value between the first control electrode 32 of the fourth element 40b and the second end 751b of the second lead connector 751 is greater than the resistance value of the fifth connection part 771 and less than the resistance value of the third branch part 761.

The first control electrode 32 of the fifth element 40a is connected to the second end 751b of the second lead connector 751 by the seventh connection part 773 and the third branch part 761. Therefore, the difference of the resistance value between the first control electrode 32 of the fifth element 40a and the second end 751b of the second lead connector 751 from the resistance value between the first control electrode 32 of the fourth element 40b and the second end 751b of the second lead connector 751 is less than the resistance value of the seventh connection part 773.

The first control electrode 32 of the sixth element 40c is connected to the second end 751b of the second lead connector 751 by the eighth connection part 774 and the fourth branch part 762. Therefore, the difference of the resistance value between the first control electrode 32 of the sixth element 40c and the second end 751b of the second lead connector 751 from the resistance value between the first control electrode 32 of the fourth element 40b and the second end 751b of the second lead connector 751 is less than the resistance value of the eighth connection part 774.

This reduces variations in resistance value among the fourth element 40b, the fifth element 40a, and the sixth element 40c.

As described above, the semiconductor device A50 of the fifth embodiment has the following advantages.

(5-1) The first control connection member 71 connects the first control lead 21 to the three first control electrodes 32 of the first element 30b, the second element 30a, and the third element 30c mounted on the first die pad 11. The first control connection member 71 includes the first lead connector 711, which is connected to the first control lead 21, and the first electrode connector 712, which is connected between the first lead connector 711 and the three first control electrodes 32 of the first element 30b, the second element 30a, and the third element 30c.

The first electrode connector 712 includes the first branch part 721, the second branch part 722, the first connection part 731, the second connection part 732, the third connection part 733, and the fourth connection part 734. The first branch part 721 and the second branch part 722 are connected to the second end 711b of the first lead connector 711. The first connection part 731 is connected between the first branch part 721 and the first element 30b. The second connection part 732 is connected between the second branch part 722 and the first element 30b. The third connection part 733 is connected between the first branch part 721 and the second element 30a. The fourth connection part 734 is connected between the second branch part 722 and the third element 30c. The first control connection member 71 reduces variations in resistance value among the first element 30b, the second element 30a, and the third element 30c.

(5-2) The second control connection member 75 connects the second control lead 27 to the three first control electrodes 32 of the fourth element 40b, the fifth element 40a, and the sixth element 40c mounted on the second die pad 12. The second control connection member 75 includes the second lead connector 751, which is connected to the second control lead 27, and the second electrode connector 752, which is connected between the second lead connector 751 and the three first control electrodes 32 of the fourth element 40b, the fifth element 40a, and the sixth element 40c.

The second electrode connector 752 includes the third branch part 761, the fourth branch part 762, the fifth connection part 771, the fifth connection part 771, the sixth connection part 772, and the seventh connection part 773. The third branch part 761 and the fourth branch part 762 are connected to the second end 751b of the second lead connector 751. The fifth connection part 771 is connected between the third branch part 761 and the fourth element 40b. The sixth connection part 772 is connected between the fourth branch part 762 and the fourth element 40b. The seventh connection part 773 is connected between the third branch part 761 and the fifth element 40a. The eighth connection part 774 is connected between the fourth branch part 762 and the sixth element 40c. The second control connection member 75 reduces variations in resistance value among the fourth element 40b, the fifth element 40a, and the sixth element 40c.

Sixth Embodiment

Figure 20:
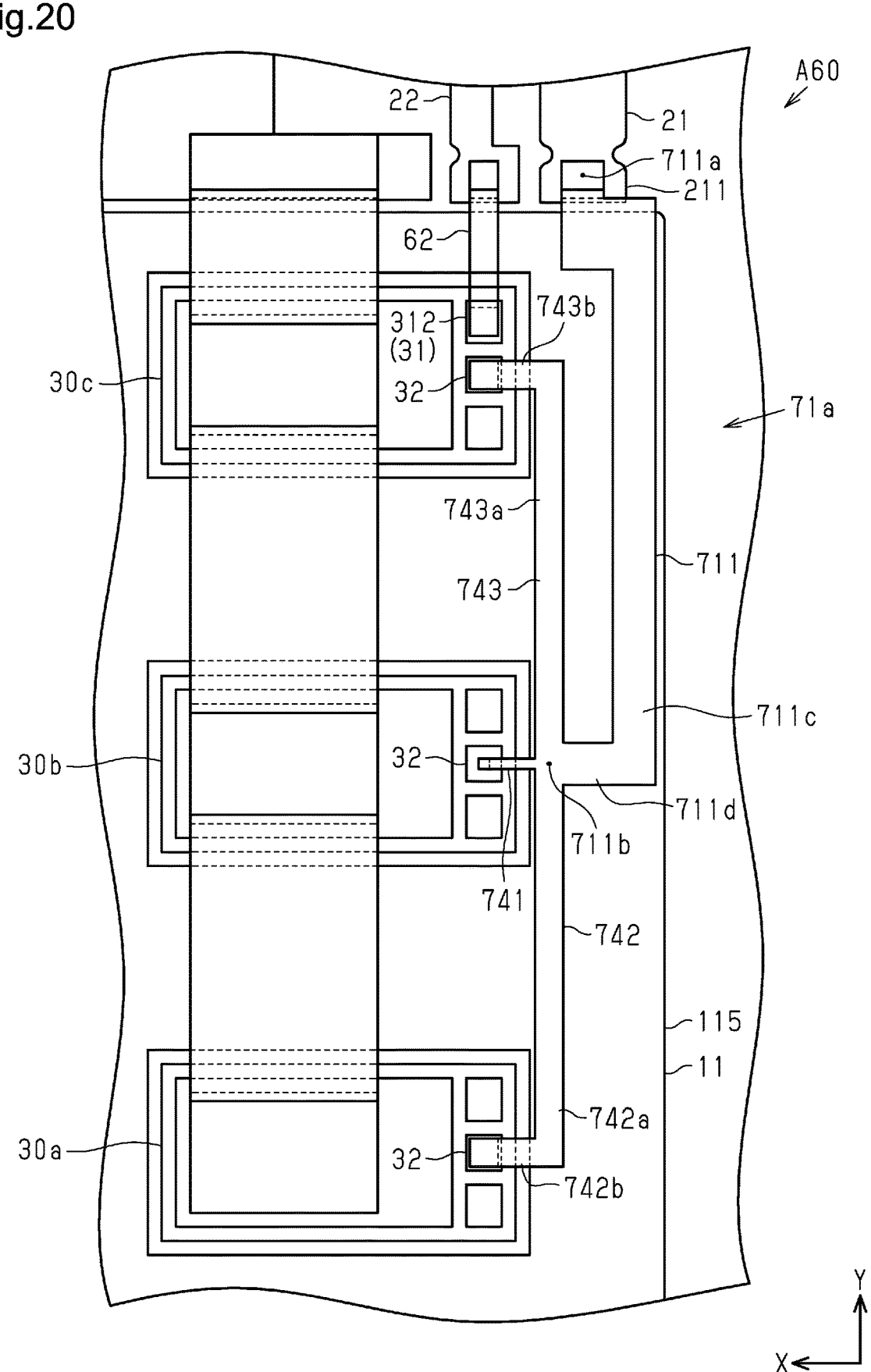
FIG. 20 is an enlarged plan view showing part of the semiconductor device shown in FIG. 19.

A sixth embodiment of a semiconductor device A60 will now be described with reference to FIGS. 19 and 20.

The semiconductor device A60 differs from the semiconductor device A40 of the fourth embodiment and the semiconductor device A50 of the fifth embodiment mainly in the structure of a control connection member. In the description hereafter, the same reference characters are given to those components that are the same as the corresponding components of the semiconductor device A30 of the third embodiment, the semiconductor device A40 of the fourth embodiment, and the semiconductor device A50 of the fifth embodiment. Such components will not be described in detail.

Figure 19:
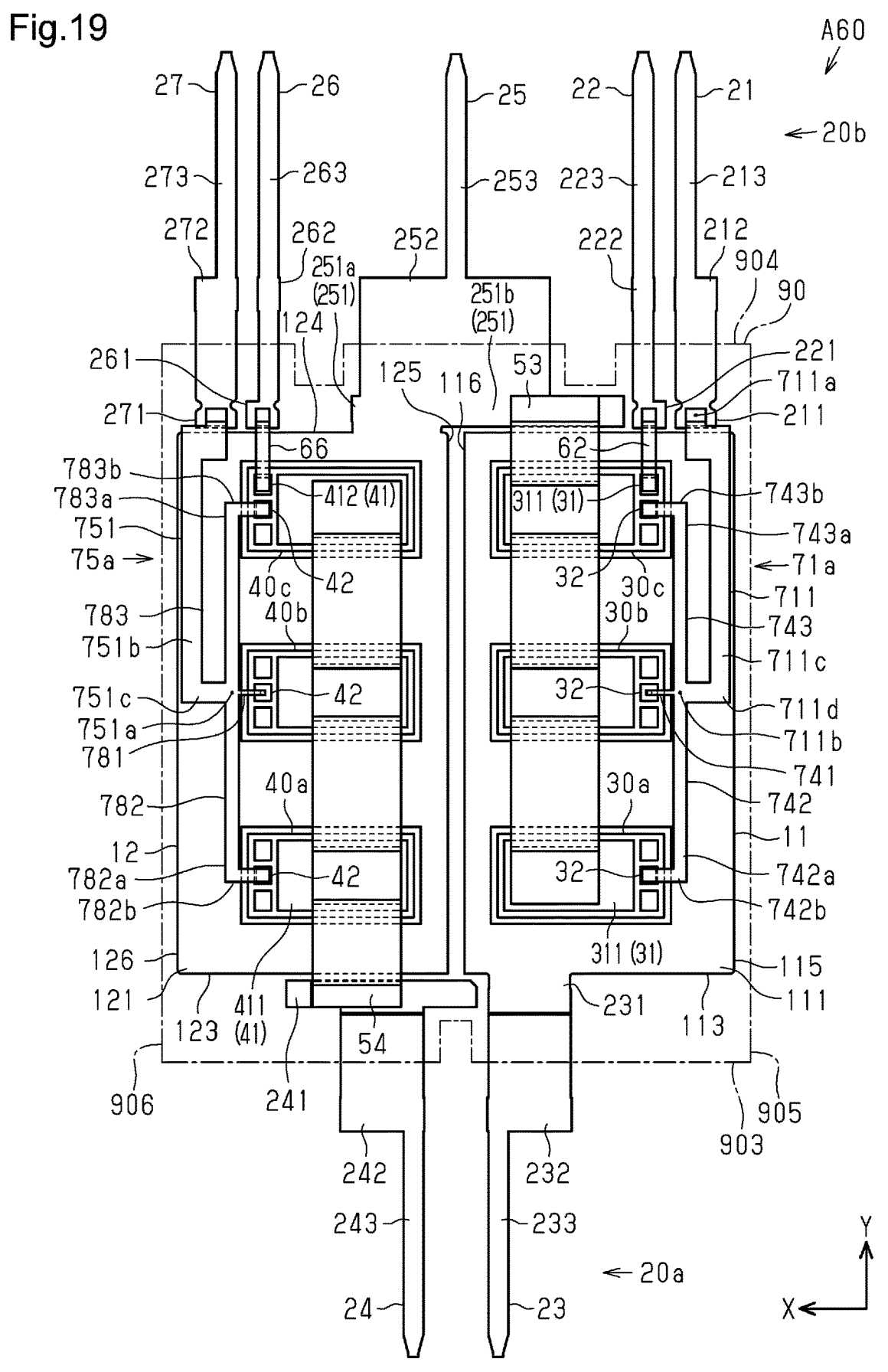

As shown in FIG. 19, the semiconductor device A60 of the sixth embodiment includes a first control connection member 71a and a second control connection member 75a. The first control electrodes 32 of the first switching elements 30a, 30b, and 30c are connected to the first control lead 21 by the first control connection member 71a. The second control electrodes 42 of the second switching elements 40a, 40b, and 40c are connected to the second control lead 27 by the second control connection member 75a.

The first control connection member 71a includes a first lead connector 711 and electrode connectors 742, 741, and 743 extending from the first lead connector 711 toward the control electrodes of the first switching elements 30a, 30b, and 30c.

The electrode connector 741 extends from the second end 711b of the first lead connector 711 toward the first control electrode 32 of the first element 30b in the width-wise direction X. The electrode connector 741 has a length that extends from the second end 711b of the first lead connector 711 to the first control electrode 32 of the first element 30b.

The electrode connector 742 extends from the second end 711b of the first lead connector 711 toward the first control electrode 32 of the second element 30a. The electrode connector 742 includes a first connection part 742a extending in the length-wise direction Y and a second connection part 742b extending from a distal end of the first connection part 742a in the width-wise direction X and connected to the first control electrode 32 of the second element 30a. The electrode connector 742 has a length that extends from the second end 711b of the first lead connector 711 to the first control electrode 32 of the second element 30a.

The electrode connector 743 extends from the second end 711b of the first lead connector 711 toward the first control electrode 32 of the third element 30c. The electrode connector 743 includes a first connection part 743a extending in the length-wise direction Y and a second connection part 743b extending from a distal end of the first connection part 743a in the width-wise direction X and connected to the first control electrode 32 of the third element 30c. The electrode connector 743 has a length that extends from the second end 711b of the first lead connector 711 to the first control electrode 32 of the third element 30c.

The first connection part 742a of the electrode connector 742 and the first connection part 743a of the electrode connector 743 extend in opposite directions in the length-wise direction Y, in which the first switching elements 30a, 30b, and 30c are arranged. The electrode connector 742 and the electrode connector 743 are equal in width. The electrode connectors 741 to 743 are equal in thickness. The electrode connectors 742 and 743 are longer than the electrode connector 741 and wider than the electrode connector 741. In the present embodiment, the width of the electrode connectors 741 to 743 is set in accordance with the length of the electrode connectors 741 to 743 so that the electrode connector 741 and the electrode connectors 742 and 743 are equal in resistance value. For example, the width of the electrode connectors 741 to 743 is set to be inversely proportional to the length of the electrode connectors 741 to 743. In addition to the width, the thickness of the electrode connectors 741 to 743 may be changed.

The second control connection member 75a includes a second lead connector 751 and electrode connectors 782, 781, and 783 extending from the second lead connector 751 toward the control electrodes of the second switching elements 40a, 40b, and 40c.

The electrode connector 781 extends from the second end 751b of the second lead connector 751 toward the second control electrode 42 of the fourth element 40b in the width-wise direction X. The electrode connector 781 has a length that extends from the second end 751b of the second lead connector 751 to the second control electrode 42 of the fourth element 40b.

The electrode connector 782 extends from the second end 751b of the second lead connector 751 toward the second control electrode 42 of the fifth element 40a. The electrode connector 782 includes a first connection part 782a extending in the length-wise direction Y and a second connection part 782b extending from a distal end of the first connection part 782a in the width-wise direction X and connected to the second control electrode 42 of the fifth element 40a. The electrode connector 782 has a length that extends from the second end 751b of the second lead connector 751 to the second control electrode 42 of the fifth element 40a.

The electrode connector 783 extends from the second end 751b of the second lead connector 751 toward the second control electrode 42 of the sixth element 40c. The electrode connector 783 includes a first connection part 783a extending in the length-wise direction Y and a second connection part 783b extending from a distal end of the first connection part 783a in the width-wise direction X and connected to the second control electrode 42 of the sixth element 40c. The electrode connector 783 has a length that extends from the second end 751b of the second lead connector 751 to the second control electrode 42 of the sixth element 40c.

The first connection part 782a of the electrode connector 782 and the first connection part 783a of the electrode connector 783 extend in opposite directions in the length-wise direction Y, in which the second switching elements 40a, 40b, and 40c are arranged. The electrode connector 782 and the electrode connector 783 are equal in width. The electrode connectors 781 to 783 are equal in thickness. The electrode connectors 782 and 783 are longer than the electrode connector 781 and wider than the electrode connector 781. In the present embodiment, the width of the electrode connectors 781 to 783 is set in accordance with the length of the electrode connectors 781 to 783 so that the electrode connector 781 and the electrode connectors 782 and 783 are equal in resistance value. For example, the width of the electrode connectors 781 to 783 is set to be inversely proportional to the length of the electrode connectors 781 to 783. In addition to the width, the thickness of the electrode connectors 781 to 783 may be changed.

Advantages

As described above, the present embodiment has the following advantages.

(6-1) The width of the electrode connectors 742, 741, and 743, which are connected to the first control electrodes 32 of the first switching elements 30a, 30b, and 30c, is set so that the electrode connectors 742, 741, and 743 are equal in resistance value. This reduces variations in electrical properties from the first control lead 21 to the first control electrodes 32 of the first switching elements 30a, 30b, and 30c.

(6-2) The width of the electrode connectors 782, 781, and 783, which are connected to the second control electrodes 42 of the second switching elements 40a, 40b, and 40c, is set so that the electrode connectors 782, 781, and 783 are equal in resistance value. This reduces variations in electrical properties from the first control lead 21 to the first control electrodes 32 of the second switching elements 40*a*, 40*b*, and 40*c*.

Modified Examples

The embodiments and the modified examples may be modified as follows. The embodiments and the following modified examples may be combined as long as the combined modified examples remain technically consistent with each other.

In the second to sixth embodiments of the semiconductor devices, the leads project from the first resin side surface 903 and the second resin side surface 904 of the encapsulation resin 90. However, as in the first embodiment, a semiconductor device may include leads, all of which project from the first resin side surface 903 of the encapsulation resin 90, and three or more switching elements may be mounted on a die pad of the semiconductor device.

In each of the above embodiments, the shape, width, and thickness of each lead may be changed. For example, a predetermined one or all of the leads may be equal in thickness to the die pads 11 and 12.

Seventh to Ninth Embodiments

A semiconductor device that includes a semiconductor element having a switching function is widely used in, for example, a power supply for driving a motor. Japanese Laid-Open Patent Publication No. 2007-234690 discloses an example of a conventional semiconductor device. The semiconductor device disclosed in this publication includes a half-bridge circuit including an upper arm and a lower arm. Each of the upper arm and the lower arm includes semiconductor elements that are connected in parallel.

When a control voltage is applied to control electrodes (for example, gate electrodes) of the semiconductor elements, the control voltage may be unevenly applied depending on the conduction path to each control electrode.

The seventh to ninth embodiments provide a semiconductor device configured to further evenly apply a control voltage to semiconductor elements.

Seventh Embodiment

FIGS. 21 to 51 show a seventh embodiment of a semiconductor device according to the present disclosure. A semiconductor device A1 of the present embodiment includes leads 1A to 1G, semiconductor elements 21A, 22A, 23A, 21B, 22B, and 23B, first conduction members 3A and 3B, second conduction members 4A and 4B, a third conduction member 5, a fourth conduction member 6, and an encapsulation resin 7. The semiconductor device A1 is not limited to a particular use and is used in, for example, a drive source for a motor, an inverter device for various electric appliances, and a DC/DC converter.

Figure 21:
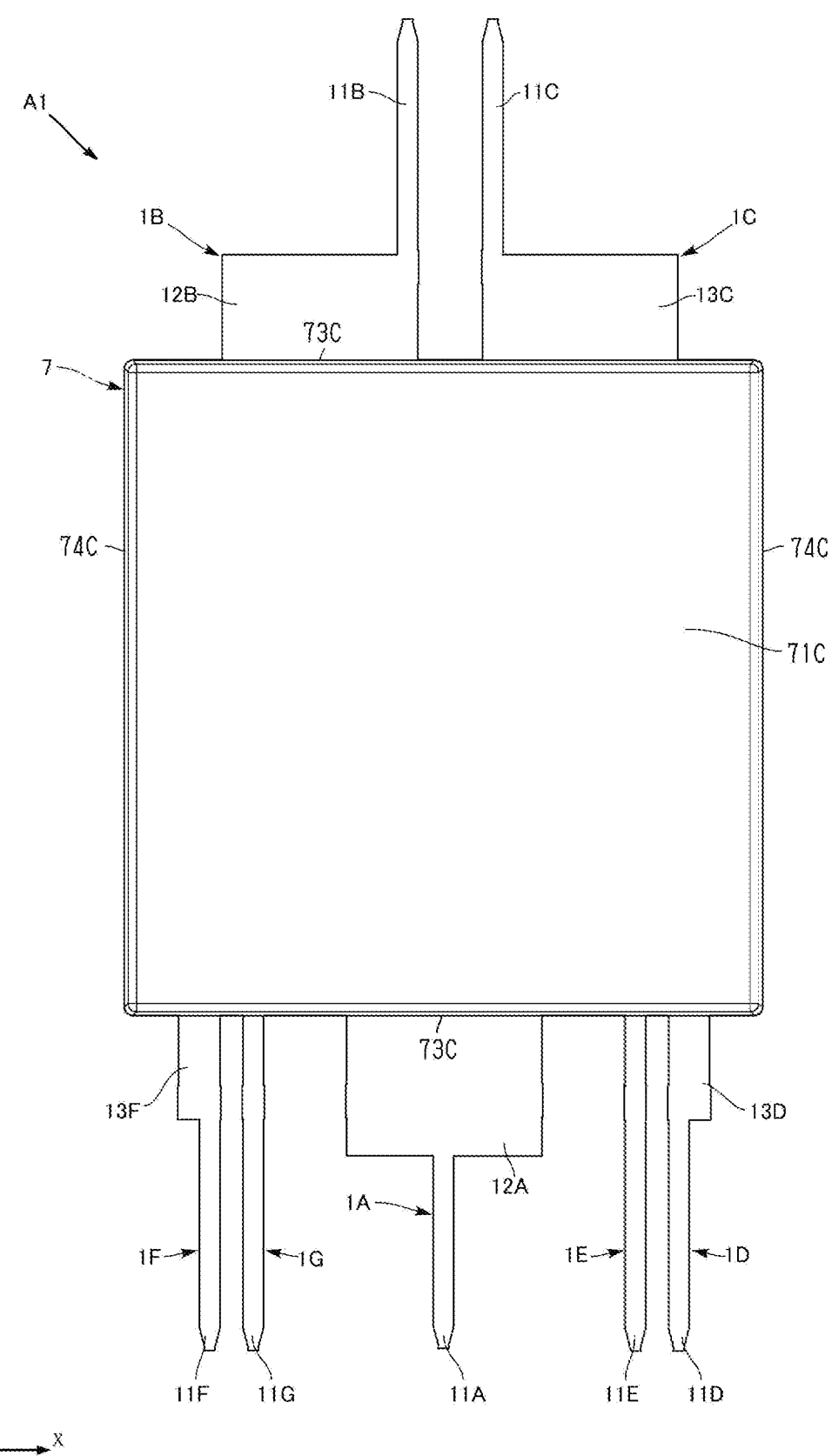
FIG. 21 is a plan view showing a semiconductor device in a seventh embodiment of the present disclosure.
Figure 22:
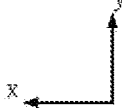
FIG. 22 is a bottom view showing the semiconductor device in the seventh embodiment of the present disclosure.
Figure 23:
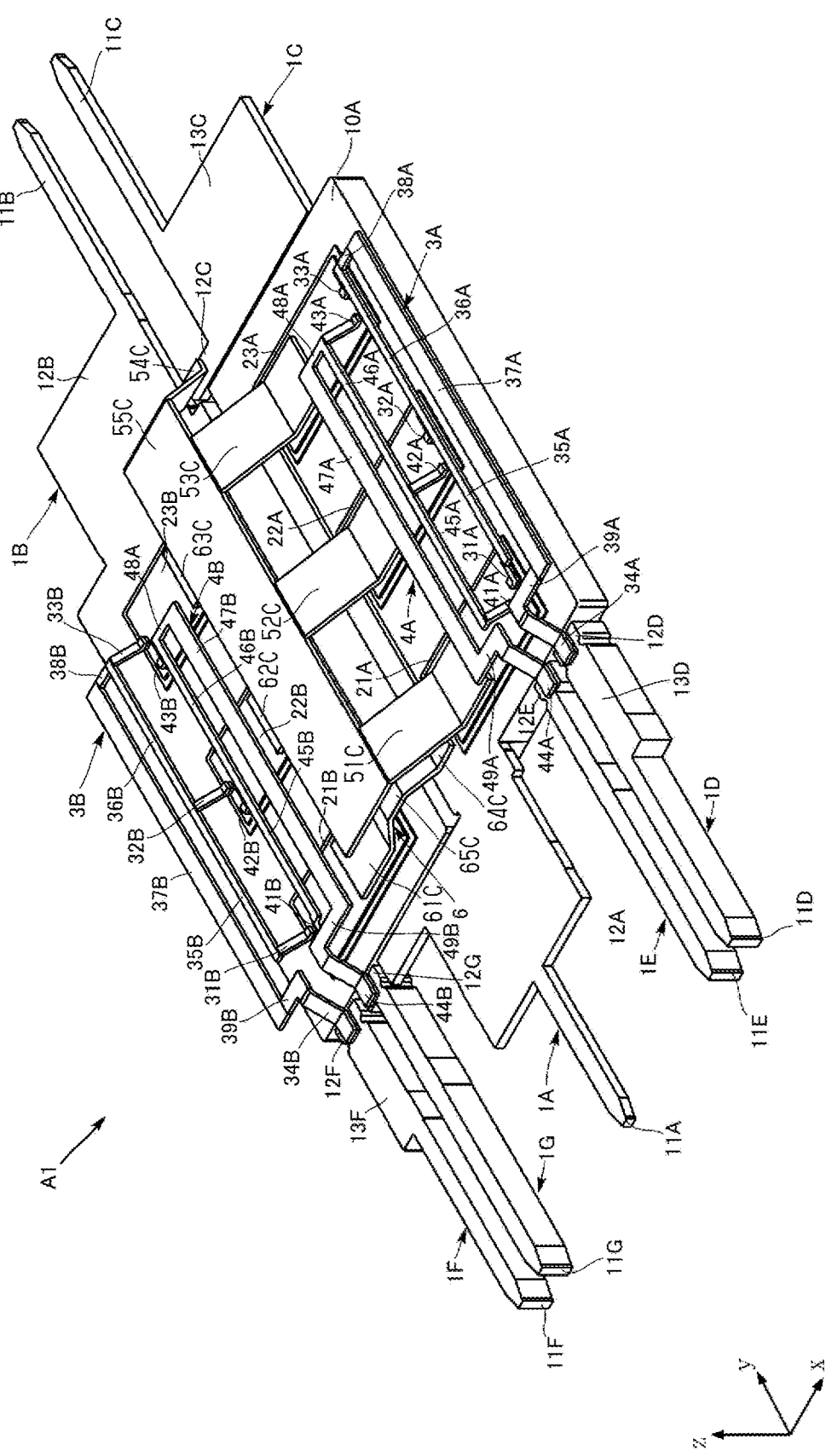
FIG. 23 is a perspective view showing part of the semiconductor device in the seventh embodiment of the present disclosure.
Figure 24:
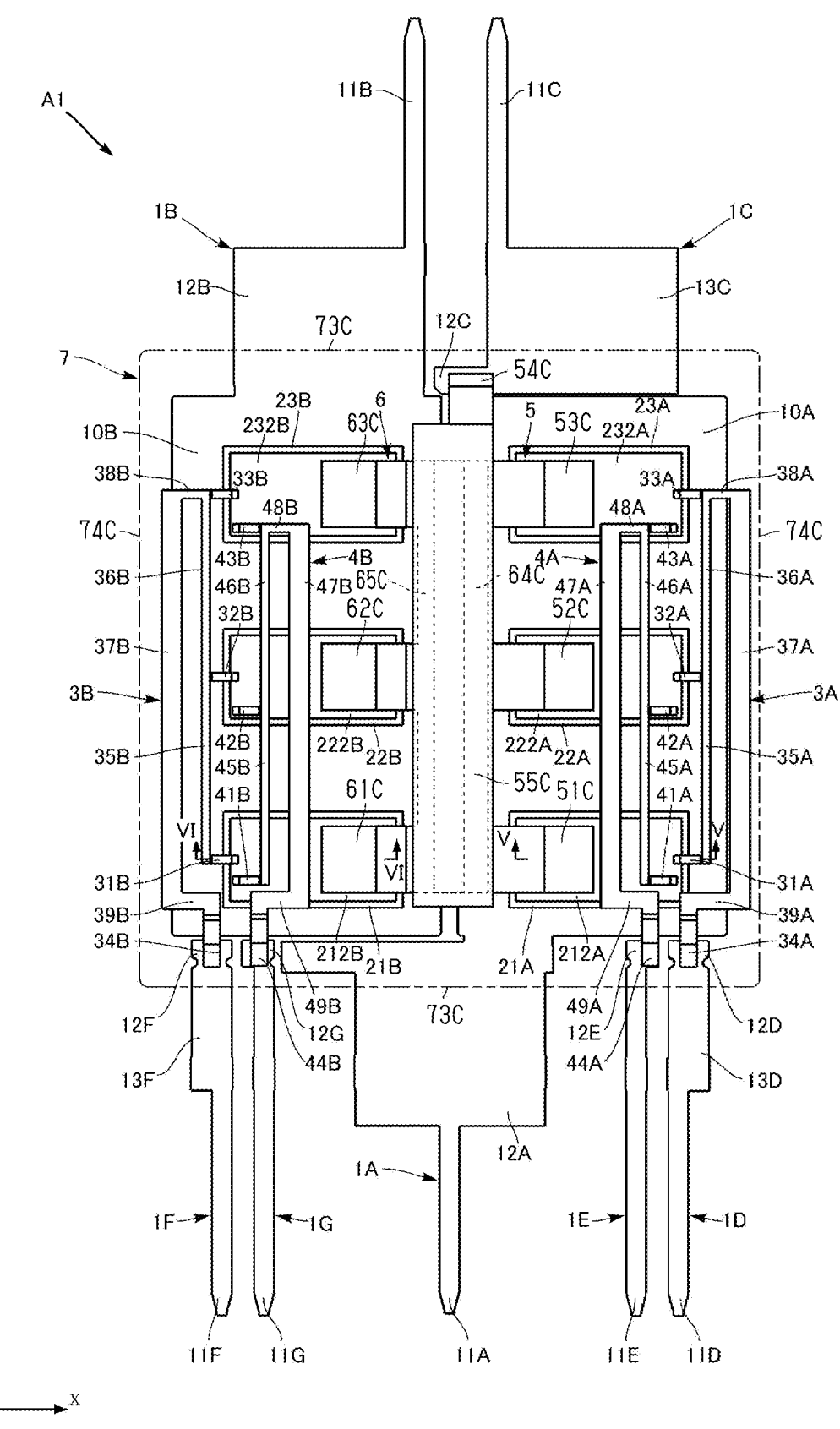
FIG. 24 is a plan view showing part of the semiconductor device in the seventh embodiment of the present disclosure.
Figure 25:
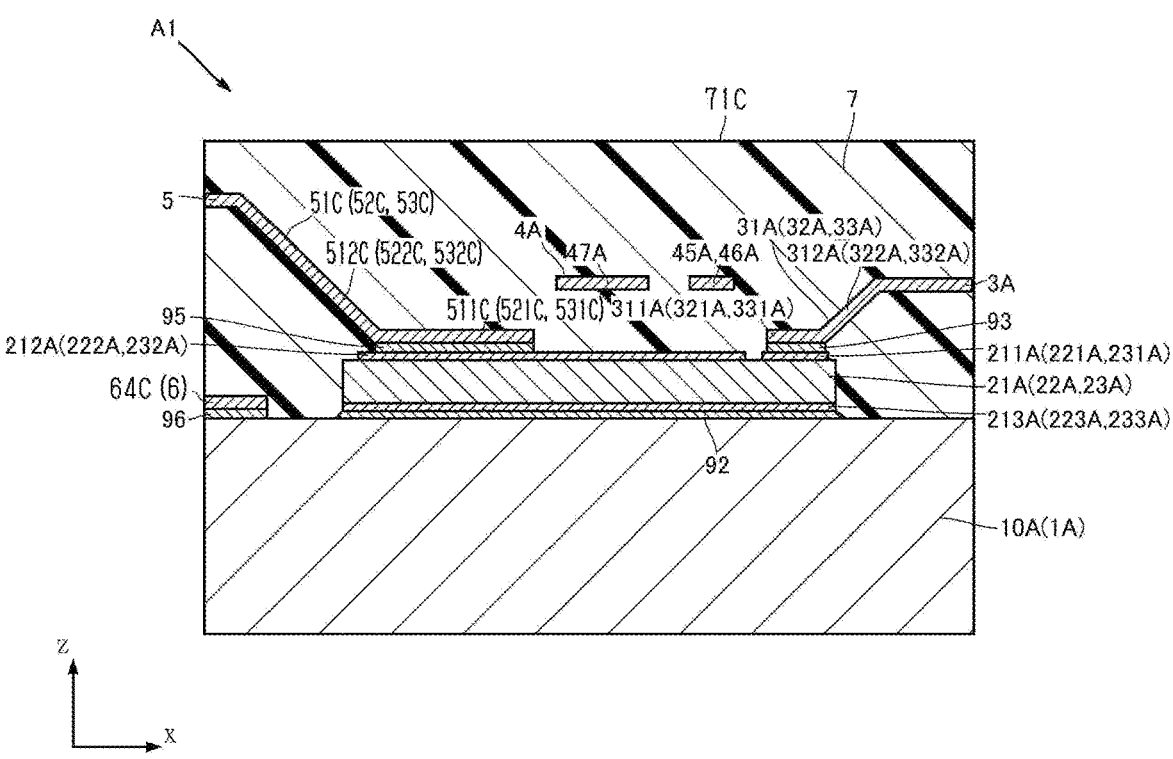
FIG. 25 is a cross-sectional view taken along line V-V in FIG. 24.
Figure 26:
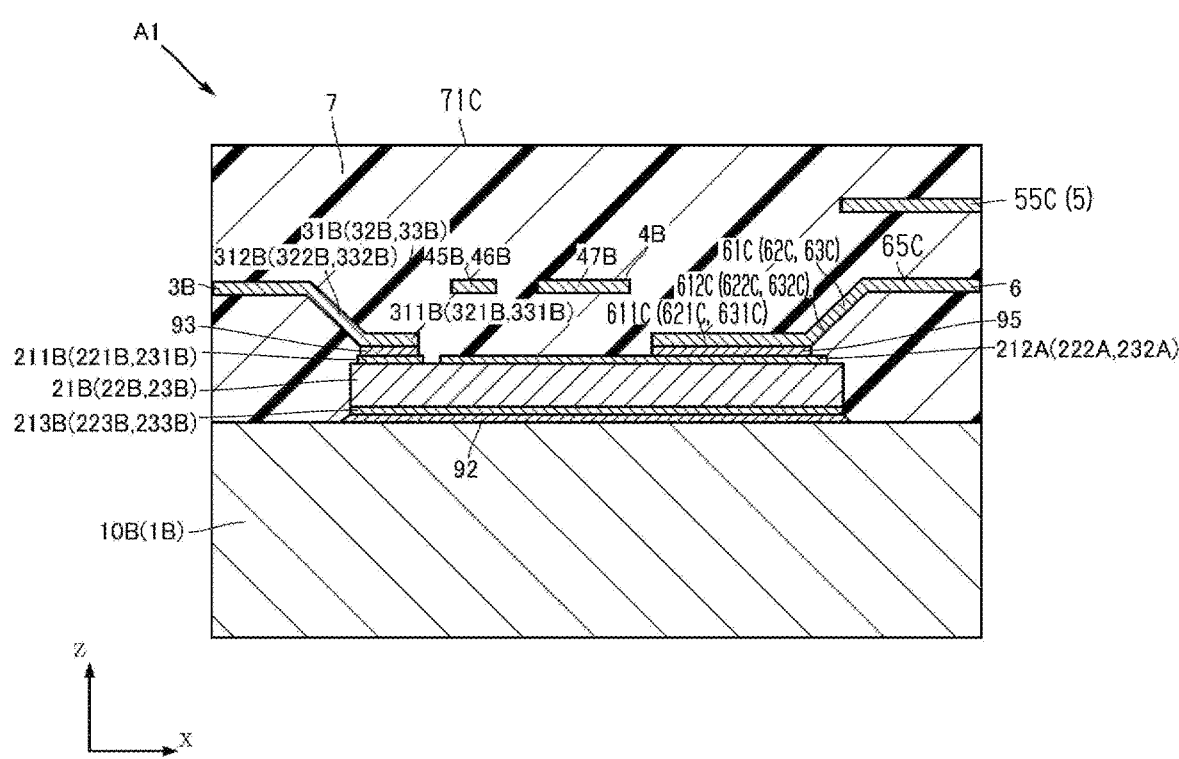
FIG. 26 is a cross-sectional view taken along line VI-VI in FIG. 24.
Figure 27:
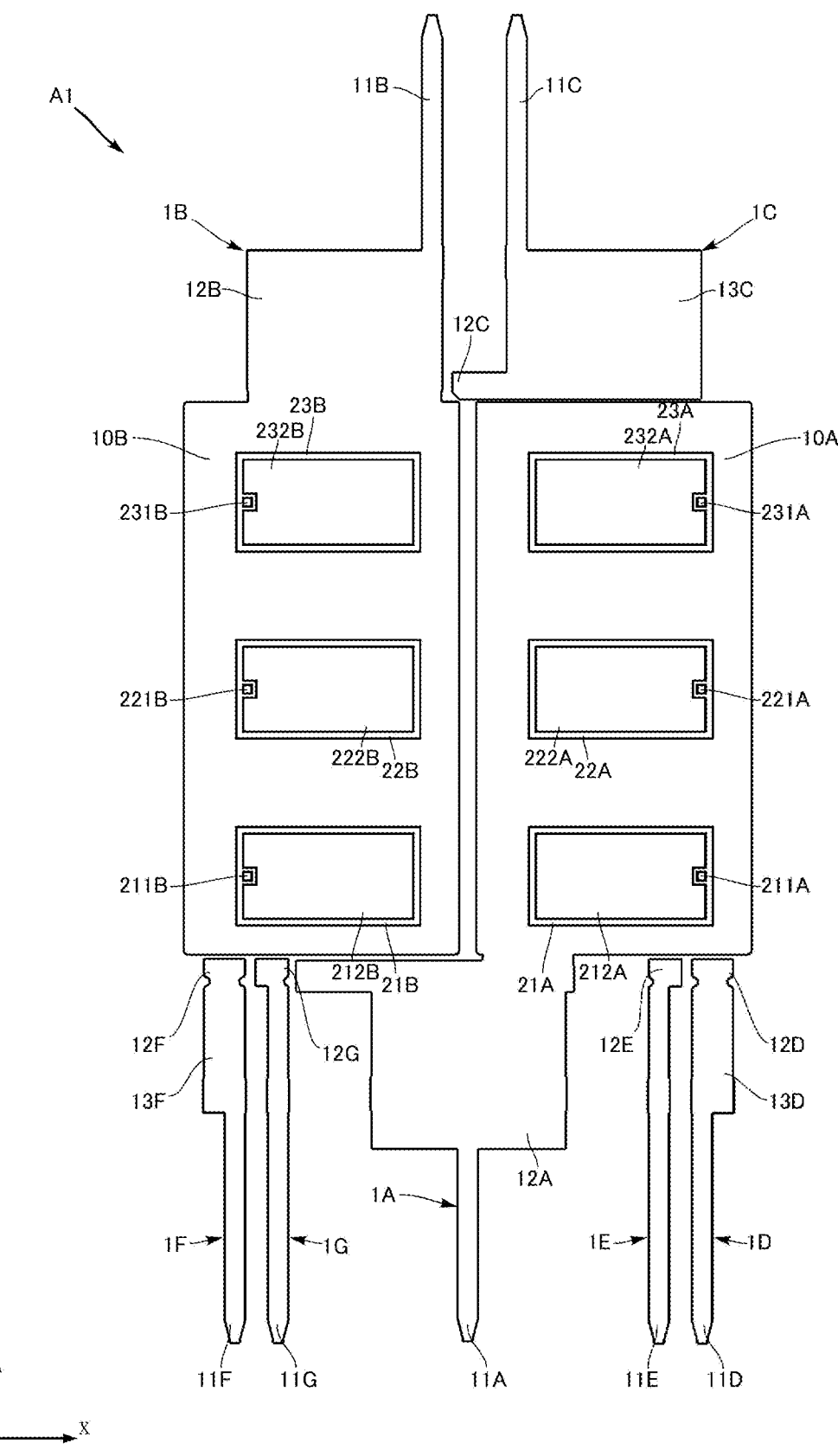
FIG. 27 is a plan view showing part of the semiconductor device in the seventh embodiment of the present disclosure.
Figure 28:
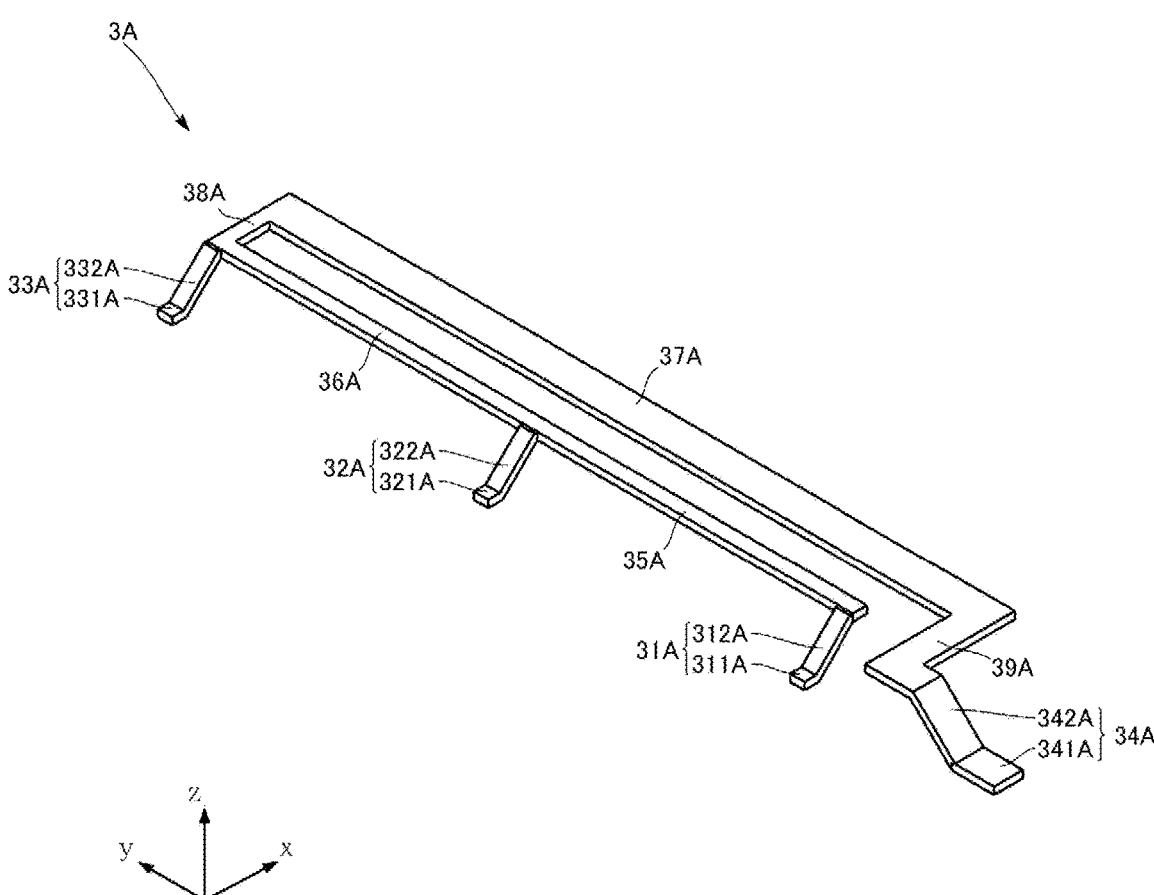
FIG. 28 is a perspective view showing a first conduction member of the semiconductor device in the seventh embodiment of the present disclosure.
Figure 29:
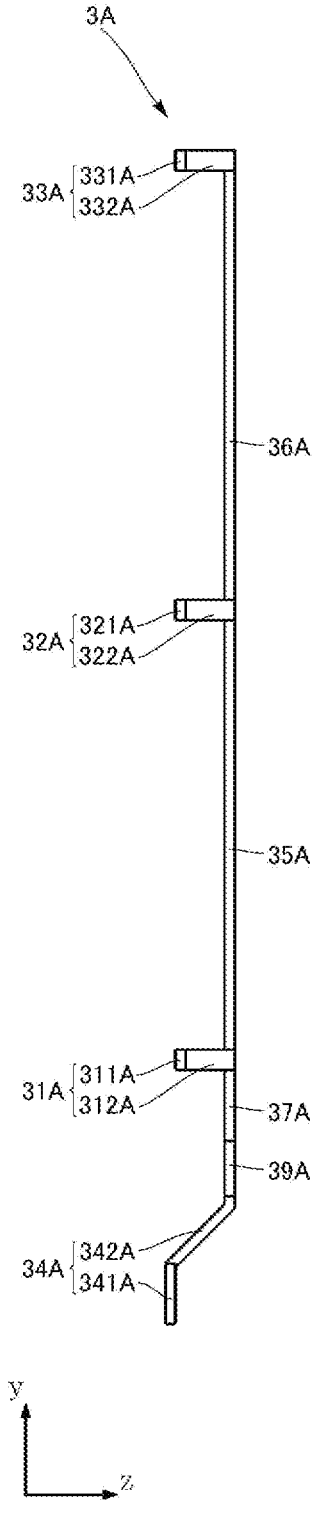
FIG. 29 is a front view showing the first conduction member of the semiconductor device in the seventh embodiment of the present disclosure.
Figure 30:
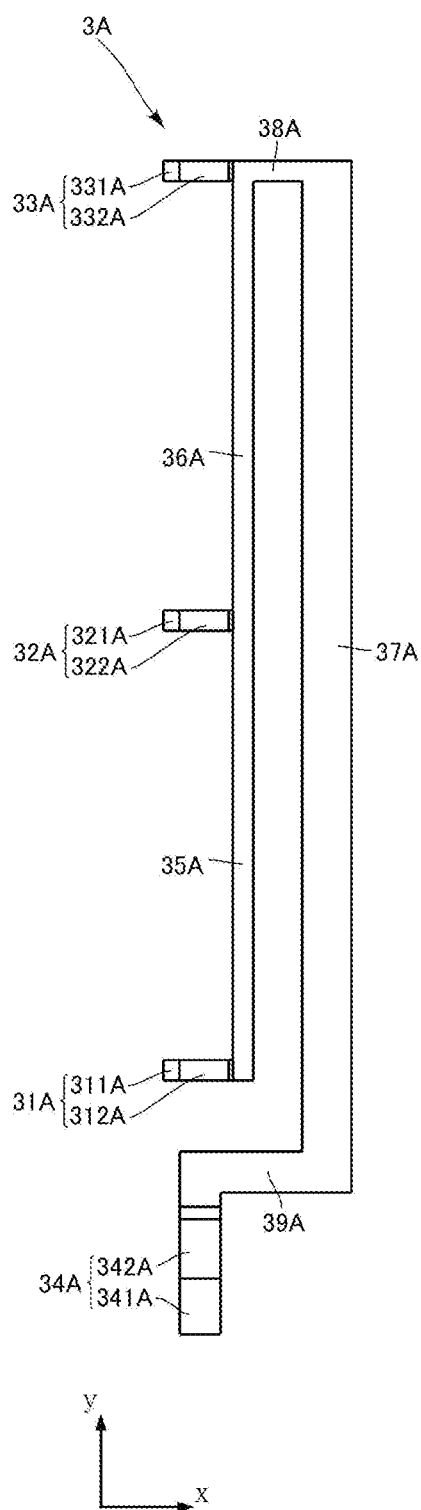
FIG. 30 is a plan view showing the first conduction member of the semiconductor device in the seventh embodiment of the present disclosure.
Figure 31:
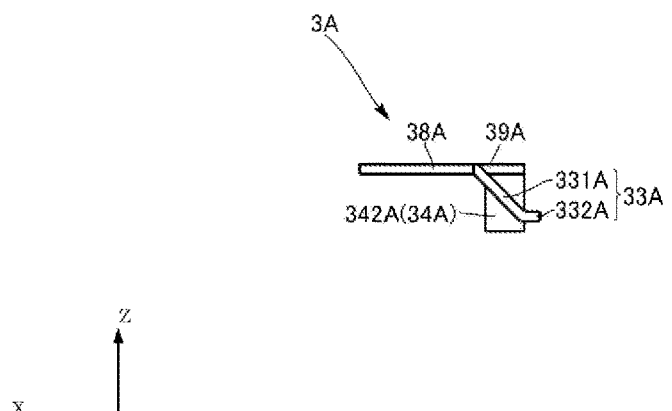
FIG. 31 is a side view showing the first conduction member of the semiconductor device in the seventh embodiment of the present disclosure.

FIG. 21 is a plan view of the semiconductor device A1. FIG. 22 is a bottom view of the semiconductor device A1. FIG. 23 is a perspective view showing part of the semiconductor device A1. FIG. 24 is a plan view showing part of the semiconductor device A1. FIG. 25 is a cross-sectional view taken along line V-V in FIG. 24. FIG. 26 is a cross-sectional view taken along line VI-VI in FIG. 24. FIG. 27 is a plan view showing part of the semiconductor device A1 omitting the leads 1A to 1G, the first conduction members 3A and 3B, the second conduction members 4A and 4B, the third conduction member 5, the fourth conduction member 6, and the encapsulation resin 7. In the drawings, the y-direction is the first direction of the present disclosure. The x-direction is the second direction of the present disclosure. In FIGS. 21, 22, and 24, the lower side in the drawing is defined as one side in the y-direction (first direction), and the upper side in the drawing is defined as the other side in the y-direction (first direction). Also, for the sake of brevity in FIGS. 25 and 26, the upper side in the drawing may be referred to as one side in the z-direction, and the lower side in the drawing may be referred to as the other side in the z-direction.

Leads 1A to 1G The leads 1A to 1G are members supporting the semiconductor elements 21A, 22A, 23A, 21B, 22B, and 23B and forming conduction paths to the semiconductor elements 21A, 22A, 23A, 21B, 22B, and 23B. The leads 1A to 1G are formed from metal such as Cu, Ni, or Fe and obtained, for example, by cutting or bending a metal plate material. In the description hereafter, the leads 1A to 1G are separately referred to as a first lead 1A, a second lead 1B, a third lead 1C, a fourth lead 1D, a fifth lead 1E, a sixth lead 1F, and a seventh lead 1G.

As shown in FIG. 27, the first lead 1A includes an island portion 10A, an output terminal 11A, and an intermediate portion 12A. The semiconductor elements 21A, 22A, and 23A are mounted on the island portion 10A. The shape of the island portion 10A is not particularly limited and, in the illustrated example, rectangular. The output terminal 11A is electrically connected to a circuit substrate (not shown) on which the semiconductor device A1 is mounted. The output terminal 11A projects toward the one side in the y-direction from the island portion 10A. The intermediate portion 12A is disposed between the island portion 10A and the output terminal 11A. The shape of the intermediate portion 12A is not particularly limited and, in the illustrated example, rectangular. The intermediate portion 12A is greater in the dimension in the x-direction than the output terminal 11A. The intermediate portion 12A is joined to the island portion 10A at a position toward the left in the x-direction in the drawing. The center of the output terminal 11A in the x-direction substantially coincides with the center of the intermediate portion 12A in the x-direction. Referring to FIGS. 22 and 23, the output terminal 11A and the intermediate portion 12A are greater in the thickness in the z-direction than the island portion 10A.

As shown in FIG. 27, the second lead 1B includes an island portion 10B, a positive power input terminal 11B, and an intermediate portion 12B. The semiconductor elements 21B, 22B, and 23B are mounted on the island portion 10B. The shape of the island portion 10B is not particularly limited and, in the illustrated example, rectangular. The island portion 10B is located separate from the island portion 10A toward the left in the x-direction in the drawing. The island portion 10B overlaps part of the intermediate portion 12A as viewed in the y-direction. The positive power input terminal 11B is electrically connected to the circuit substrate (not shown) on which the semiconductor device A1 is mounted. The positive power input terminal 11B projects toward the other side in the y-direction from the island portion 10B. The intermediate portion 12B is disposed between the island portion 10B and the positive power input terminal 11B. The shape of the intermediate portion 12B is not particularly limited and, in the illustrated example, rectangular. The intermediate portion 12B is greater in the dimension in the x-direction than the positive power input terminal 11B. The intermediate portion 12B is joined to the island portion 10B at a position slightly toward the right in the x-direction in the drawing. The positive power input terminal 11B is joined to a right end of the intermediate portion 12B in the x-direction in the drawing. Referring to FIGS. 22 and 23, the positive power input terminal 11B and the intermediate portion 12B are smaller in the thickness in the z-direction than the island portion 10B.

As shown in FIG. 27, the third lead 1C is located separate from the island portion 10A toward the other side in the y-direction. The third lead 1C includes a negative power input terminal 11C, a bonding portion 12C, and an intermediate portion 13C. The negative power input terminal 11C is electrically connected to the circuit substrate (not shown) on which the semiconductor device A1 is mounted. The negative power input terminal 11C projects toward the other side in the y-direction. The bonding portion 12C is located at the one side of the negative power input terminal 11C in the y-direction and is rectangular extending in the x-direction. The intermediate portion 13C is joined to the one side of the negative power input terminal 11C in the y-direction and joined to a right part of the bonding portion 12C in the x-direction in the drawing. The intermediate portion 13C is, for example, rectangular and is located at the other side of the island portion 10A in the y-direction. Referring to FIGS. 22 and 23, the third lead 1C is smaller in the thickness in the z-direction than the island portion 10A and the island portion 10B and is substantially equal to the output terminal 11A, the intermediate portion 12A, the positive power input terminal 11B, and the intermediate portion 12B in the thickness in the z-direction.

The fourth lead 1D is located separate from the island portion 10A toward the one side in the y-direction. The fourth lead 1D includes a first gate terminal 11D, a bonding portion 12D, and an intermediate portion 13D. The first gate terminal 11D is electrically connected to the circuit substrate (not shown) on which the semiconductor device A1 is mounted. The first gate terminal 11D is a control terminal of the present disclosure. The first gate terminal 11D projects toward the one side in the y-direction. The bonding portion 12D is located separate from the island portion 10A toward the one side in the y-direction. In the illustrated example, the bonding portion 12D is rectangular such that the long sides extend in the x-direction. The intermediate portion 13D is disposed between the first gate terminal 11D and the bonding portion 12D. The intermediate portion 13D is rectangular such that the long sides extend in the y-direction. The first gate terminal 11D is smaller in the dimension in the x-direction than the bonding portion 12D and the intermediate portion 13D. Referring to FIGS. 22 and 23, the fourth lead 1D is substantially equal to the island portion 10A and the island portion 10B in the thickness in the z-direction.

The fifth lead 1E is located separate from the island portion 10A toward the one side in the y-direction and separate from the fourth lead 1D toward the left in the x-direction in the drawing. The fifth lead 1E includes a first source sense terminal 11E and a bonding portion 12E. The first source sense terminal 11E is electrically connected to the circuit substrate (not shown) on which the semiconductor device A1 is mounted. The first source sense terminal 11E is an auxiliary terminal of the present disclosure. The first source sense terminal 11E projects toward the one side in the y-direction and is located at the left side of the first gate terminal 11D in the x-direction in the drawing. The bonding portion 12E is located separate from the island portion 10A toward the one side in the y-direction and located at the left side of the bonding portion 12D in the x-direction. In the illustrated example, the bonding portion 12E is rectangular such that the long sides extend in the x-direction. The first source sense terminal 11E is smaller in the dimension in the x-direction than the bonding portion

12E. Referring to FIGS. 22 and 23, the fifth lead 1E is substantially equal to the island portion 10A and the island portion 10B in the thickness in the z-direction.

The sixth lead 1F is located separate from the island portion 10B toward the one side in the y-direction. The sixth lead 1F includes a second gate terminal 11F, a bonding portion 12F, and an intermediate portion 13F. The second gate terminal 11F is electrically connected to the circuit substrate (not shown) on which the semiconductor device A1 is mounted. The second gate terminal 11F is a control terminal of the present disclosure. The second gate terminal 11F projects toward the one side in the y-direction. The bonding portion 12F is located separate from the island portion 10B toward the one side in the y-direction. In the illustrated example, the bonding portion 12F is rectangular such that the long sides extend in the x-direction. The intermediate portion 13F is disposed between the second gate terminal 11F and the bonding portion 12F. The intermediate portion 13F is rectangular such that the long sides extend in the y-direction. The second gate terminal 11F is smaller in the dimension in the x-direction than the bonding portion 12F and the intermediate portion 13F. Referring to FIGS. 22 and 23, the sixth lead 1F is substantially equal to the island portion 10A and the island portion 10B in the thickness in the z-direction.

The seventh lead 1G is located separate from the island portion 10B toward the one side in the y-direction and separate from the sixth lead 1F toward the right in the x-direction in the drawing. The seventh lead 1G includes a second source sense terminal 11G and a bonding portion 12G. The second source sense terminal 11G is electrically connected to the circuit substrate (not shown) on which the semiconductor device A1 is mounted. The second source sense terminal 11G is an auxiliary terminal of the present disclosure. The second source sense terminal 11G projects toward the one side in the y-direction and is located at the right side of the second gate terminal 11F in the x-direction in the drawing. The bonding portion 12G is located separate from the island portion 10B toward the one side in the y-direction and located at the left side of the bonding portion 12F in the x-direction in the drawing. In the illustrated example, the bonding portion 12G is rectangular such that the long sides extend in the x-direction. The second source sense terminal 11G is smaller in the dimension in the x-direction than the bonding portion 12G. Referring to FIGS. 22 and 23, the seventh lead 1G is substantially equal to the island portion 10A and the island portion 10B in the thickness in the z-direction.

Semiconductor Elements 21A, 22A, 23A, 21B, 22B, and 23B The semiconductor elements 21A, 22A, 23A, 21B, 22B, and 23B are functional elements having a switching function. The semiconductor elements 21A, 22A, 23A, 21B, 22B, and 23B are not limited to any specified configuration. In the present embodiment, the semiconductor elements 21A, 22A, 23A, 21B, 22B, and 23B are metal-oxide-semiconductor field-effect transistors (MOSFETs) formed from a semiconductor material containing SiC (silicon carbide) as a main component. In another example, the semiconductor elements 21A, 22A, 23A, 21B, 22B, and 23B may be formed from a semiconductor material such as, for example, Si (silicon), GaAs (gallium arsenide), or GaN (gallium nitride). The semiconductor elements 21A, 22A, 23A, 21B, 22B, and 23B may be, for example, field effect transistors such as metal-insulator-semiconductor FETs (MISFETs) or bipolar transistors such as insulated gate bipolar transistors (IGBTs). In the present embodiment, the semiconductor elements 21A, 22A, 23A, 21B, 22B, and 23B are identical elements and are, for example, n-channel MOSFETs. Each semiconductor element 10 is, for example, rectangular as viewed in the z-direction. However, there is no limitation to such a configuration. In the description hereafter, the semiconductor elements 21A, 22A, 23A, 21B, 22B, and 23B are separately referred to as a first semiconductor element 21A, a second semiconductor element 22A, a third semiconductor element 23A, a first semiconductor element 21B, a second semiconductor element 22B, and a third semiconductor element 23B.

As shown in FIGS. 23 to 25 and 27, the first semiconductor element 21A, the second semiconductor element 22A, and the third semiconductor element 23A are mounted on the island portion 10A. The first semiconductor element 21A, the second semiconductor element 22A, and the third semiconductor element 23A are arranged in order from one side toward the other side in the y-direction.

The first semiconductor element 21A includes a gate electrode 211A, a source electrode 212A, and a drain electrode 213A. The gate electrode 211A is located on the one side of the first semiconductor element 21A in the z-direction and is a first control electrode of the present disclosure. The source electrode 212A is located on one side of the first semiconductor element 21A in the z-direction and is a first main surface electrode of the present disclosure. The drain electrode 213A is located on the other side of the first semiconductor element 21A in the z-direction. In the illustrated example, the first semiconductor element 21A is rectangular such that the long sides extend in the x-direction. The gate electrode 211A is located toward the right in the x-direction in the drawing. In the present embodiment, the drain electrode 213A is electrically connected and bonded to the island portion 10A by a conductive bonding material 92. The conductive bonding material 92 is, for example, solder or Ag paste. The conductive bonding material 92 may be an aluminum sheet including silver plating such that silver plating layers are formed on opposite surfaces of an aluminum-containing sheet (base layer). In this case, a silver plating layer is formed on the drain electrode 213A. The aluminum sheet including sliver plating is electrically bonded to the drain electrode 213A through solid-phase diffusion.

The second semiconductor element 22A includes a gate electrode 221A, a source electrode 222A, and a drain electrode 223A. The gate electrode 221A is located on one side of the second semiconductor element 22A in the z-direction and is a second control electrode of the present disclosure. The source electrode 222A is located on the one side of the second semiconductor element 22A in the z-direction and is a second main surface electrode of the present disclosure. The drain electrode 223A is located on the other side of the second semiconductor element 22A in the z-direction. In the illustrated example, the second semiconductor element 22A is rectangular such that the long sides extend in the x-direction. The gate electrode 221A is located toward the right in the x-direction in the drawing. In the present embodiment, the drain electrode 223A is electrically connected and bonded to the island portion 10A by the conductive bonding material 92.

The third semiconductor element 23A includes a gate electrode 231A, a source electrode 232A, and a drain electrode 233A. The gate electrode 231A is located on one side of the third semiconductor element 23A in the z-direction and is a third control electrode of the present disclosure. The source electrode 232A is located on the one side of the third semiconductor element 23A in the z-direction and is a third main surface electrode of the present disclosure. The drain electrode 233A is located on the other side of the third semiconductor element 23A in the z-direction. In the illustrated example, the third semiconductor element 23A is rectangular such that the long sides extend in the x-direction. The gate electrode 231A is located toward the right in the x-direction in the drawing. In the present embodiment, the drain electrode 233A is electrically connected and bonded to the island portion 10A by the conductive bonding material 92.

As shown in FIGS. 23, 24, 26, and 27, the first semiconductor element 21B, the second semiconductor element 22B, and the third semiconductor element 23B are mounted on the island portion 10B. The first semiconductor element 21B, the second semiconductor element 22B, and the third semiconductor element 23B are arranged in order from one side toward the other side in the y-direction.

The first semiconductor element 21B includes a gate electrode 211B, a source electrode 212B, and a drain electrode 213B. The gate electrode 211B is located on one side of the first semiconductor element 21B in the z-direction and is a first control electrode of the present disclosure. The source electrode 212B is located on the one side of the first semiconductor element 21B in the z-direction and is a first main surface electrode of the present disclosure. The drain electrode 213B is located on the other side of the first semiconductor element 21B in the z-direction. In the illustrated example, the first semiconductor element 21B is rectangular such that the long sides extend in the x-direction. The gate electrode 211B is located toward the left in the x-direction in the drawing. In the present embodiment, the drain electrode 213B is electrically connected and bonded to the island portion 10B by the conductive bonding material 92.

The second semiconductor element 22B includes a gate electrode 221B, a source electrode 222B, and a drain electrode 223B. The gate electrode 221B is located on one side of the second semiconductor element 22B in the z-direction and is a second control electrode of the present disclosure. The source electrode 222B is located on the one side of the second semiconductor element 22B in the z-direction and is a second main surface electrode of the present disclosure. The drain electrode 223B is located on the other side of the second semiconductor element 22B in the z-direction. In the illustrated example, the second semiconductor element 22B is rectangular such that the long sides extend in the x-direction. The gate electrode 221B is located toward the left in the x-direction in the drawing. In the present embodiment, the drain electrode 223B is electrically connected and bonded to the island portion 10B by the conductive bonding material 92.

The third semiconductor element 23B includes a gate electrode 231B, a source electrode 232B, and a drain electrode 233B. The gate electrode 231B is located on one side of the third semiconductor element 23B in the z-direction and is a third control electrode of the present disclosure. The source electrode 232B is located on the one side of the third semiconductor element 23B in the z-direction and is a third main surface electrode of the present disclosure. The drain electrode 233B is located on the other side of the third semiconductor element 23B in the z-direction. In the illustrated example, the third semiconductor element 23B is rectangular such that the long sides extend in the x-direction. The gate electrode 231B is located toward the left in the x-direction in the drawing. In the present embodiment, the drain electrode 233B is electrically connected and bonded to the island portion 10B by the conductive bonding material 92.

First Conduction Members 3A and 3B

The first conduction members 3A and 3B are members forming conduction paths to the semiconductor elements 21A, 22A, 23A, 21B, 22B, and 23B. The first conduction members 3A and 3B are formed from metal such as Cu, Ni, or Fe and obtained, for example, by cutting or bending a metal plate material.

The first conduction member 3A electrically connects the gate electrode 211A of the first semiconductor element 21A, the gate electrode 221A of the second semiconductor element 22A, the gate electrode 231A of the third semiconductor element 23A, and the first gate terminal 11D of the fourth lead 1D to each other. As shown in FIGS. 28 to 31, in the present embodiment, the first conduction member 3A includes a first extension 31A, a second extension 32A, a third extension 33A, a terminal extension 34A, a first joint 35A, a second joint 36A, a third joint 37A, a first linkage 38A, and a second linkage 39A.

As shown in FIGS. 23 to 25, the first extension 31A includes a part bonded to the gate electrode 211A of the first semiconductor element 21A. In the illustrated example, the first extension 31A includes a bonding portion 311A and an inclined portion 312A. The bonding portion 311A is electrically connected and bonded to the gate electrode 211A by a conductive bonding material 93. The conductive bonding material 93 is, for example, solder or Ag paste. The inclined portion 312A is joined to the bonding portion 311A and extends from the bonding portion 311A toward the one side in the z-direction and toward the right in the x-direction in the drawing.

As shown in FIGS. 23 to 25, the second extension 32A includes a part bonded to the gate electrode 221A of the second semiconductor element 22A. In the illustrated example, the second extension 32A includes a bonding portion 321A and an inclined portion 322A. The bonding portion 321A is electrically connected and bonded to the gate electrode 221A by the conductive bonding material 93. The inclined portion 322A is joined to the bonding portion 321A and extends from the bonding portion 321A toward the one side in the z-direction and rightward in the x-direction in the drawing.

As shown in FIGS. 23 to 25, the third extension 33A includes a part bonded to the gate electrode 231A of the third semiconductor element 23A. In the illustrated example, the third extension 33A includes a bonding portion 331A and an inclined portion 332A. The bonding portion 331A is electrically connected and bonded to the gate electrode 231A by the conductive bonding material 93. The inclined portion 332A is joined to the bonding portion 331A and extends from the bonding portion 331A toward the one side in the z-direction and toward the right in the x-direction in the drawing.

In the present embodiment, as shown in FIG. 24, the region occupied by the first gate terminal 11D in the x-direction overlaps the region occupied by each of the bonding portion 311A of the first extension 31A, the bonding portion 321A of the second extension 32A, and the bonding portion 331A of the third extension 33A in the x-direction.

As shown in FIGS. 23, 24, and 28 to 31, the terminal extension 34A is electrically connected to the first gate terminal 11D and includes a part bonded to the bonding portion 12D of the fourth lead 1D. In the illustrated example, the terminal extension 34A includes a bonding portion 341A and an inclined portion 342A. The bonding portion 341A is electrically connected and bonded to the bonding portion 12D by the conductive bonding material 93. The inclined portion 342A is joined to the bonding portion 341A and extends from the bonding portion 341A toward the one side in the z-direction and toward the other side in the y-direction.

As shown in FIGS. 23, 24, and 28 to 31, the first joint 35A joins the first extension 31A and the second extension 32A. In the illustrated example, the first joint 35A joins an end of the inclined portion 312A of the first extension 31A and an end of the inclined portion 322A of the second extension 32A. The first joint 35A extends in the y-direction. The first joint 35A is located at the one side of the bonding portion 311A and the bonding portion 321A in the z-direction.

As shown in FIGS. 23, 24, and 28 to 31, the second joint 36A joins the second extension 32A and the third extension 33A. In the illustrated example, the second joint 36A joins an end of the inclined portion 322A of the second extension 32A and an end of the inclined portion 332A of the third extension 33A. The second joint 36A extends in the y-direction. The first joint 35A and the second joint 36A overlap each other as viewed in the y-direction. The second joint 36A is located at the one side of the bonding portion 321A and the bonding portion 331A in the z-direction.

As shown in FIGS. 23, 24, and 28 to 31, the third joint 37A is disposed between the third extension 33A and the terminal extension 34A. In the present embodiment, the third joint 37A extends in the y-direction. The third joint 37A is located separate from the first joint 35A and the second joint 36A toward the right in the x-direction in the drawing. The third joint 37A is located at substantially the same position in the z-direction as the first joint 35A and the second joint 36A. In the illustrated example, the first joint 35A and the second joint 36A are disposed parallel to the third joint 37A over the full length of the first joint 35A and the second joint 36A. The third joint 37A is greater in the dimension in the x-direction than the first joint 35A and the second joint 36A.

As shown in FIGS. 23, 24, and 28 to 31, the first linkage 38A is joined to an other-side portion of the second joint 36A in the y-direction and an other-side portion of the third joint 37A in the y-direction. The first linkage 38A extends in the x-direction. The first linkage 38A is located at substantially the same position in the z-direction as the first joint 35A, the second joint 36A, and the third joint 37A.

As shown in FIGS. 23, 24, and 28 to 31, the second linkage 39A is joined to a one-side portion of the third joint 37A in the y-direction and an other-side portion of the inclined portion 342A of the terminal extension 34A in the y-direction. The first linkage 38A extends in the x-direction. The first linkage 38A is located at substantially the same position in the z-direction as the first joint 35A, the second joint 36A, and the third joint 37A.

The first conduction member 3B electrically connects the gate electrode 211B of the first semiconductor element 21B, the gate electrode 221B of the second semiconductor element 22B, the gate electrode 231B of the third semiconductor element 23B, and the second gate terminal 11F of the sixth lead 1F to each other. As shown in FIGS. 32 to 35, in the present embodiment, the first conduction member 3B includes a first extension 31B, a second extension 32B, a third extension 33B, a terminal extension 34B, a first joint 35B, a second joint 36B, a third joint 37B, a first linkage 38B, and a second linkage 39B.

As shown in FIGS. 23, 24, and 26, the first extension 31B includes a part bonded to the gate electrode 211B of the first semiconductor element 21B. In the illustrated example, first extension 31B includes a bonding portion 311B and an inclined portion 312B. The bonding portion 311B is electrically connected and bonded to the gate electrode 211B by the conductive bonding material 93. The inclined portion 312B is joined to the bonding portion 311B and extends from the bonding portion 311B toward the one side in the z-direction and toward the left in the x-direction in the drawing.

As shown in FIGS. 23, 24, and 26, the second extension 32B includes a part bonded to the gate electrode 221B of the second semiconductor element 22B. In the illustrated example, the second extension 32B includes a bonding portion 321B and an inclined portion 322B. The bonding portion 321B is electrically connected to and bonded to the gate electrode 221B by the conductive bonding material 93. The inclined portion 322B is joined to the bonding portion 321B and extends from the bonding portion 321B toward the one side in the z-direction and toward the left in the x-direction in the drawing.

As shown in FIGS. 23, 24, and 26, the third extension 33B includes a part bonded to the gate electrode 231B of the third semiconductor element 23B. In the illustrated example, the third extension 33B includes a bonding portion 331B and an inclined portion 332B. The bonding portion 331B is electrically connected to and bonded to the gate electrode 231B by the conductive bonding material 93. The inclined portion 332B is joined to the bonding portion 331B and extends from the bonding portion 331B toward the one side in the z-direction and toward the left in the x-direction in the drawing.

In the present embodiment, as shown in FIG. 24, the region occupied by the second gate terminal 11F in the x-direction overlaps the region occupied by each of the bonding portion 311B of the first extension 31B, the bonding portion 321B of the second extension 32B, and the bonding portion 331B of the third extension 33B in the x-direction.

As shown in FIGS. 23, 24, and 32 to 35, the terminal extension 34B is electrically connected to the second gate terminal 11F and includes a part bonded to the bonding portion 12F of the sixth lead 1F. In the illustrated example, the terminal extension 34B includes a bonding portion 341B and an inclined portion 342B. The bonding portion 341B is electrically connected and bonded to the bonding portion 12F by the conductive bonding material 93. The inclined portion 342B is joined to the bonding portion 341B and extends from the bonding portion 341B toward the one side in the z-direction and toward the other side in the y-direction.

As shown in FIGS. 23, 24, and 32 to 35, the first joint 35B joins the first extension 31B and the second extension 32B. In the illustrated example, the first joint 35B joins an end of the inclined portion 312B of the first extension 31B and an end of the inclined portion 322B of the second extension 32B. The first joint 35B extends in the y-direction. The first joint 35B is located at the one side of the bonding portion 311B and the bonding portion 321B in the z-direction.

As shown in FIGS. 23, 24, and 32 to 35, the second joint 36B joins the second extension 32B and the third extension 33B. In the illustrated example, the second joint 36B joins an end of the inclined portion 322B of the second extension 32B and an end of the inclined portion 332B of the third extension 33B. The second joint 36B extends in the y-direction. The first joint 35B and the second joint 36B overlap each other as viewed in the y-direction. The second joint 36B is located at the one side of the bonding portion 321B and the bonding portion 331B in the z-direction.

As shown in FIGS. 23, 24, and 32 to 35, the third joint 37B is disposed between the third extension 33B and the terminal extension 34B. In the present embodiment, the third joint 37B extends in the y-direction. The third joint 37B is located separate from the first joint 35B and the second joint 36B leftward in the x-direction in the drawing. The third joint 37B is located at substantially the same position in the z-direction as the first joint 35B and the second joint 36B. In the illustrated example, the first joint 35B and the second joint 36B are disposed parallel to the third joint 37B over the full length of the first joint 35B and the second joint 36B. The third joint 37B is greater in the dimension in the x-direction than the first joint 35B and the second joint 36B.

As shown in FIGS. 23, 24, and 32 to 35, the first linkage 38B is joined to an other-side portion of the second joint 36B in the y-direction and an other-side portion of the third joint 37B in the y-direction. The first linkage 38B extends in the x-direction. The first linkage 38B is located at substantially the same position in the z-direction as the first joint 35B, the second joint 36B, and the third joint 37B.

As shown in FIGS. 23, 24, and 32 to 35, the second linkage 39B is joined to a one-side portion of the third joint 37B in the y-direction and an other-side portion of the inclined portion 342B of the terminal extension 34B in the y-direction. The first linkage 38B extends in the x-direction. The first linkage 38B is located at substantially the same position in the z-direction as the first joint 35B, the second joint 36B, and the third joint 37B.

Second Conduction Members 4A and 4B

The second conduction members 4A and 4B are members forming conduction paths to the semiconductor elements 21A, 22A, 23A, 21B, 22B, and 23B. The first conduction members 3A and 3B are formed from metal such as Cu, Ni, or Fe and obtained, for example, by cutting or bending a metal plate material.

The second conduction member 4A electrically connects the source electrode 212A of the first semiconductor element 21A, the source electrode 222A of the second semiconductor element 22A, the source electrode 232A of the third semiconductor element 23A, and the first source sense terminal 11E of the fifth lead 1E to each other. As shown in FIGS. 36 to 39, in the present embodiment, the second conduction member 4A includes a first extension 41A, a second extension 42A, a third extension 43A, a terminal extension 44A, a first joint 45A, a second joint 46A, a third joint 47A, a first linkage 48A, and a second linkage 49A.

As shown in FIGS. 23 and 24, the first extension 41A includes a part bonded to the source electrode 212A of the first semiconductor element 21A. In the illustrated example, as shown in FIGS. 36 to 39, the first extension 41A includes a bonding portion 411A and an inclined portion 412A. The bonding portion 411A is electrically connected and bonded to the source electrode 212A by the conductive bonding material 93. The inclined portion 412A is joined to the bonding portion 411A and extends from the bonding portion 411A toward the one side in the z-direction and toward the left in the x-direction in the drawing.

As shown in FIGS. 23 and 24, the second extension 42A includes a part bonded to the source electrode 222A of the second semiconductor element 22A. In the illustrated example, as shown in FIGS. 36 to 39, the second extension 42A includes a bonding portion 421A and an inclined portion 422A. The bonding portion 421A is electrically connected and bonded to the source electrode 222A by the conductive bonding material 93. The inclined portion 422A is joined to the bonding portion 421A and extends from the bonding portion 421A toward the one side in the z-direction and leftward in the x-direction in the drawing.

As shown in FIGS. 23 and 24, the third extension 43A includes a part bonded to the source electrode 232A of the third semiconductor element 23A. In the illustrated example, as shown in FIGS. 36 to 39, the third extension 43A includes a bonding portion 431A and an inclined portion 432A. The bonding portion 431A is electrically connected and bonded to the source electrode 232A by the conductive bonding material 93. The inclined portion 432A is joined to the bonding portion 431A and extends from the bonding portion 431A toward the one side in the z-direction and leftward in the x-direction in the drawing.

As shown in FIGS. 23, 24, and 36 to 39, the terminal extension 44A is electrically connected to the first source sense terminal 11E and includes a part bonded to the bonding portion 12F of the fifth lead 1E. In the illustrated example, the terminal extension 44A includes a bonding portion 441A and an inclined portion 442A. The bonding portion 441A is electrically connected and bonded to the bonding portion 12F by the conductive bonding material 93. The inclined portion 442A is joined to the bonding portion 441A and extends from the bonding portion 441A toward the one side in the z-direction and toward the other side in the y-direction.

As shown in FIGS. 23, 24, and 36 to 39, the first joint 45A joins the first extension 41A and the second extension 42A. In the illustrated example, the first joint 45A joins an end of the inclined portion 412A of the first extension 41A and an end of the inclined portion 422A of the second extension 42A. The first joint 45A extends in the y-direction. The first joint 45A is located at the one side of the bonding portion 411A and the bonding portion 421A in the z-direction.

As shown in FIGS. 23, 24, and 36 to 39, the second joint 46A joins the second extension 42A and the third extension 43A. In the illustrated example, the second joint 46A joins an end of the inclined portion 422A of the second extension 42A and an end of the inclined portion 432A of the third extension 43A. The second joint 46A extends in the y-direction. The first joint 45A and the second joint 46A overlap each other as viewed in the y-direction. The second joint 46A is located at the one side of the bonding portion 421A and the bonding portion 431A in the z-direction.

As shown in FIGS. 23, 24, and 36 to 39, the third joint 47A is disposed between the third extension 43A and the terminal extension 44A. In the present embodiment, the third joint 47A extends in the y-direction. The third joint 47A is located separate from the first joint 45A and the second joint 46A toward the left in the x-direction in the drawing. The third joint 47A is located at substantially the same position in the z-direction as the first joint 45A and the second joint 46A. In the illustrated example, the first joint 45A and the second joint 46A are disposed parallel to the third joint 47A over the full length of the first joint 45A and the second joint 46A. The third joint 47A is greater in the dimension in the x-direction than the first joint 45A and the second joint 46A.

As shown in FIGS. 23, 24, and 36 to 39, the first linkage 48A is joined to an other-side portion of the second joint 46A in the y-direction and an other-side portion of the third joint 47A in the y-direction. The first linkage 48A extends in the x-direction. The first linkage 48A is located at substantially the same position in the z-direction as the first joint 45A, the second joint 46A, and the third joint 47A.

As shown in FIGS. 23, 24, and 36 to 39, the second linkage 49A is joined to a one-side portion of the third joint 47A in the y-direction and an other-side portion of the inclined portion 442A of the terminal extension 44A in the y-direction. The first linkage 48A extends in the x-direction. The first linkage 48A is located at substantially the same position in the z-direction as the first joint 45A, the second joint 46A, and the third joint 47A.

The second conduction member 4B electrically connects the source electrode 212B of the first semiconductor element 21B, the source electrode 222B of the second semiconductor element 22B, the source electrode 232B of the third semiconductor element 23B, and the second source sense terminal 11G of the seventh lead 1G to each other. As shown in FIGS. 40 to 43, in the present embodiment, the second conduction member 4B includes a first extension 41B, a second extension 42B, a third extension 43B, a terminal extension 44B, a first joint 45B, a second joint 46B, a third joint 47B, a first linkage 48B, and a second linkage 49B.

As shown in FIGS. 23 and 24, the first extension 41B includes a part bonded to the source electrode 212B of the first semiconductor element 21B. In the illustrated example, as shown in FIGS. 40 to 43, the first extension 41B includes a bonding portion 411B and an inclined portion 412B. The bonding portion 411B is electrically connected and bonded to the source electrode 212B by the conductive bonding material 93. The inclined portion 412B is joined to the bonding portion 411B and extends from the bonding portion 411B toward the one side in the z-direction and toward the right in the x-direction in the drawing.

As shown in FIGS. 23 and 24, the second extension 42B includes a part bonded to the source electrode 222B of the second semiconductor element 22B. In the illustrated example, as shown in FIGS. 40 to 43, the second extension 42B includes a bonding portion 421B and an inclined portion 422B. The bonding portion 421B is electrically connected and bonded to the source electrode 222B by the conductive bonding material 93. The inclined portion 422B is joined to the bonding portion 421B and extends from the bonding portion 421B toward the one side in the z-direction and toward the right in the x-direction in the drawing.

As shown in FIGS. 23 and 24, the third extension 43B includes a part bonded to the source electrode 232B of the third semiconductor element 23B. In the illustrated example, as shown in FIGS. 40 to 43, the third extension 43B includes a bonding portion 431B and an inclined portion 432B. The bonding portion 431B is electrically connected and bonded to the source electrode 232B by the conductive bonding material 93. The inclined portion 432B is joined to the bonding portion 431B and extends from the bonding portion 431B toward the one side in the z-direction and rightward in the x-direction in the drawing.

As shown in FIGS. 23, 24, and 40 to 43, the terminal extension 44B is electrically connected to the second source sense terminal 11G and includes a part bonded to the bonding portion 12G of the seventh lead 1G. In the illustrated example, the terminal extension 44B includes a bonding portion 441B and an inclined portion 442B. The bonding portion 441B is electrically connected and bonded to the bonding portion 12G by the conductive bonding material 93. The inclined portion 442B is joined to the bonding portion 441B and extends from the bonding portion 441B toward the one side in the z-direction and toward the other side in the y-direction.

As shown in FIGS. 23, 24, and 40 to 43, the first joint 45B joins the first extension 41B and the second extension 42B. In the illustrated example, the first joint 45B joins an end of the inclined portion 412B of the first extension 41B and an end of the inclined portion 422B of the second extension 42B. The first joint 45B extends in the y-direction. The first joint 45B is located at the one side of the bonding portion 411B and the bonding portion 421B in the z-direction.

As shown in FIGS. 23, 24, and 40 to 43, the second joint 46B joins the second extension 42B and the third extension 43B. In the illustrated example, the second joint 46B joins an end of the inclined portion 422B of the second extension 42B and an end of the inclined portion 432B of the third extension 43B. The second joint 46B extends in the y-direction. The first joint 45B and the second joint 46B overlap each other as viewed in the y-direction. The second joint 46B is located at the one side of the bonding portion 421B and the bonding portion 431B in the z-direction.

As shown in FIGS. 23, 24, and 40 to 43, the third joint 47B is disposed between the third extension 43B and the terminal extension 44B. In the present embodiment, the third joint 47B extends in the y-direction. The third joint 47B is located separate from the first joint 45B and the second joint 46B toward the right in the x-direction in the drawing. The third joint 47B is located at substantially the same position in the z-direction as the first joint 45B and the second joint 46B. In the illustrated example, the first joint 45B and the second joint 46B are disposed parallel to the third joint 47B over the full length of the first joint 45B and the second joint 46B. The third joint 47B is greater in the dimension in the x-direction than the first joint 45B and the second joint 46B.

As shown in FIGS. 23, 24, and 40 to 43, the first linkage 48B is joined to an other-side portion of the second joint 46B in the y-direction and an other-side portion of the third joint 47B in the y-direction. The first linkage 48B extends in the x-direction. The first linkage 48B is located at substantially the same position in the z-direction as the first joint 45B, the second joint 46B, and the third joint 47B.

As shown in FIGS. 23, 24, and 40 to 43, the second linkage 49B is joined to a one-side portion of the third joint 47B in the y-direction and an other-side portion of the inclined portion 442B of the terminal extension 44B in the y-direction. The first linkage 48B extends in the x-direction. The first linkage 48B is located at substantially the same position in the z-direction as the first joint 45B, the second joint 46B, and the third joint 47B.

Third Conduction Member 5

The third conduction member 5 electrically connects the source electrode 212A of the first semiconductor element 21A, the source electrode 222A of the second semiconductor element 22A, and the source electrode 232A of the third semiconductor element 23A to the negative power input terminal 11C. The third conduction member 5 is formed from metal such as Cu, Ni, or Fe and obtained, for example, by cutting or bending a metal plate material.

As shown in FIGS. 23 to 25 and 44 to 47, in the present embodiment, the third conduction member 5 includes a first extension 51C, a second extension 52C, a third extension 53C, a terminal extension 54C, and a joint 55C.

As shown in FIGS. 23 and 24, the first extension 51C includes a part bonded to the source electrode 212A of the first semiconductor element 21A. In the illustrated example, as shown in FIGS. 36 to 39, the first extension 51C includes a bonding portion 511C and an inclined portion 512C. The bonding portion 511C is electrically connected and bonded to the source electrode 212A by the conductive bonding material 93. The bonding portion 511C is larger than the bonding portion 411A of the first extension 41A. The inclined portion 512C is joined to the bonding portion 511C and extends from the bonding portion 511C toward the one side in the z-direction and toward the left in the x-direction in the drawing.

As shown in FIGS. 23 and 24, the second extension 52C includes a part bonded to the source electrode 222A of the second semiconductor element 22A. In the illustrated example, as shown in FIGS. 36 to 39, the second extension 52C includes a bonding portion 521C and an inclined portion 522C. The bonding portion 521C is electrically connected and bonded to the source electrode 222A by the conductive bonding material 93. The bonding portion 521C is larger than the bonding portion 421A of the second extension 42A. The inclined portion 522C is joined to the bonding portion 521C and extends from the bonding portion 521C toward the one side in the z-direction and toward the left in the x-direction in the drawing.

As shown in FIGS. 23 and 24, the third extension 53C includes a part bonded to the source electrode 232A of the third semiconductor element 23A. In the illustrated example, as shown in FIGS. 36 to 39, the third extension 53C includes a bonding portion 531C and an inclined portion 532C. The bonding portion 531C is electrically connected and bonded to the source electrode 232A by the conductive bonding material 93. The bonding portion 531C is larger than the bonding portion 431A of the third extension 43A. The inclined portion 532C is joined to the bonding portion 531C and extends from the bonding portion 531C toward the one side in the z-direction and toward the left in the x-direction in the drawing.

As shown in FIGS. 23, 24, and 44 to 47, the terminal extension 54C is electrically connected to the negative power input terminal 11C and includes a part bonded to the bonding portion 12C of the third lead 1C. In the illustrated example, the terminal extension 54C includes a bonding portion 541C and an inclined portion 542C. The bonding portion 541C is electrically connected and bonded to the bonding portion 12C by the conductive bonding material 93. The inclined portion 542C is joined to the bonding portion 541C and extends from the bonding portion 541C toward the one side in the z-direction and toward the one side in the y-direction.

As shown in FIGS. 23, 24, and 44 to 47, the joint 55C joins the first extension 51C, the second extension 52C, the third extension 53C, and the terminal extension 54C. In the illustrated example, the joint 55C joins an end of the inclined portion 512C of the first extension 51C, an end of the inclined portion 522C of the second extension 52C, an end of the inclined portion 532C of the third extension 53C, and an end of the inclined portion 542C of the terminal extension 54C. The joint 55C extends in the y-direction. The joint 55C is located at the one side of the bonding portion 511C, the bonding portion 521C, the bonding portion 531C, and the bonding portion 541C in the z-direction. The joint 55C is greater in the dimension in the x-direction than the third joint 37A, the third joint 37B, the third joint 47A, and the third joint 47B. The joint 55C overlaps part of the island portion 10A and part of the island portion 10B as viewed in the z-direction. In the illustrated example, the joint 55C is located at the one side of the third joint 37A, the third joint 37B, the third joint 47A, and the third joint 47B in the z-direction.

Fourth Conduction Member 6

The fourth conduction member 6 electrically connects the source electrode 212B of the first semiconductor element 21B, the source electrode 222B of the second semiconductor element 22B, and the source electrode 232B of the third semiconductor element 23B to the drain electrode 213A of the first semiconductor element 21A, the drain electrode 223A of the second semiconductor element 22A, and the drain electrode 233A of the third semiconductor element 23A by the island portion 10A. The fourth conduction member 6 is formed from metal such as Cu, Ni, or Fe and obtained, for example, by cutting or bending a metal plate material.

In the present embodiment, the fourth conduction member 6 includes a first extension 61C, a second extension 62C, a third extension 63C, a linkage extension 64C, and a joint 65C.

As shown in FIGS. 23 to 26, the first extension 61C includes a part bonded to the source electrode 212B of the first semiconductor element 21B. In the illustrated example, as shown in FIGS. 48 to 51, the first extension 61C includes a bonding portion 611C and an inclined portion 612C. The bonding portion 611C is electrically connected and bonded to the source electrode 212B by the conductive bonding material 93. The bonding portion 611C is larger than the bonding portion 411B of the first extension 41B. The inclined portion 612C is joined to the bonding portion 611C and extends from the bonding portion 611C toward the one side in the z-direction and rightward in the x-direction in the drawing.

As shown in FIGS. 23 to 26, the second extension 62C includes a part bonded to the source electrode 222B of the second semiconductor element 22B. In the illustrated example, as shown in FIGS. 48 to 51, the second extension 62C includes a bonding portion 621C and an inclined portion 622C. The bonding portion 621C is electrically connected and bonded to the source electrode 222B by the conductive bonding material 93. The bonding portion 621C is larger than the bonding portion 421B of the second extension 42B. The inclined portion 622C is joined to the bonding portion 621C and extends from the bonding portion 621C toward the one side in the z-direction and rightward in the x-direction in the drawing.

As shown in FIGS. 23 to 26, the third extension 63C includes a part bonded to the source electrode 232B of the third semiconductor element 23B. In the illustrated example, as shown in FIGS. 48 to 51, the third extension 63C includes a bonding portion 631C and an inclined portion 632C. The bonding portion 631C is electrically connected and bonded to the source electrode 232B by the conductive bonding material 93. The bonding portion 631C is larger than the bonding portion 431B of the third extension 43B. The inclined portion 632C is joined to the bonding portion 631C and extends from the bonding portion 631C toward the one side in the z-direction and toward the right in the x-direction in the drawing.

As shown in FIGS. 23 to 26 and 48 to 51, the linkage extension 64C is electrically connected to the drain electrode 213A of the first semiconductor element 21A, the drain electrode 223A of the second semiconductor element 22A, and the drain electrode 233A of the third semiconductor element 23A and includes a part bonded to the island portion 10A. In the illustrated example, the linkage extension 64C includes a bonding portion 641C and an inclined portion 642C. The bonding portion 641C is electrically connected and joined by the conductive bonding material 93 to a part of the island portion 10A located at the left side of the first semiconductor element 21A, the second semiconductor element 22A, and the third semiconductor element 23A in the x-direction in the drawing. In the illustrated example, the bonding portion 641C is belt-shaped and extends in the y-direction and overlaps the first semiconductor element 21A, the second semiconductor element 22A, and the third semiconductor element 23A as viewed in the x-direction. The inclined portion 642C is joined to the bonding portion 641C and extends from the bonding portion 641C toward the one side in the z-direction and toward the left in the x-direction in the drawing. In the illustrated example, the linkage extension 64C overlaps the joint 55C of the third conduction member 5 as viewed in the z-direction.

As shown in FIGS. 23 to 26 and 48 to 51, the joint 65C joins the first extension 61C, the second extension 62C, and the third extension 63C to the linkage extension 64C. In the illustrated example, the joint 65C joins an end of the inclined portion 612C of the first extension 61C, an end of the inclined portion 622C of the second extension 62C, an end of the inclined portion 632C of the third extension 63C, and an end of the inclined portion 642C of the linkage extension 64C. The joint 65C extends in the y-direction. The joint 65C is located at the one side of the bonding portion 611C and the bonding portion 621C in the z-direction. The joint 65C is located at the other side of the joint 55C of the third conduction member 5 in the z-direction. In the illustrated example, the joint 65C overlaps the joint 55C of the third conduction member 5 as viewed in the z-direction.

Encapsulation Resin 7

The encapsulation resin 7 covers part of each of the leads 1A to 1G, the semiconductor elements 21A, 22A, 23A, 21B, 22B, and 23B, the first conduction members 3A and 3B, the second conduction members 4A and 4B, the third conduction member 5, and the fourth conduction member 6. The encapsulation resin 7 is formed from an electrically-insulative resin and is formed from, for example, a black epoxy resin. The encapsulation resin 7 is not limited to a specific shape. In the present embodiment as shown in FIGS. 21 and 22, the encapsulation resin 7 includes a main surface 71C, a back surface 72C, and two first side surfaces 73C, and two second side surfaces 74C and is rectangular as viewed in the z-direction.

The main surface 71C faces toward the one side in the z-direction. The back surface 72C faces toward the other side in the z-direction. In the present embodiment, the island portion 10A, the island portion 10B, the fourth lead 1D, the fifth lead 1E, the sixth lead 1F, and the seventh lead 1G are exposed from the back surface 72C.

The two first side surfaces 73C face in opposite directions in the y-direction. The second lead 1B and the third lead 1C project from one of the first side surfaces 73C located at the other side in the y-direction. The first lead 1A, the fourth lead 1D, the fifth lead 1E, the sixth lead 1F, and the seventh lead 1G project from one of the first side surfaces 73C located at the one side in the y-direction.

The two second side surfaces 74C face in opposite directions in the x-direction.

The operation of the semiconductor device A1 will now be described.

According to the present embodiment, as shown in FIG. 24, the conduction path between the first gate terminal 11D and the gate electrode 211A of the first semiconductor element 21A includes the first joint 35A and the first joint 35A and the third joint 37A, through which the current flows in opposite directions in the y-direction. The conduction path including such a part cancels out self inductance caused by a sudden increase or decrease in current, thereby reducing inductance. Also, the conduction path between the first gate terminal 11D and the gate electrode 221A of the second semiconductor element 22A includes the first joint 35A and the third joint 37A, through which the current flows in opposite directions in the y-direction. This part also cancels out the self inductance, thereby reducing inductance. Thus, the control voltage is further evenly applied to the first semiconductor element 21A, the second semiconductor element 22A, and the third semiconductor element 23A.

Each of the first joint 35A, the second joint 36A, and third joint 37A linearly extends in the y-direction. This further ensures the cancelling out of self inductance. Moreover, the structure of the first joint 35A and the second joint 36A that are parallel to the third joint 37A over the full length of the first joint 35A and the second joint 36A is suitable for cancelling out self inductance.

The third joint 37A is located separate from the first joint 35A and the second joint 36A in the x-direction. This avoids an excess increase in the size of the semiconductor device A1 in the z-direction.

The advantages described above are also obtained by the first conduction member 3B, the second conduction member 4A, and the second conduction member 4B.

FIGS. 52 to 74 show another embodiment of the present disclosure. In the drawings, the same reference characters are given to those elements that are the same as or similar to the corresponding elements of the embodiments described above.

Eighth Embodiment

FIGS. 52 to 68 show an eighth embodiment of a semiconductor device according to the present disclosure. The present embodiment of a semiconductor device A2 differs from the above embodiments mainly in the structure of the first conduction members 3A and 3B and the second conduction members 4A and 4B.

First Conduction Members 3A and 3B

As shown in FIGS. 52 to 56, in the present embodiment, the first conduction member 3A includes a first extension 31A, a second extension 32A, a third extension 33A, a terminal extension 34A, a first joint 35A, a second joint 36A, a linkage part 3aA, a linkage part 3bA, a joint 3cA, a linkage part 3dA, a joint 3eA, and a second linkage 39A. In the illustrated example, as viewed in the z-direction, all of the parts of the first conduction member 3A are substantially equal in width (dimension in the x-direction or dimension in the y-direction).

The first extension 31A, the second extension 32A, the third extension 33A, the terminal extension 34A, the first joint 35A, and the second joint 36A have the same have the same structure as those of the semiconductor device A1 described above.

The linkage part 3aA extends from the one-side portion of the first joint 35A in the y-direction toward the right in the x-direction in the drawing. The linkage part 3bA extends from the other-side portion of the second joint 36A in the y-direction toward the right in the x-direction in the drawing. The joint 3cA joins an end of the linkage part 3aA in the x-direction to an end of the linkage part 3bA in the x-direction. The linkage part 3dA extends from a central portion of the joint 3cA in the y-direction toward the right in the x-direction in the drawing. The joint 3eA extends from an end of the linkage part 3dA in the x-direction toward the one side in the y-direction. The second linkage 39A joins a one-side end of the joint 3eA in the y-direction to an other-side end of the terminal extension 34A in the y-direction. The linkage part 3aA, the linkage part 3bA, the joint 3cA, the linkage part 3dA, the joint 3eA, and the second linkage 39A are located at the one side of the bonding portion 311A, the bonding portion 321A, the bonding portion 331A, and the bonding portion 341A in the z-direction.

As shown in FIGS. 52 and 57 to 60, in the present embodiment, the first conduction member 3B includes a first extension 31B, a second extension 32B, a third extension 33B, a terminal extension 34B, a first joint 35B, a second joint 36B, a linkage part 3aB, a linkage part 3bB, a joint 3cB, a linkage part 3dB, a joint 3eB, and a second linkage 39B. In the illustrated example, as viewed in the z-direction, all of the parts of the first conduction member 3B are substantially equal in width (dimension in the x-direction or dimension in the y-direction).

The first extension 31B, the second extension 32B, the third extension 33B, the terminal extension 34B, the first joint 35B, and the second joint 36B have the same structure as those of the first conduction member 3A in the present embodiment (refer to FIGS. 53 to 56) except that each part extends in the x-direction.

The linkage part 3aB extends from the one-side portion of the first joint 35B in the y-direction toward the left in the x-direction in the drawing. The linkage part 3bB extends from the other-side portion of the second joint 36B in the y-direction toward the left in the x-direction in the drawing. The joint 3cB joins an end of the linkage part 3aB in the x-direction and an end of the linkage part 3bB in the x-direction. The linkage part 3dB extends from a central portion of the joint 3cB in the y-direction toward the left in the x-direction in the drawing. The joint 3eB extends from an end of the linkage part 3dB in the x-direction toward the one side in the y-direction. The second linkage 39B joins a one-side end of the joint 3eB in the y-direction to an other-side end of the terminal extension 34B in the y-direction. The linkage part 3aB, the linkage part 3bB, the joint 3cB, the linkage part 3dB, the joint 3eB, and the second linkage 39B are located at the one side of the bonding portion 311B, the bonding portion 321B, the bonding portion 331B, and the bonding portion 341B in the z-direction.

Second Conduction Members 4A and 4B

As shown in FIGS. 52 and 61 to 64, in the present embodiment, the second conduction member 4A includes a first extension 41A, a second extension 42A, a third extension 43A, a terminal extension 44A, a first joint 45A, a second joint 46A, a linkage part 4aA, a linkage part 4bA, a joint 4cA, a linkage part 4dA, a joint 4eA, and a second linkage 49A. In the illustrated example, as viewed in the z-direction, all of the parts of the second conduction member 4A are substantially equal in width (dimension in the x-direction or dimension in the y-direction).

The first extension 41A, the second extension 42A, the third extension 43A, the terminal extension 44A, the first joint 45A, and the second joint 46A have the same structure as the those of the first conduction member 3B of the present embodiment described above (refer to FIGS. 57 to 60).

The linkage part 4aA extends from the one-side portion of the first joint 45A in the y-direction toward the left in the x-direction in the drawing. The linkage part 4bA extends from the other-side portion of the second joint 46A in the y-direction toward the left in the x-direction in the drawing. The joint 4cA joins an end of the linkage part 4aA in the x-direction and an end of the linkage part 4bA in the x-direction. The linkage part 4dA extends from a central portion of the joint 4cA in the y-direction toward the left in the x-direction in the drawing. The joint 4eA extends from an end of the linkage part 4dA in the x-direction toward the one side in the y-direction. The second linkage 49A joins a one-side end of the joint 4eA in the y-direction to an other-side end of the terminal extension 44A in the y-direction. The linkage part 4aA, the linkage part 4bA, the joint 4cA, the linkage part 4dA, the joint 4eA, and the second linkage 49A are located at the one side of the bonding portion 411A, the bonding portion 421A, the bonding portion 431A, and the bonding portion 441A in the z-direction.

As shown in FIGS. 52 and 65 to 68, in the present embodiment, the second conduction member 4B includes a first extension 41B, a second extension 42B, a third extension 43B, a terminal extension 44B, a first joint 45B, a second joint 46B, a linkage part 4aB, a linkage part 4bB, a joint 4cB, a linkage part 4dB, a joint 4eB, and a second linkage 49B. In the illustrated example, as viewed in the z-direction, all of the parts of the second conduction member 4B are substantially equal in width (dimension in the x-direction or dimension in the y-direction).

The first extension 41B, the second extension 42B, the third extension 43B, the terminal extension 44B, the first joint 45B, and the second joint 46B have the same structure as those of the first conduction member 3A in the present embodiment (refer to FIGS. 53 to 56).

The linkage part 4aB extends from the one-side portion of the first joint 45B in the y-direction toward the right in the x-direction in the drawing. The linkage part 4bB extends from the other-side portion of the second joint 46B in the y-direction toward the right in the x-direction in the drawing. The joint 4cB joins an end of the linkage part 4aB in the x-direction and an end of the linkage part 4bB in the x-direction. The linkage part 4dB extends from a central portion of the joint 4cB in the y-direction toward the right in the x-direction in the drawing. The joint 4eB extends from an end of the linkage part 4dB in the x-direction toward the one side in the y-direction. The second linkage 49B joins a one-side end of the joint 4eB in the y-direction to an other-side end of the terminal extension 44B in the y-direction. The linkage part 4aB, the linkage part 4bB, the joint 4cB, the linkage part 4dB, the joint 4eB, and the second linkage 49B are located at the one side of the bonding portion 411B, the bonding portion 421B, the bonding portion 431B, and the bonding portion 441B in the z-direction.

Figure 52:
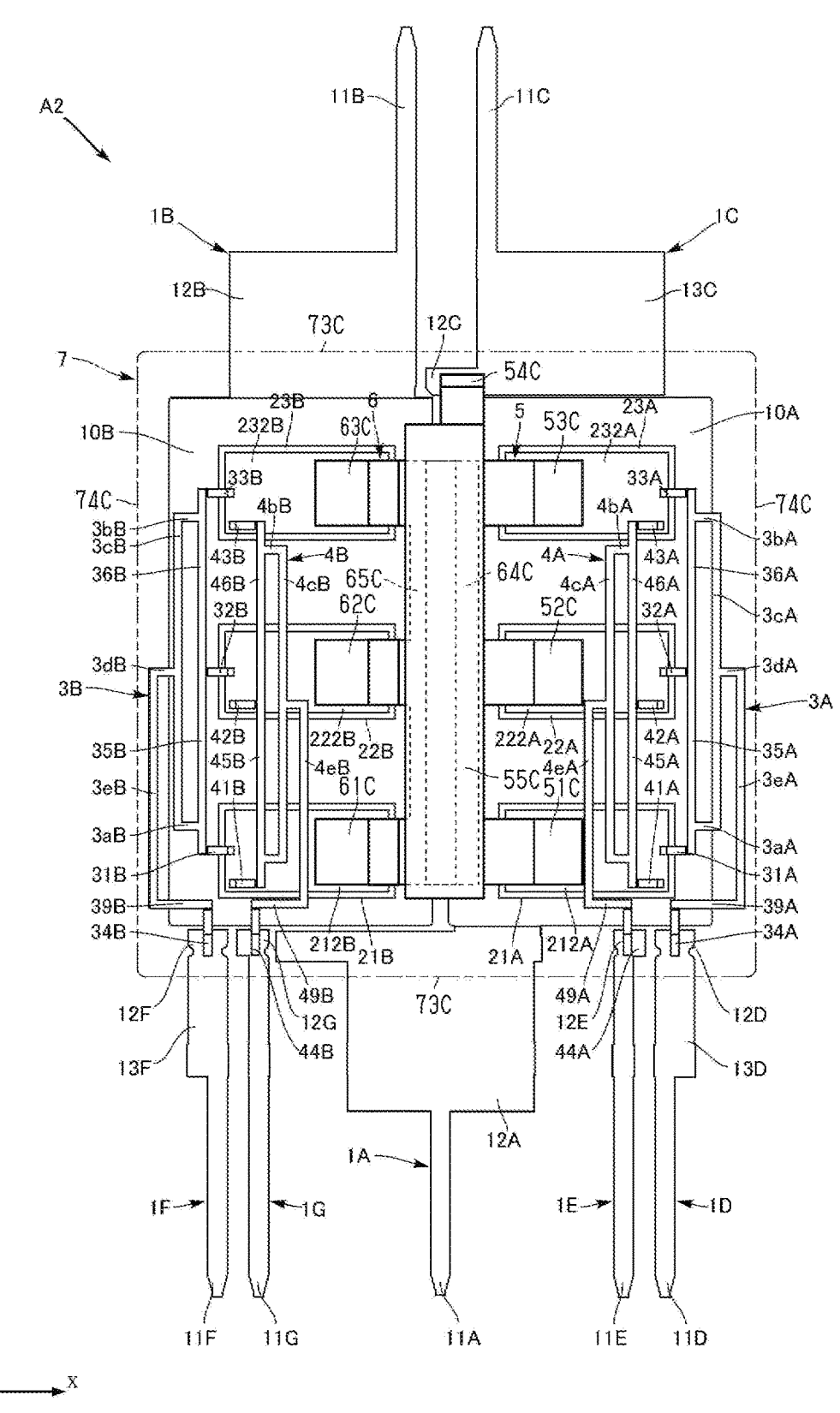
FIG. 52 is a plan view showing part of a semiconductor device in an eighth embodiment of the present disclosure.
Figure 53:
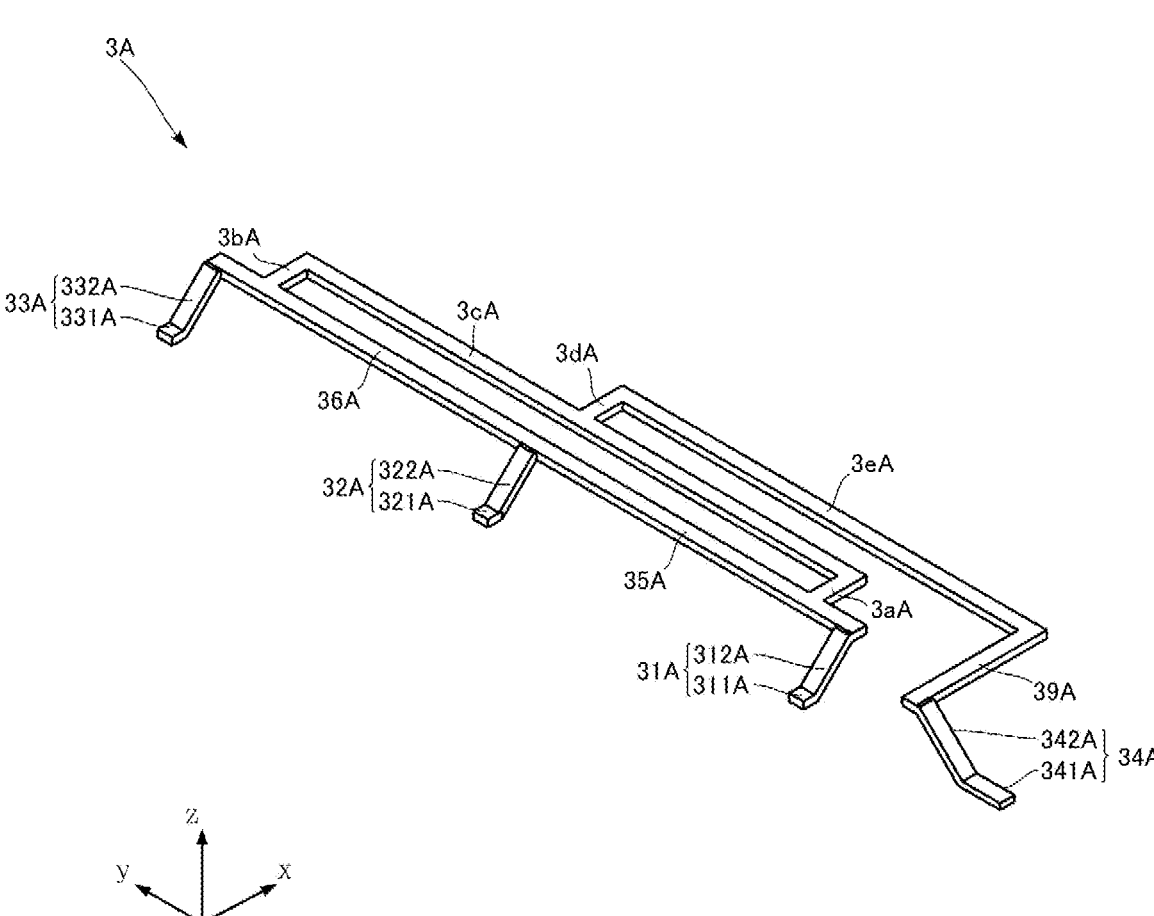
FIG. 53 is a perspective view showing a first conduction member of the semiconductor device in the eighth embodiment of the present disclosure.
Figure 54:
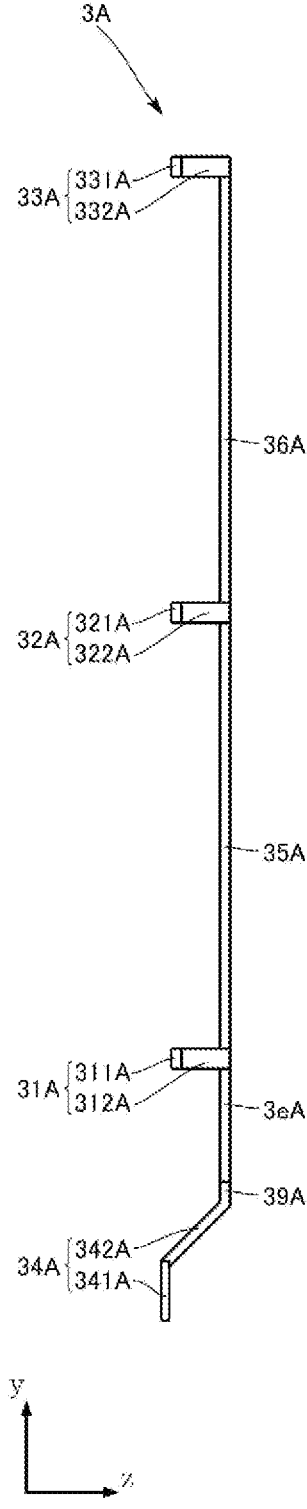
FIG. 54 is a front view showing the first conduction member of the semiconductor device in the eighth embodiment of the present disclosure.
Figure 55:
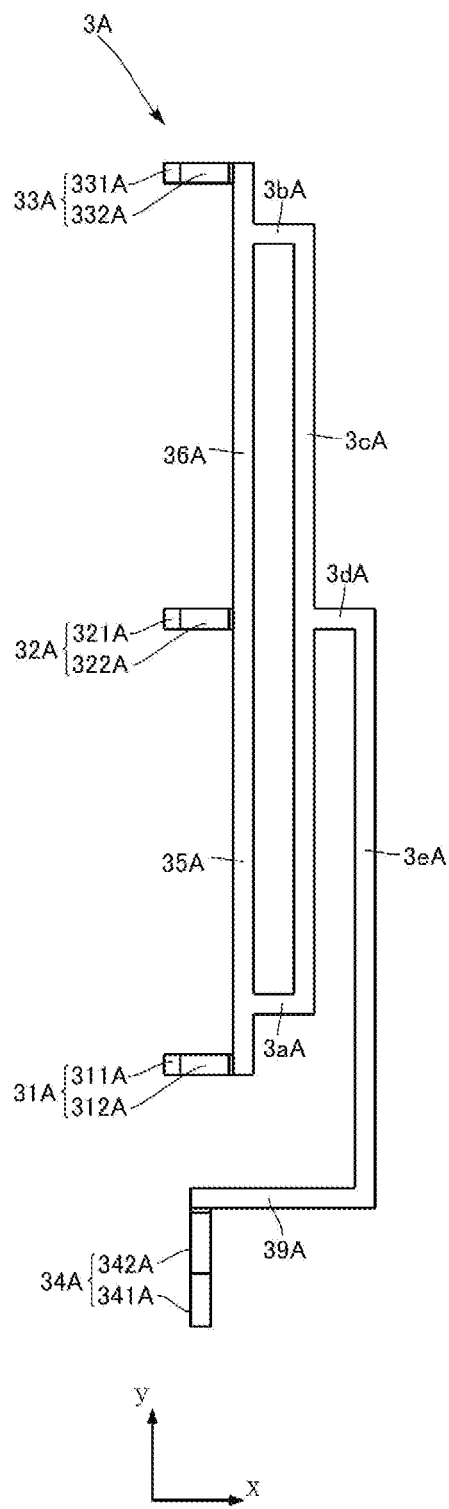
FIG. 55 is a plan view showing the first conduction member of the semiconductor device in the eighth embodiment of the present disclosure.
Figure 56:
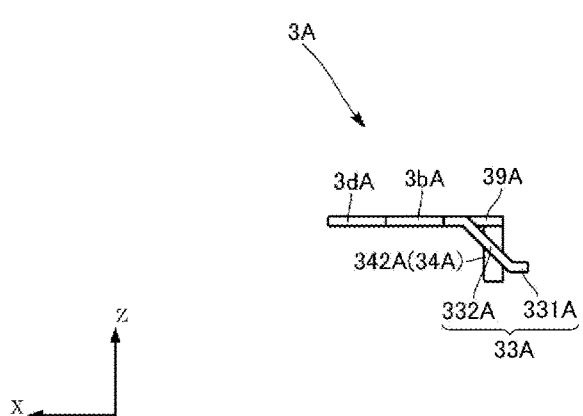
FIG. 56 is a side view showing the first conduction member of the semiconductor device in the eighth embodiment of the present disclosure.
Figure 57:
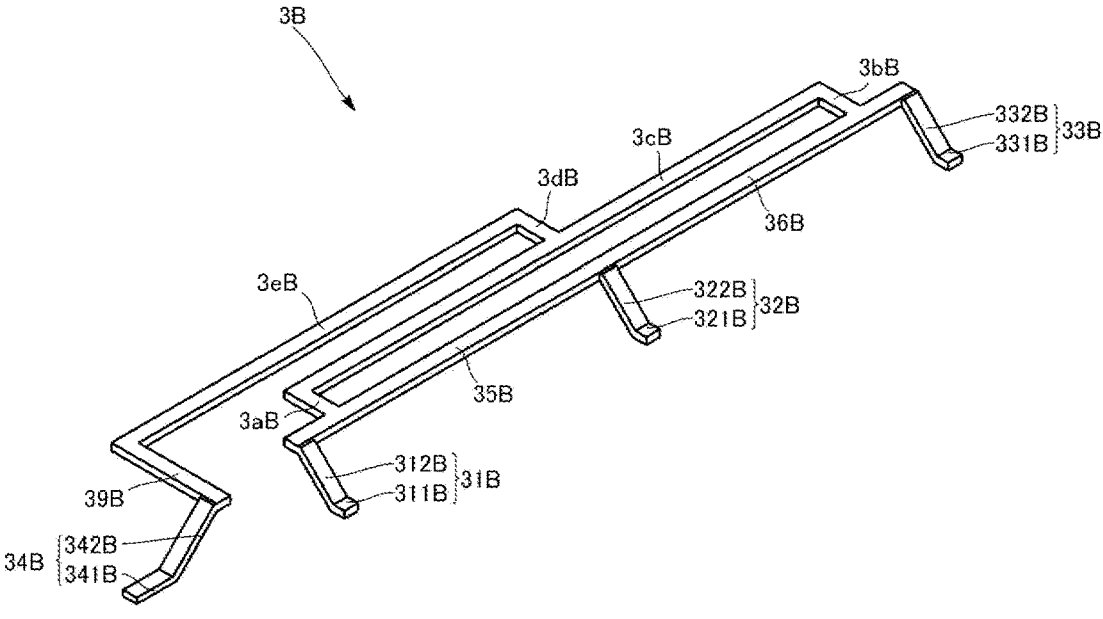
FIG. 57 is a perspective view showing the first conduction member of the semiconductor device in the eighth embodiment of the present disclosure.
Figure 57:
Figure 58:
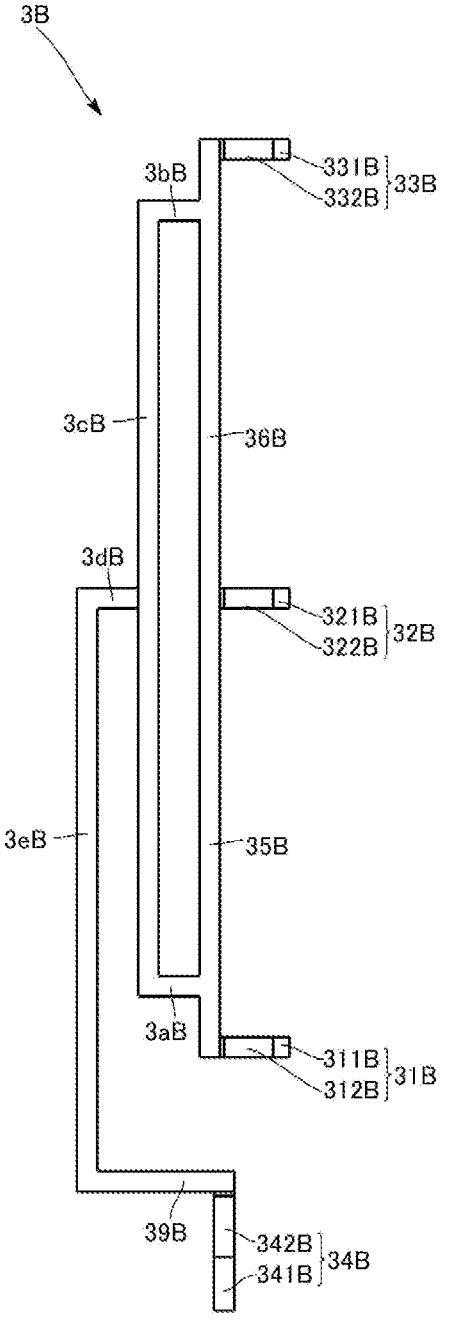
FIG. 58 is a plan view showing the first conduction member of the semiconductor device in the eighth embodiment of the present disclosure.
Figure 58:
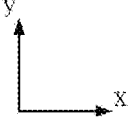
Figure 59:
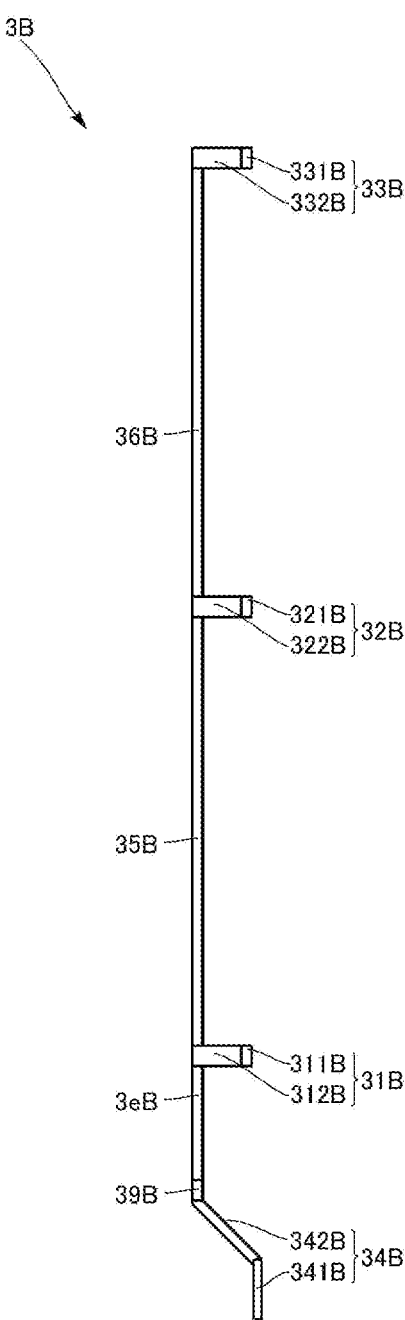
FIG. 59 is a front view showing the first conduction member of the semiconductor device in the eighth embodiment of the present disclosure.
Figure 59:
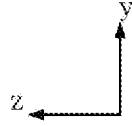
Figure 60:
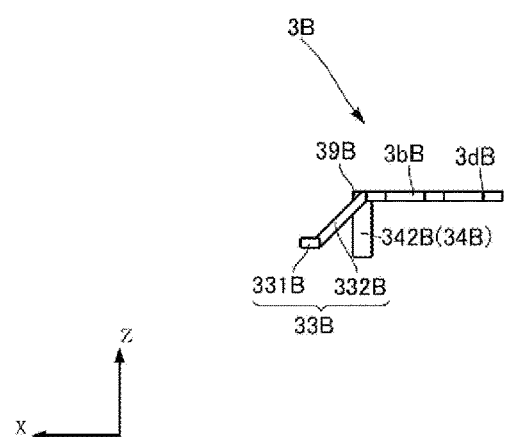
FIG. 60 is a side view showing the first conduction member of the semiconductor device in the eighth embodiment of the present disclosure.
Figure 61:
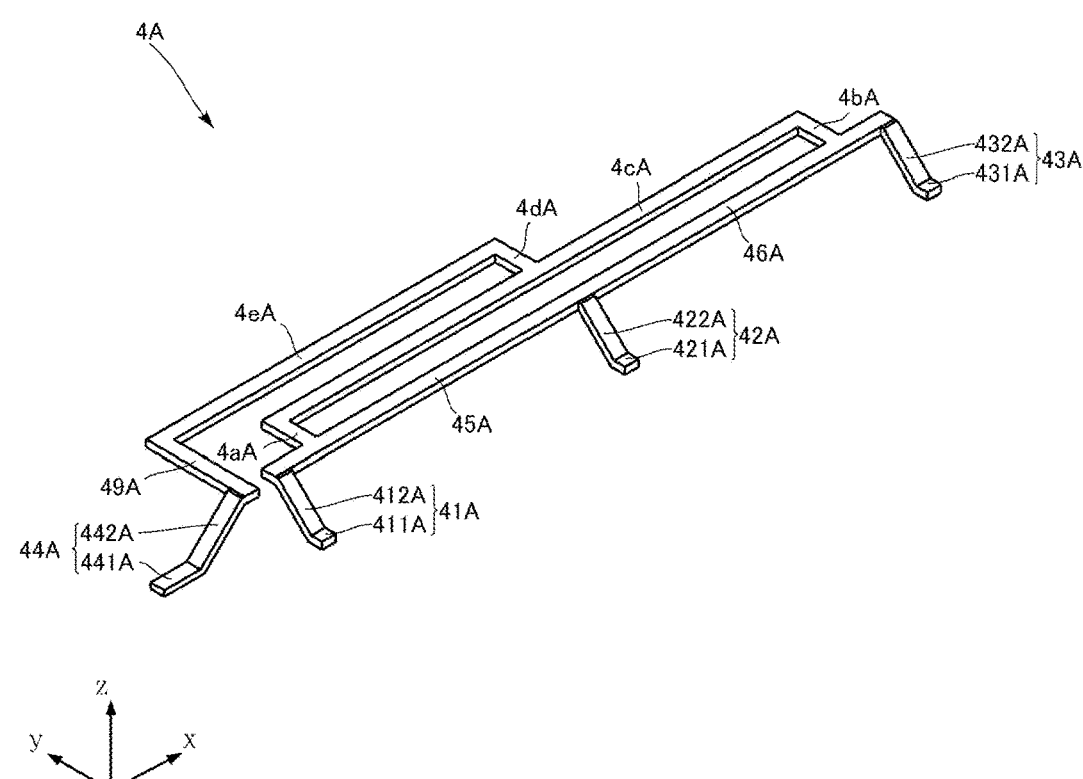
FIG. 61 is a perspective view showing a second conduction member of the semiconductor device in the eighth embodiment of the present disclosure.
Figure 62:
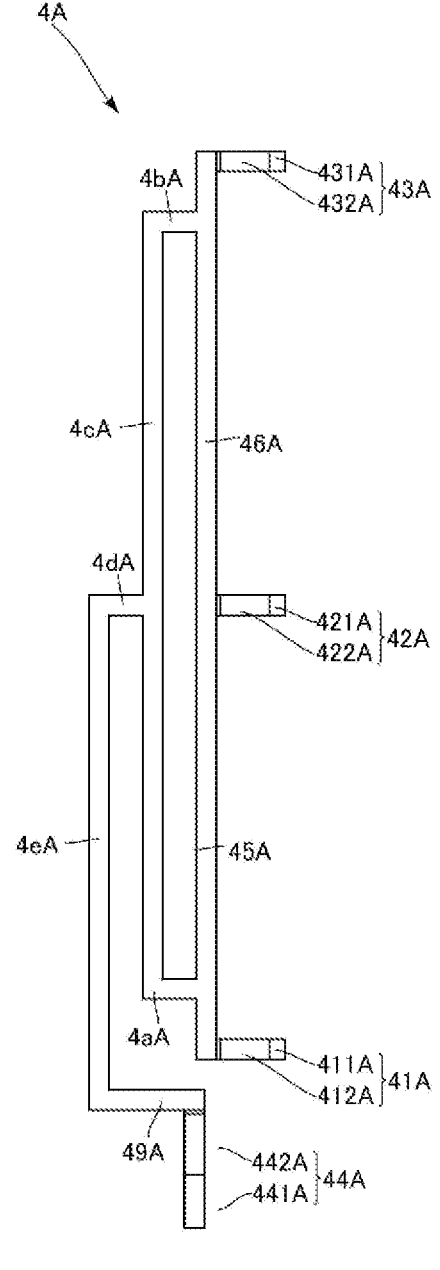
FIG. 62 is a plan view showing the second conduction member of the semiconductor device in the eighth embodiment of the present disclosure.
Figure 62:
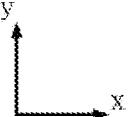
Figure 63:
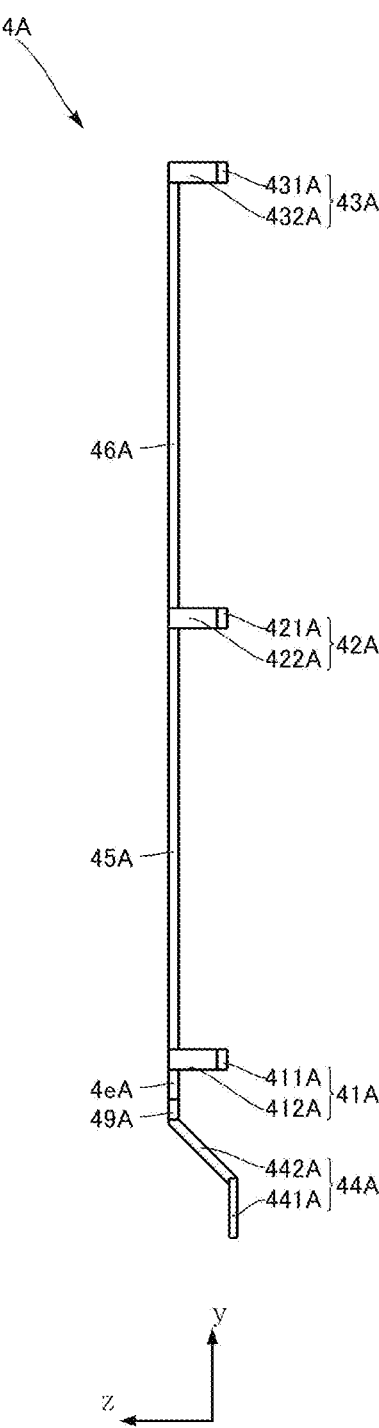
FIG. 63 is a front view showing the second conduction member of the semiconductor device in the eighth embodiment of the present disclosure.
Figure 64:
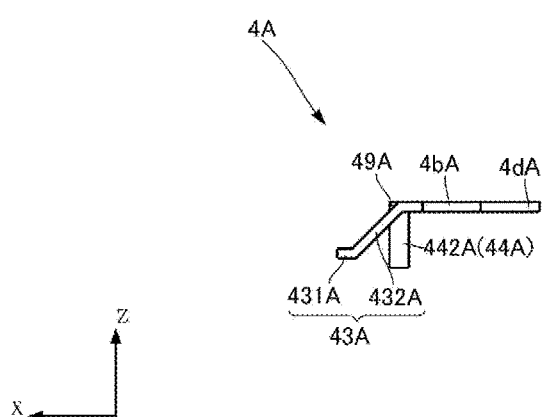
FIG. 64 is a side view showing the second conduction member of the semiconductor device in the eighth embodiment of the present disclosure.
Figure 65:
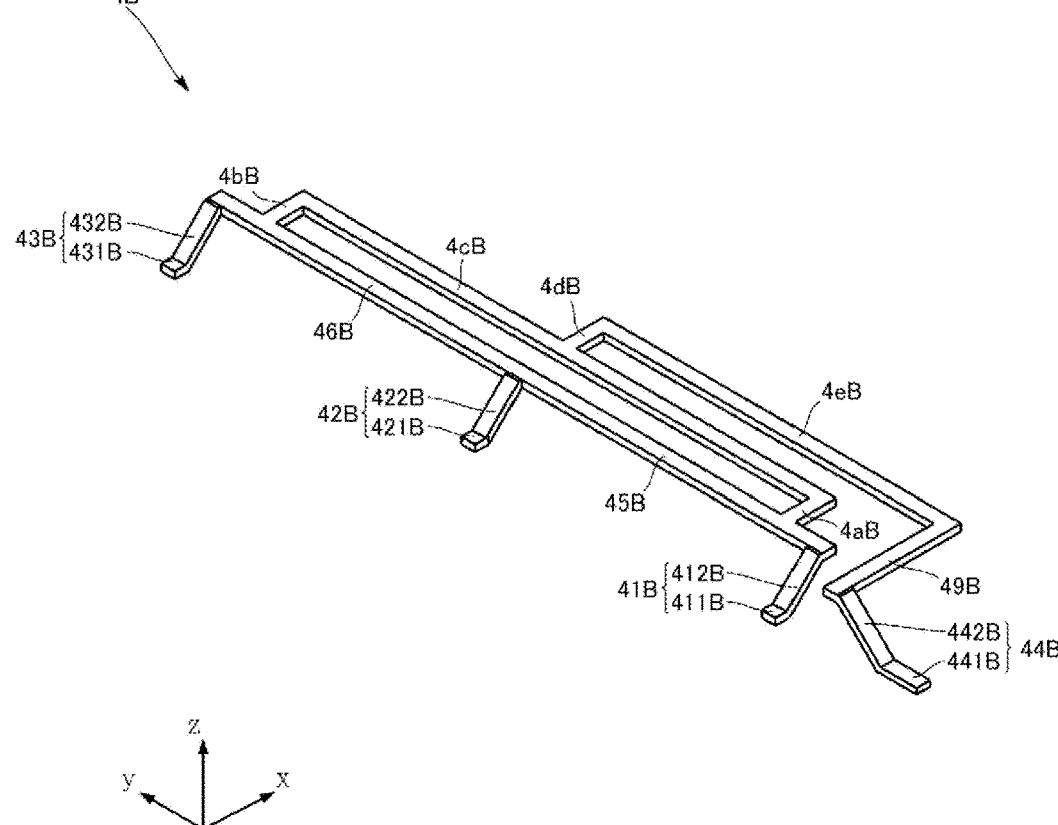
FIG. 65 is a perspective view showing the second conduction member of the semiconductor device in the eighth embodiment of the present disclosure.
Figure 66:
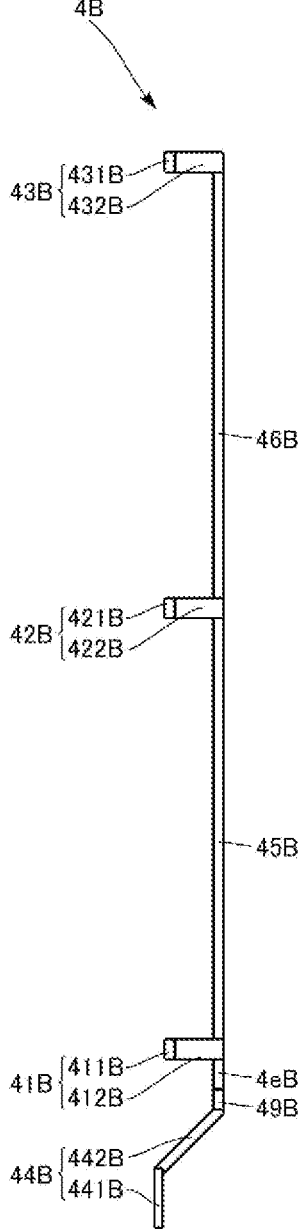
FIG. 66 is a front view showing the second conduction member of the semiconductor device in the eighth embodiment of the present disclosure.
Figure 66:
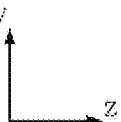
Figure 67:
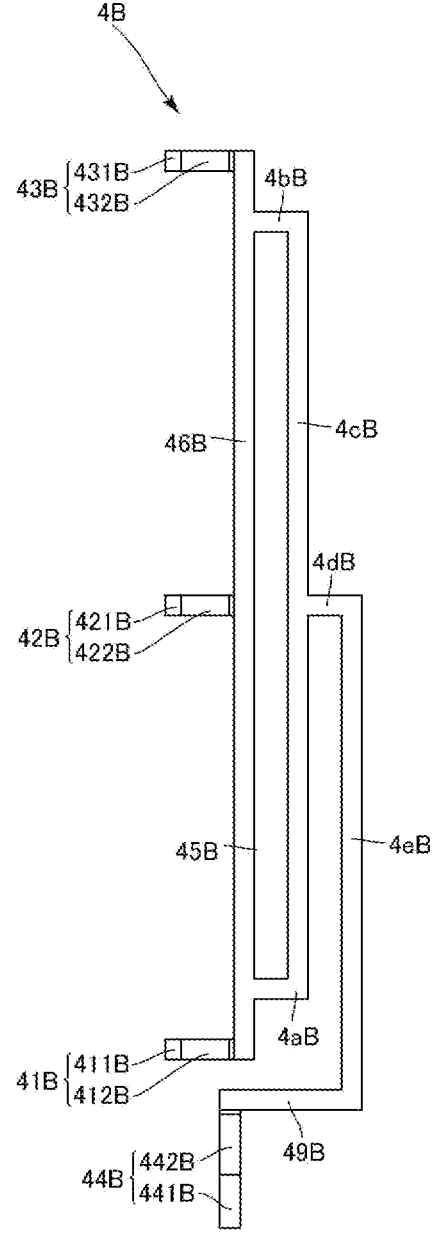
FIG. 67 is a plan view showing the second conduction member of the semiconductor device in the eighth embodiment of the present disclosure.
Figure 67:
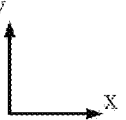
Figure 68:
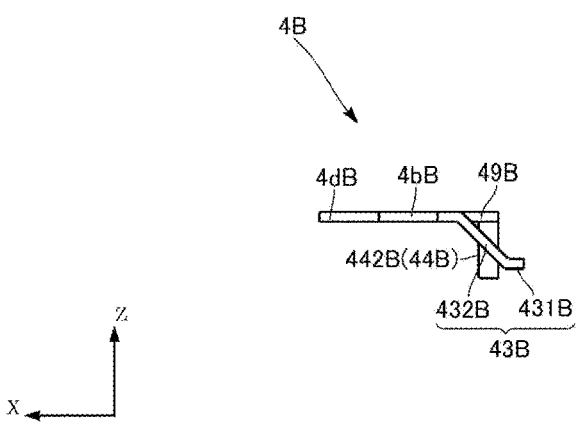
FIG. 68 is a side view showing the second conduction member of the semiconductor device in the eighth embodiment of the present disclosure.

According to the present embodiment, as shown in FIG. 52, the conduction path extending from the gate electrode 211A of the first semiconductor element 21A (refer to FIG. 27) to the first gate terminal 11D includes a path extending through part of the first joint 35A, the linkage part 3aA, and part of the joint 3cA, and a path extending through the first joint 35A, the second joint 36A, the linkage part 3bA, and part of the joint 3cA so that the two paths are connected in parallel. Also, the conduction path extending from the gate electrode 221A of the second semiconductor element 22A (refer to FIG. 27) to the first gate terminal 11D includes a path extending through the first joint 35A, the linkage part 3aA, and part of the joint 3cA and a path extending through the second joint 36A, the linkage part 3bA, and part of the joint 3cA so that the paths are connected in parallel. Also, the conduction path extending from the gate electrode 231A of the third semiconductor element 23A (refer to FIG. 27) to the first gate terminal 11D includes a path extending through part of the second joint 36A, the linkage part 3bA, and part of the joint 3cA and a path extending through the second joint 36A, the first joint 35A, the linkage part 3aA, and part of the joint 3cA so that the paths are connected in parallel. This decreases differences in the resistance value between the conductive paths extending from the gate electrode 211A, the gate electrode 221A, and the gate electrode 231A to the first gate terminal 11D. Thus, the control voltage is further evenly applied to the first semiconductor element 21A, the second semiconductor element 22A, and the third semiconductor element 23A.

The advantages described above are also obtained by the first conduction member 3B, the second conduction member 4A, and the second conduction member 4B.

Ninth Embodiment

FIGS. 69 to 74 show first conduction members 3A and 3B of the ninth embodiment according to the present disclosure.

Figure 69:
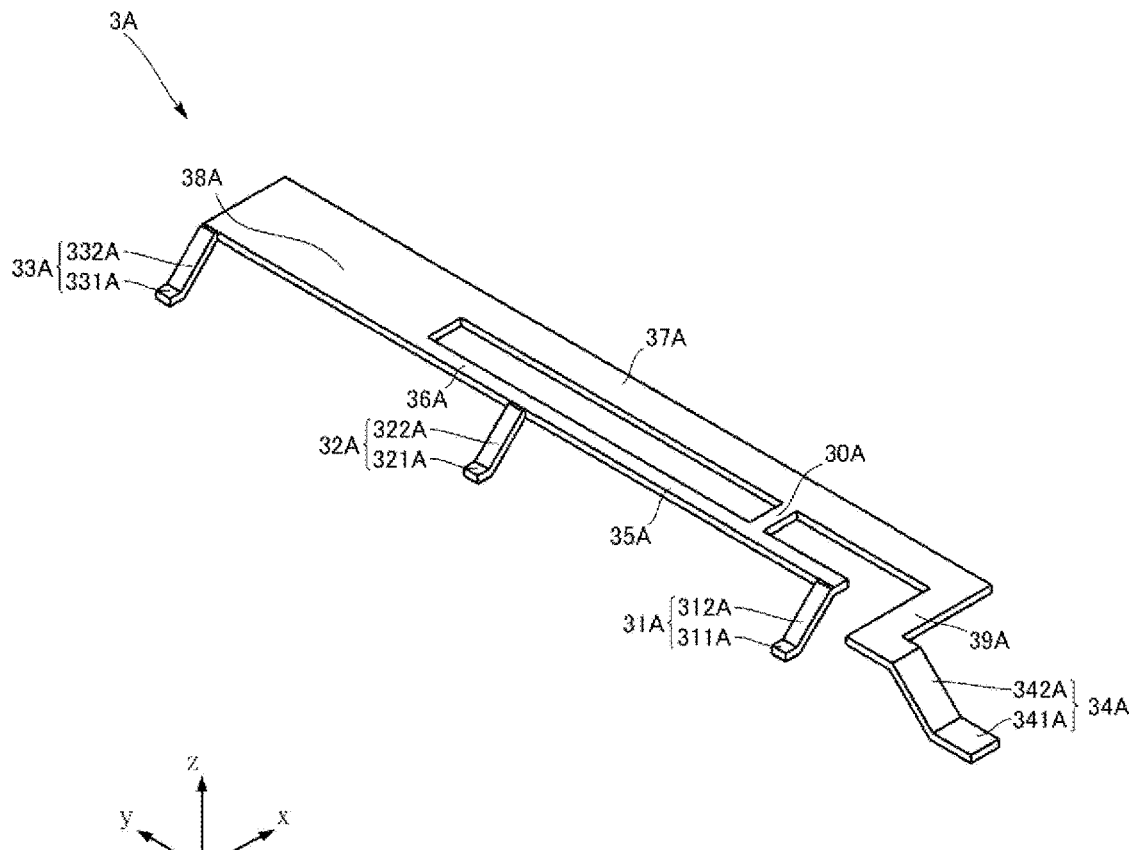
FIG. 69 is a perspective view showing a first conduction member of the semiconductor device in a ninth embodiment of the present disclosure.
Figure 70:
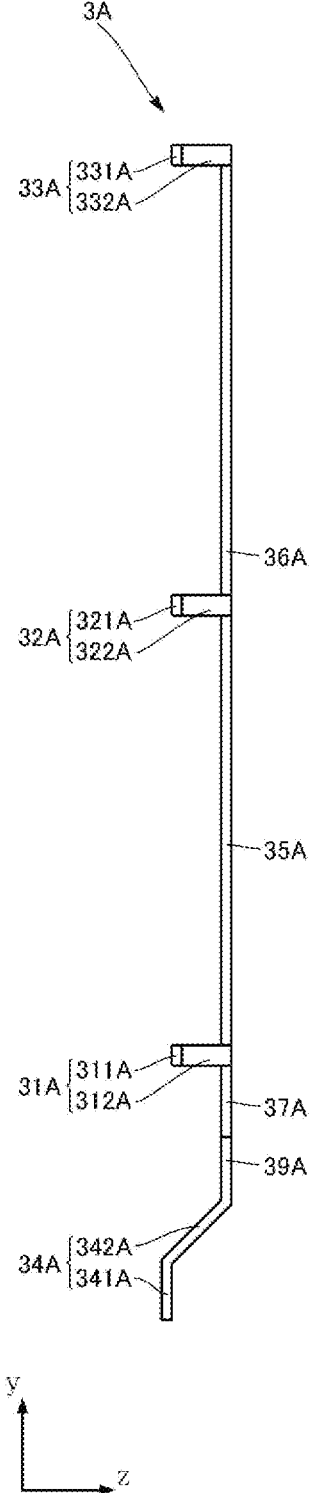
FIG. 70 is a front view showing the first conduction member of the semiconductor device in the ninth embodiment of the present disclosure.
Figure 71:
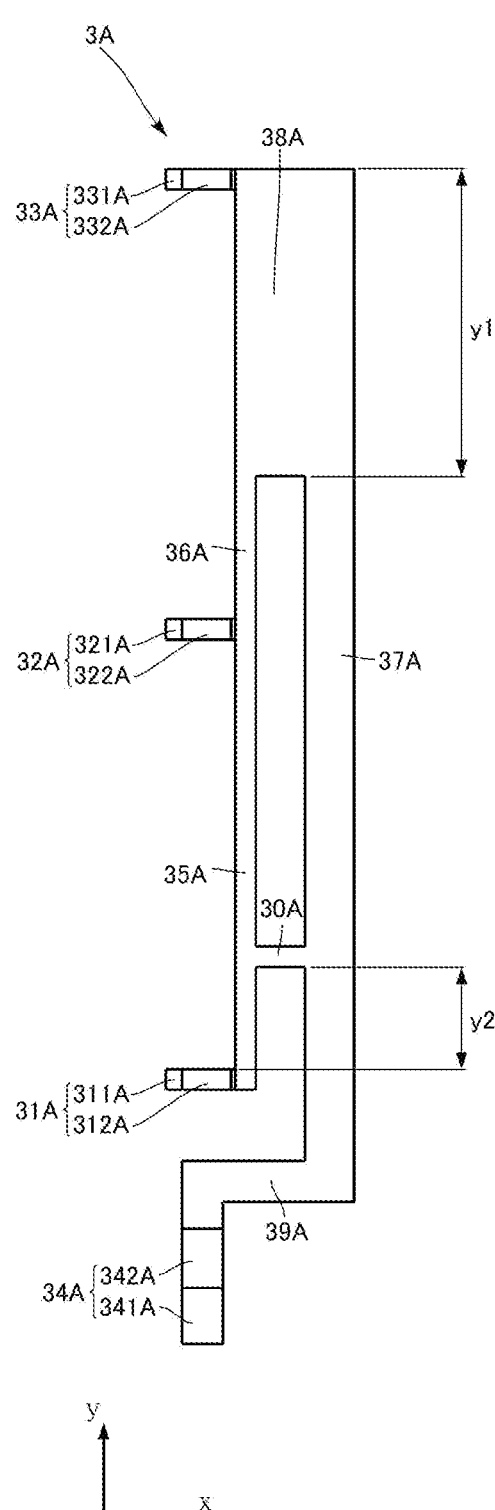
FIG. 71 is a plan view showing the first conduction member of the semiconductor device in the ninth embodiment of the present disclosure.

The first conduction member 3A shown in FIGS. 69 to 71 further includes a third linkage part 30A in addition to the structure of the first conduction member 3A in the semiconductor device A1 described above (refer to FIG. 28). The third linkage part 30A is joined to a one-side portion of the first joint 35A in the y-direction and a one-side portion of the third joint 37A in the y-direction. The third linkage part 30A extends in the x-direction. The third linkage part 30A is located at substantially the same position as the first joint 35A, the second joint 36A, the third joint 37A, and the first linkage 38A in the z-direction.

In the present embodiment, the first linkage 38A joins part of the second joint 36A and part of the third joint 37A at the other side in the y-direction. The width of the first linkage 38A in the y-direction (width of the path through which current flows) is greater than the width of the third linkage part 30A in the y-direction (width of the path through which current flows). The third semiconductor element 23A, which is located farthest from the terminal extension 34A (refer to FIG. 24), is located at the other side in the y-direction. The third extension 33A, which corresponds to the third semiconductor element 23A, is joined to the first linkage 38A. The first linkage 38A extends from the other side in the y-direction toward the one side in the y-direction by a dimension y1 (refer to FIG. 71).

In FIG. 71, the dimension y1 is the dimension of the first linkage 38A in the y-direction. The gap (distance) between the third linkage part 30A and the first extension 31A in the y-direction is a dimension y2. To obtain a uniform resistance, which will be described later, it is preferred that the dimension y1 is greater than the dimension y2. More preferably, the ratio of the dimension y1 to the dimension y2 is 1.5 to 3.0:1.0 and is, for example, 2.5:1.0.

Figure 32:
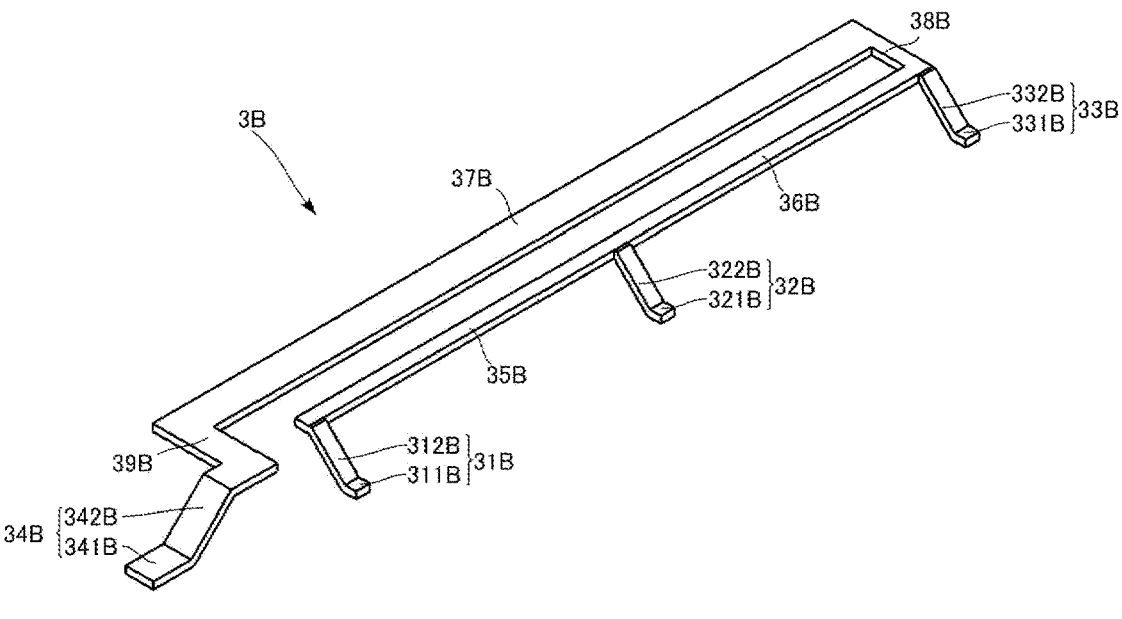
FIG. 32 is a perspective view showing the first conduction member of the semiconductor device in the seventh embodiment of the present disclosure.
Figure 32:
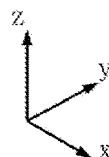
Figure 33:
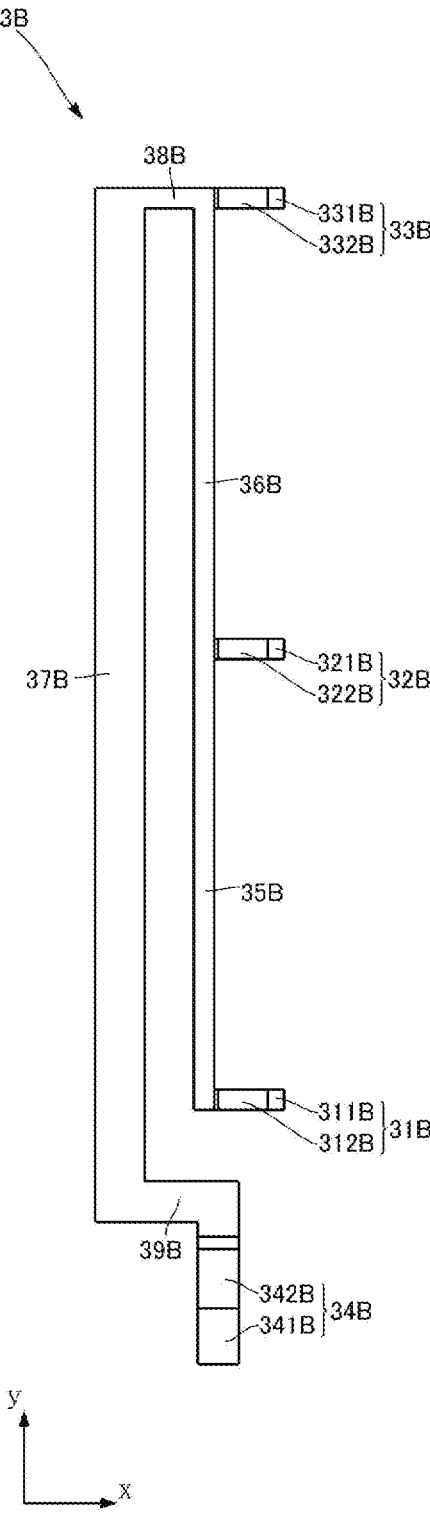
FIG. 33 is a plan view showing the first conduction member of the semiconductor device in the seventh embodiment of the present disclosure.
Figure 34:
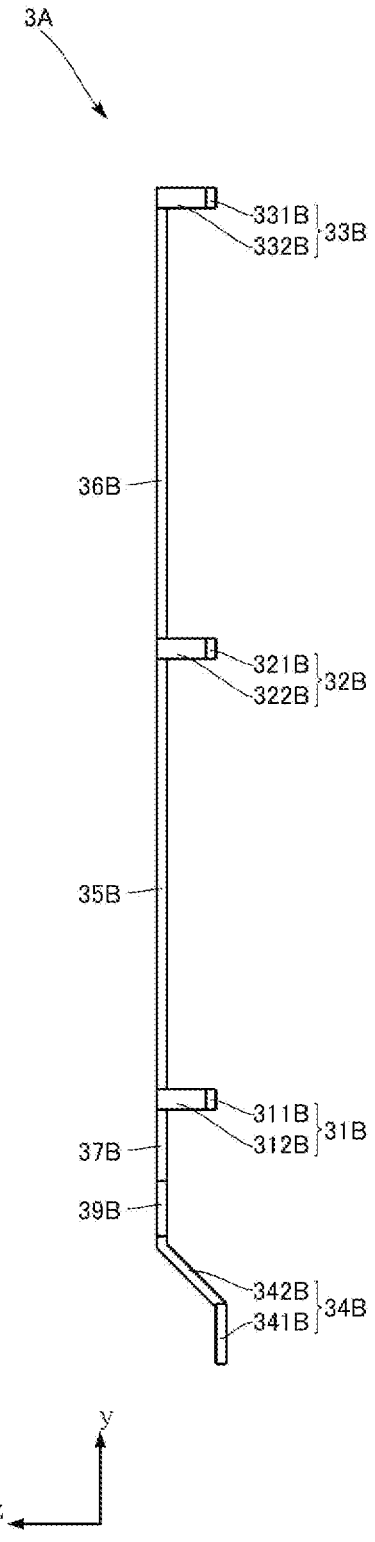
FIG. 34 is a front view showing the first conduction member of the semiconductor device in the seventh embodiment of the present disclosure.
Figure 35:
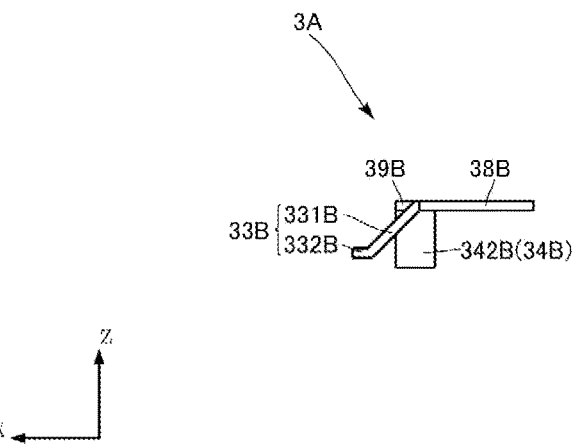
FIG. 35 is a side view showing the first conduction member of the semiconductor device in the seventh embodiment of the present disclosure.
Figure 36:
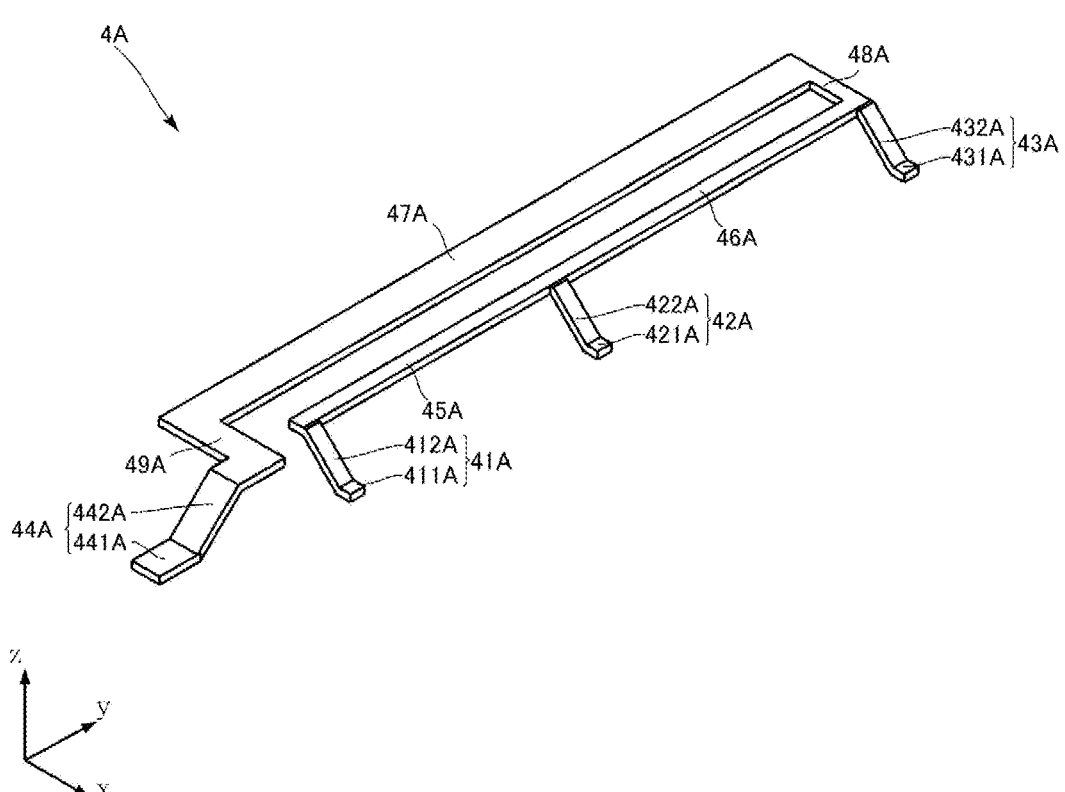
FIG. 36 is a perspective view showing a second conduction member of the semiconductor device in the seventh embodiment of the present disclosure.
Figure 37:
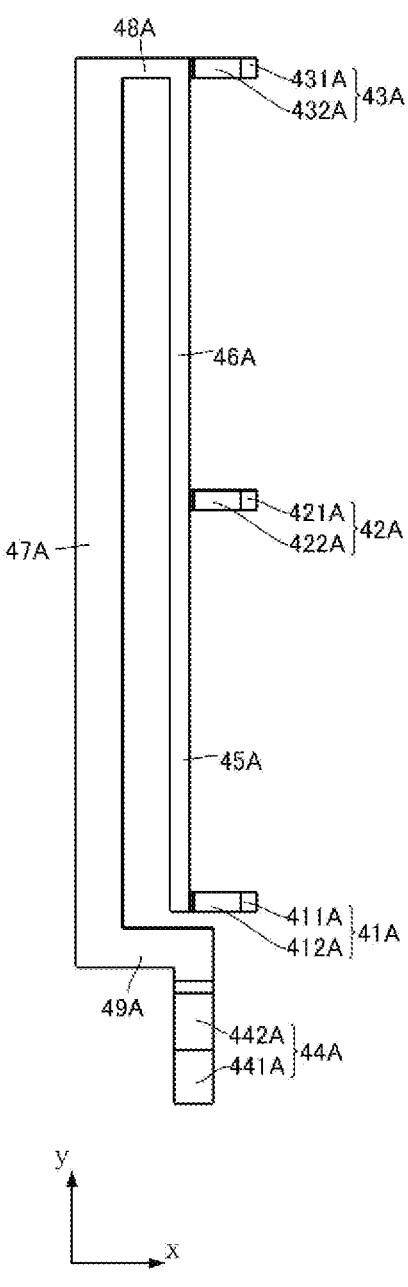
FIG. 37 is a plan view showing the second conduction member of the semiconductor device in the seventh embodiment of the present disclosure.
Figure 38:
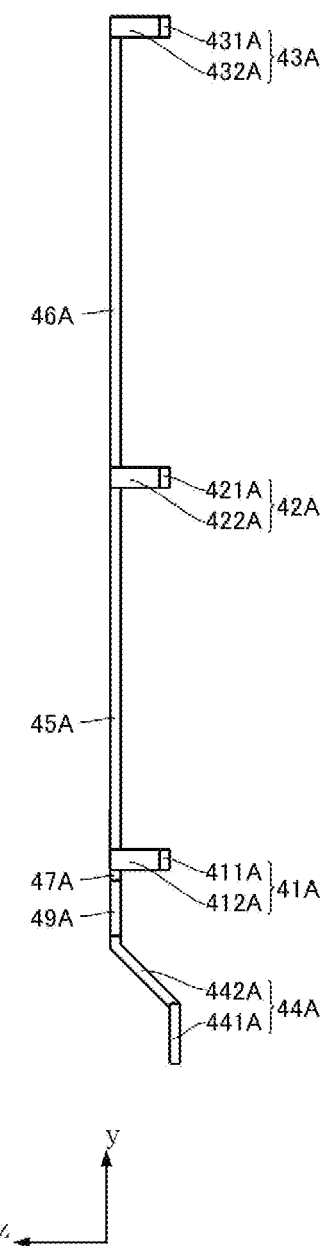
FIG. 38 is a front view showing the second conduction member of the semiconductor device in the seventh embodiment of the present disclosure.
Figure 39:
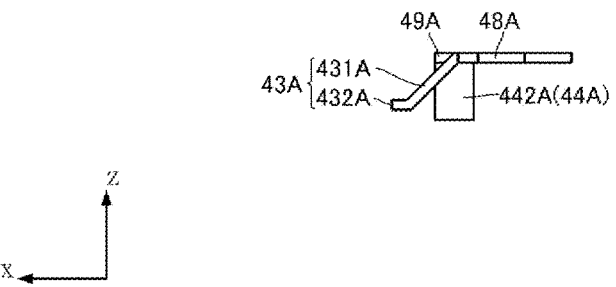
FIG. 39 is a side view showing the second conduction member of the semiconductor device in the seventh embodiment of the present disclosure.
Figure 40:
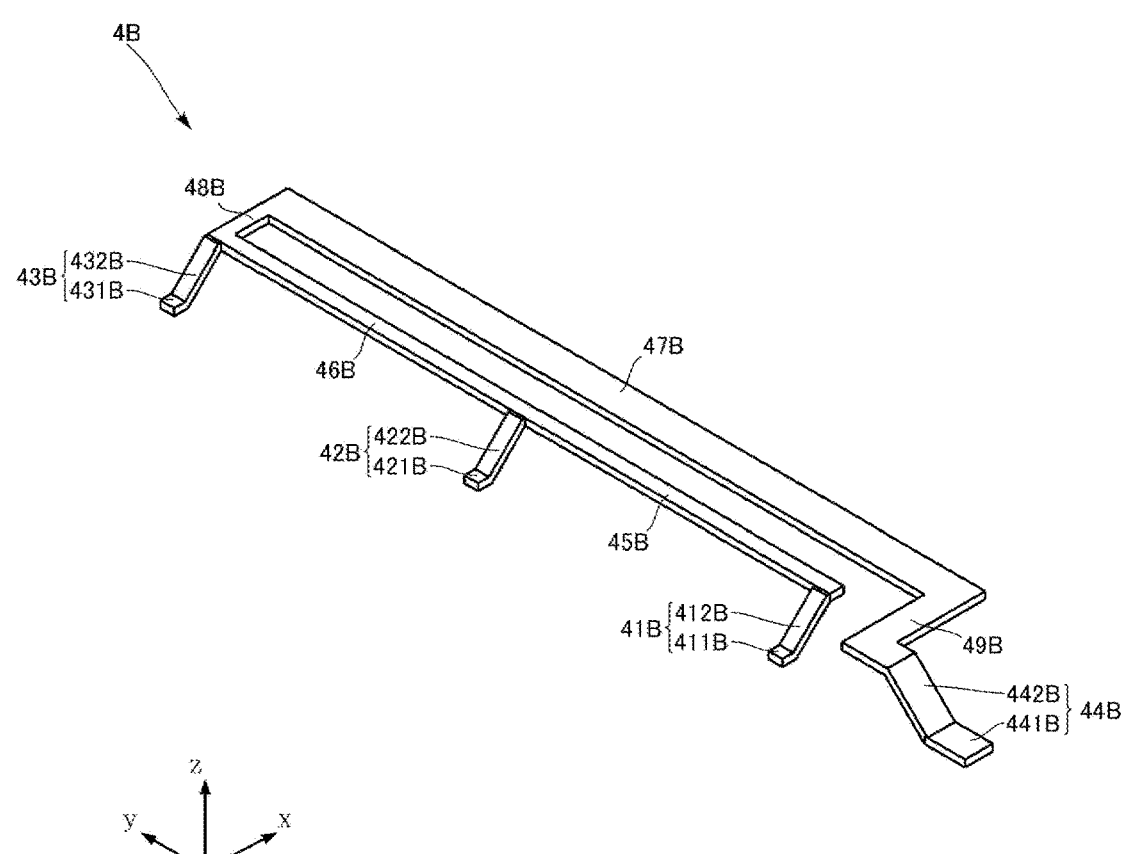
FIG. 40 is a perspective view showing the second conduction member of the semiconductor device in the seventh embodiment of the present disclosure.
Figure 41:
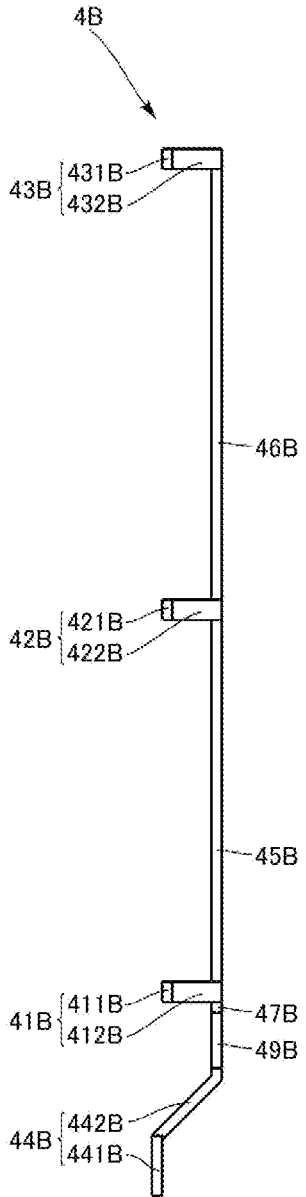
FIG. 41 is a front view showing the second conduction member of the semiconductor device in the seventh embodiment of the present disclosure.
Figure 41:
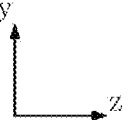
Figure 42:
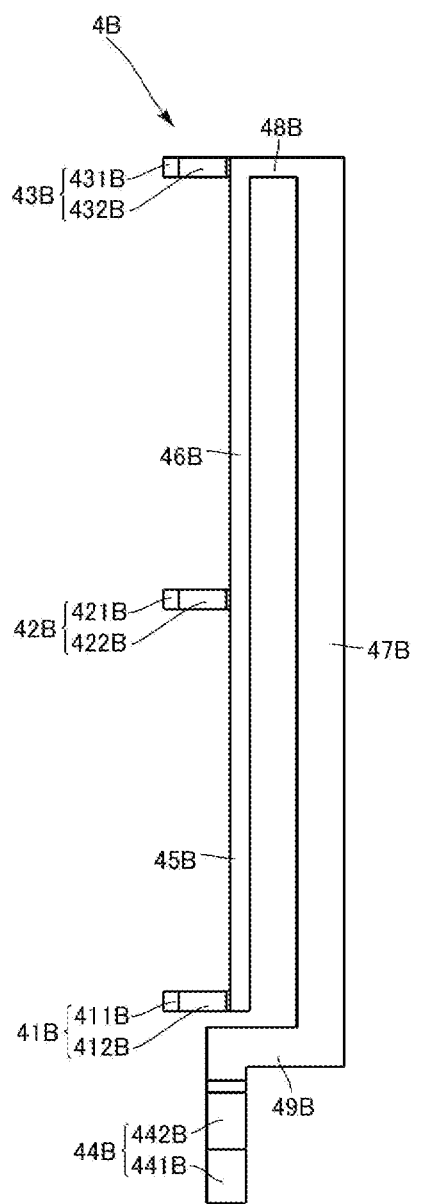
FIG. 42 is a plan view showing the second conduction member of the semiconductor device in the seventh embodiment of the present disclosure.
Figure 42:
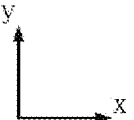
Figure 43:
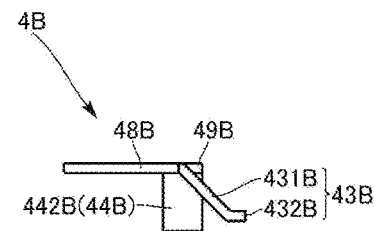
FIG. 43 is a side view showing the second conduction member of the semiconductor device in the seventh embodiment of the present disclosure.
Figure 43:
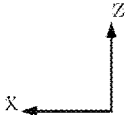
Figure 44:
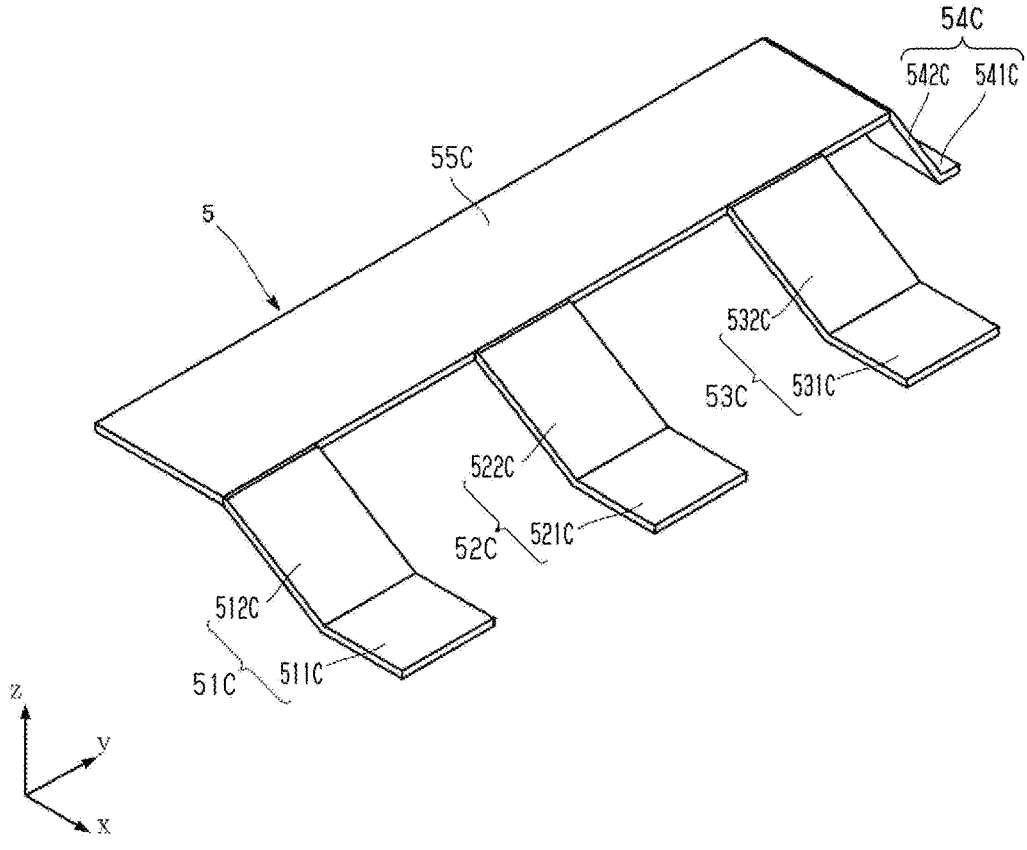
FIG. 44 is a perspective view showing a third conduction member of the semiconductor device in the seventh embodiment of the present disclosure.
Figure 45:
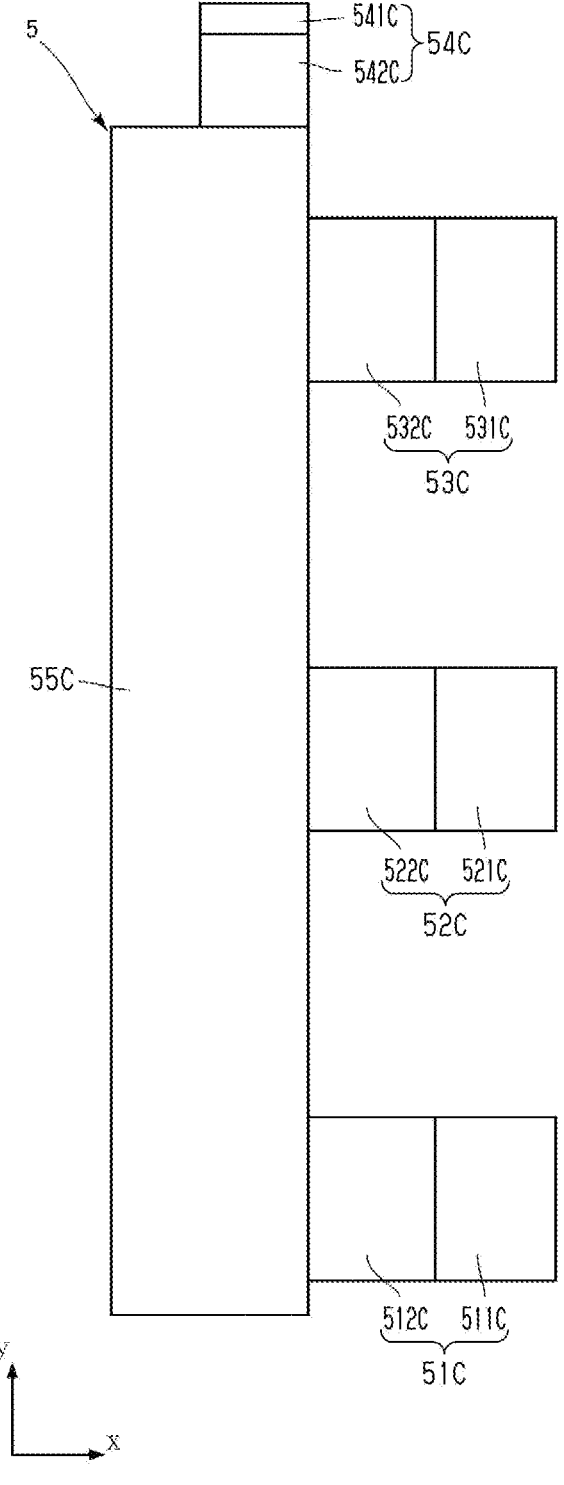
FIG. 45 is a plan view showing the third conduction member of the semiconductor device in the seventh embodiment of the present disclosure.
Figure 46:
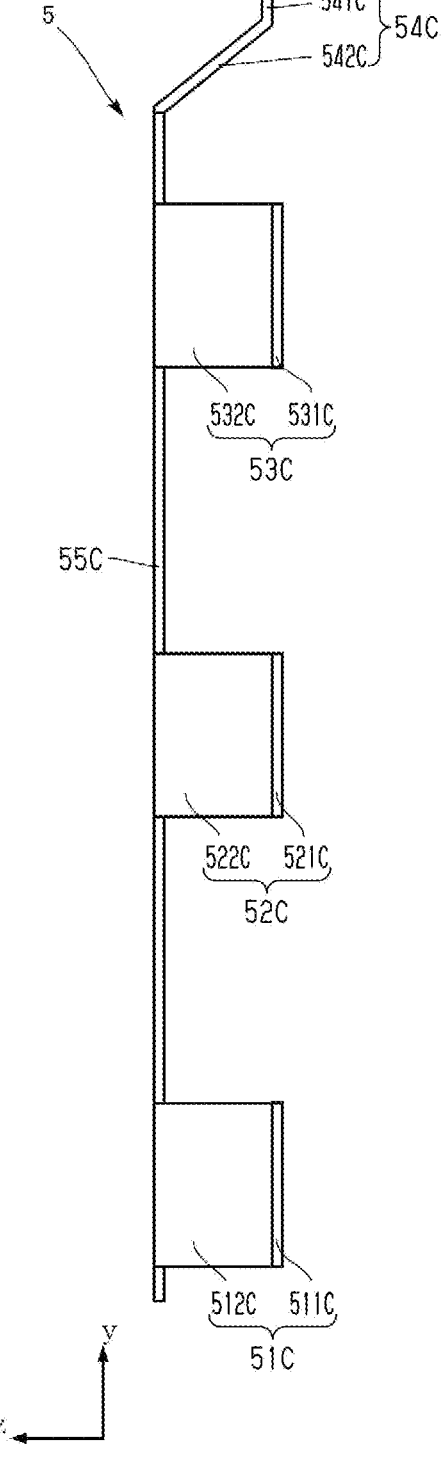
FIG. 46 is a front view showing the third conduction member of the semiconductor device in the seventh embodiment of the present disclosure.
Figure 47:
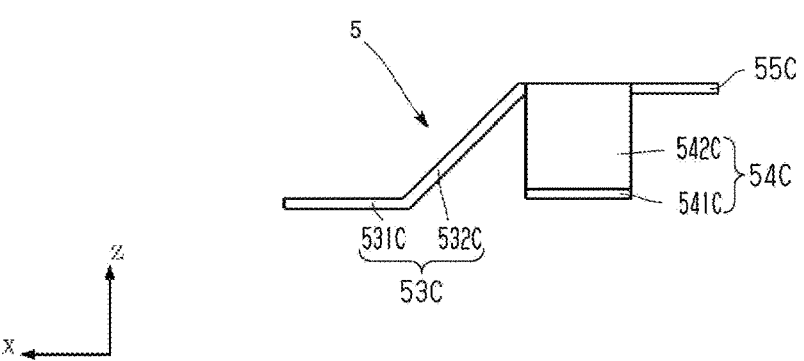
FIG. 47 is a side view showing the third conduction member of the semiconductor device in the seventh embodiment of the present disclosure.
Figure 48:
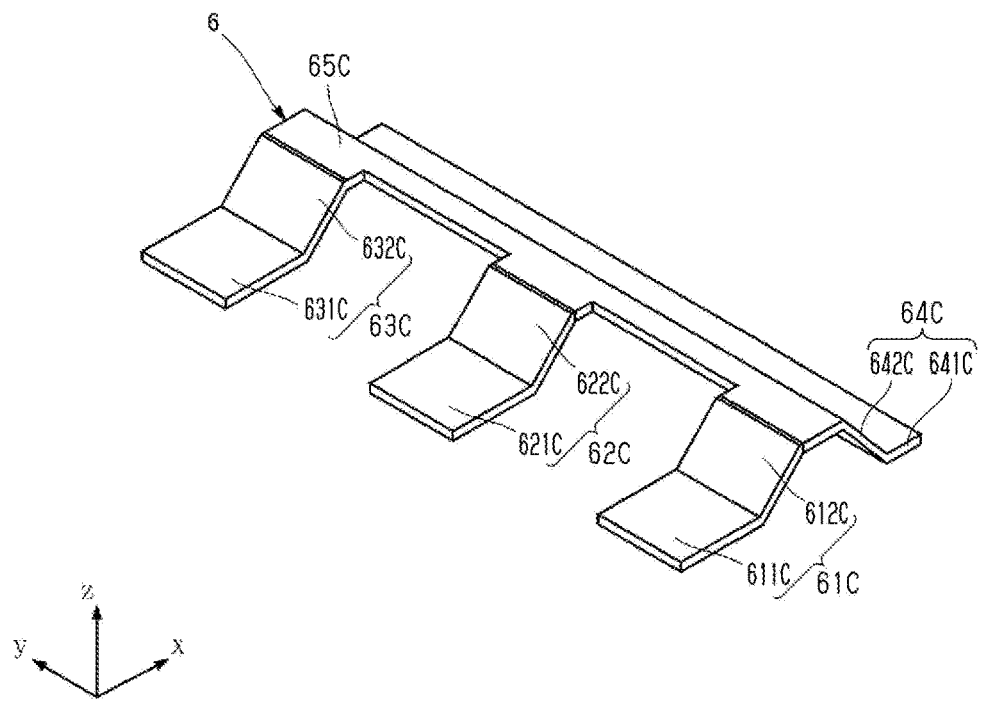
FIG. 48 is a perspective view showing a fourth conduction member of the semiconductor device in the seventh embodiment of the present disclosure.
Figure 49:
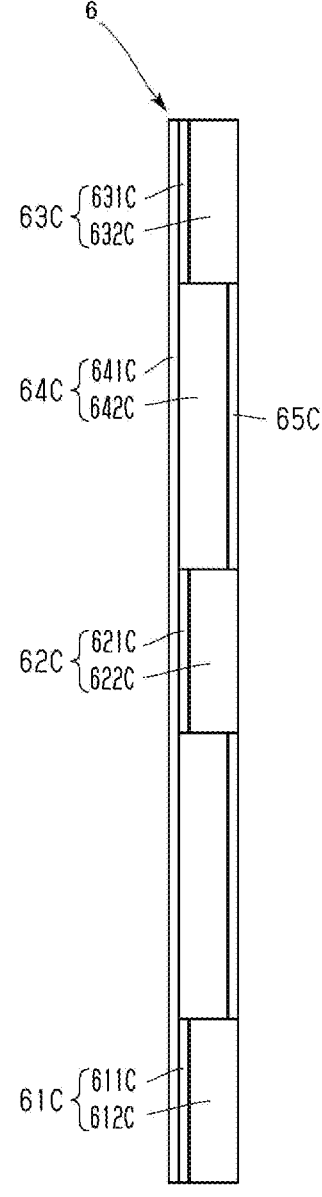
FIG. 49 is a front view showing the fourth conduction member of the semiconductor device in the seventh embodiment of the present disclosure.
Figure 49:
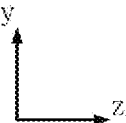
Figure 50:
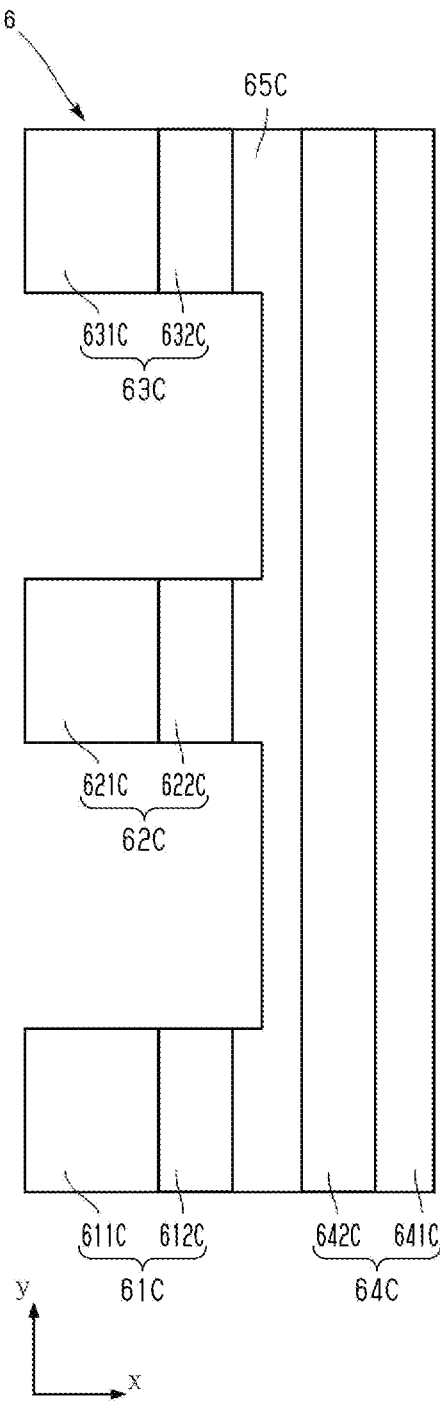
FIG. 50 is a plan view showing the fourth conduction member of the semiconductor device in the seventh embodiment of the present disclosure.
Figure 51:
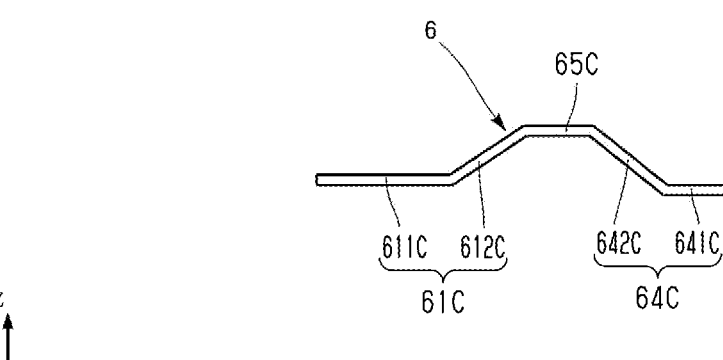
FIG. 51 is a side view showing the fourth conduction member of the semiconductor device in the seventh embodiment of the present disclosure.
Figure 72:
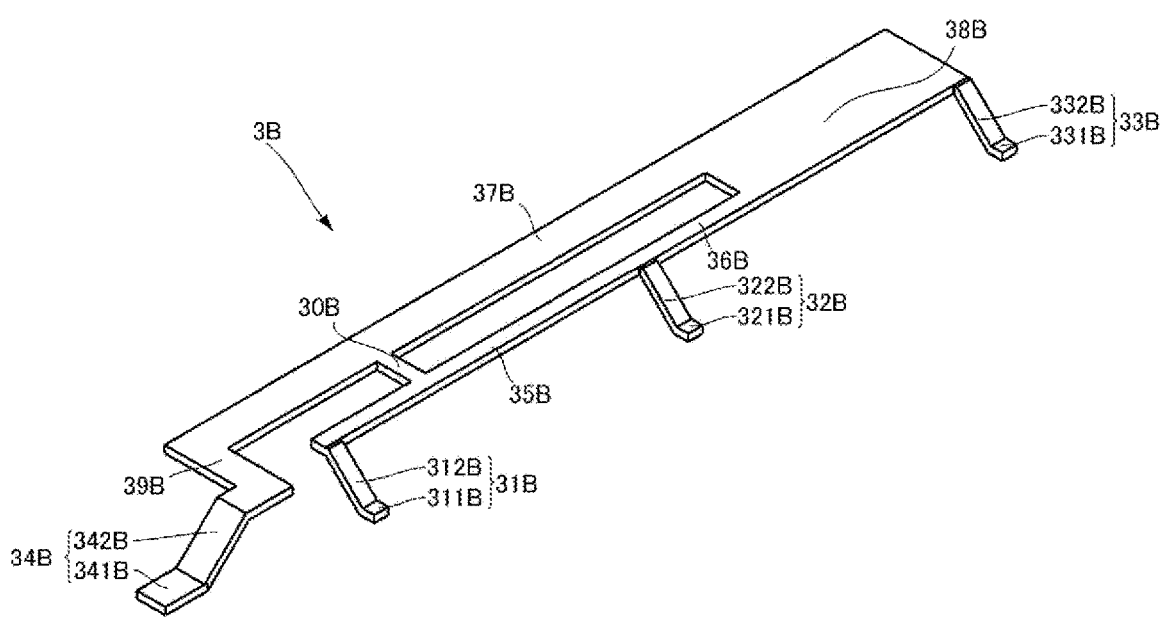
FIG. 72 is a perspective view showing a first conduction member of the semiconductor device in a ninth embodiment of the present disclosure.
Figure 72:
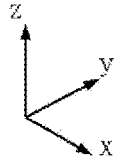
Figure 73:
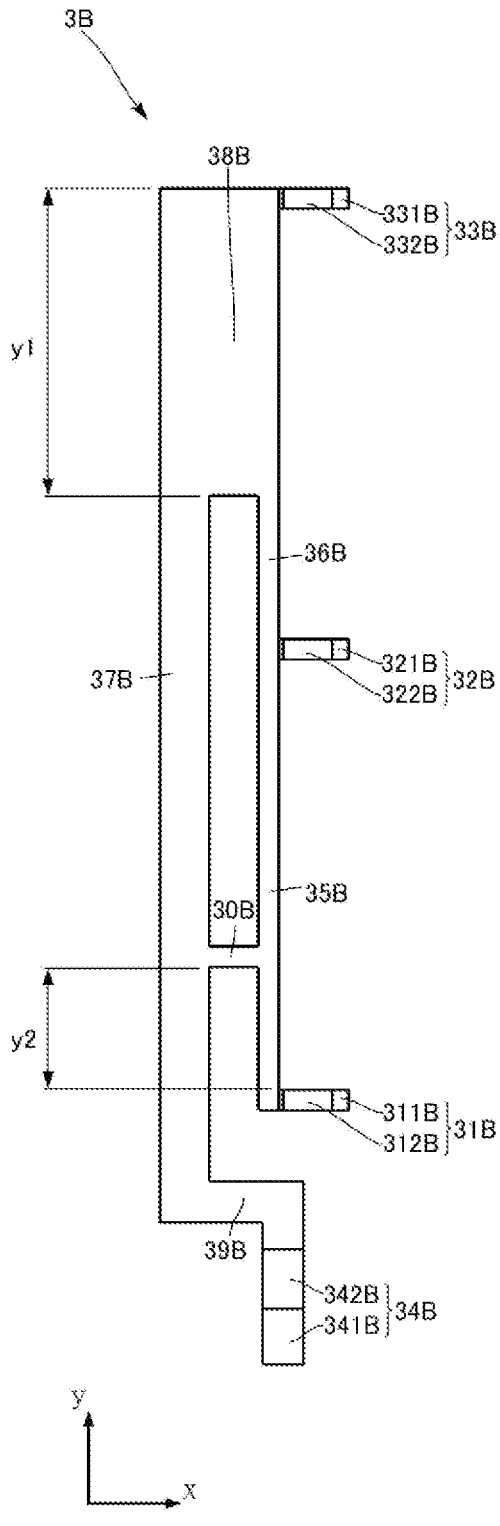
FIG. 73 is a plan view showing the first conduction member of the semiconductor device in the ninth embodiment of the present disclosure.
Figure 74:
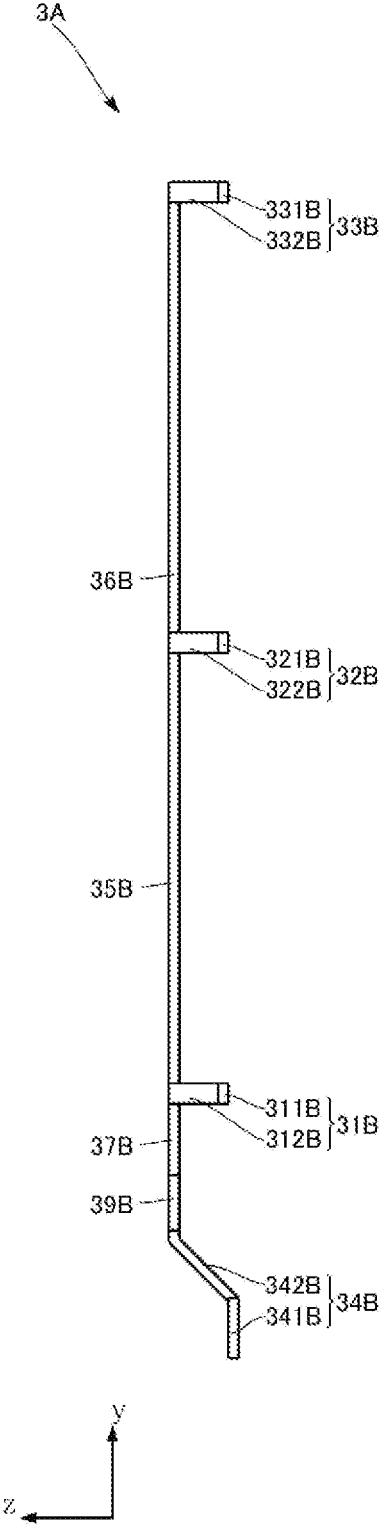
FIG. 74 is a front view showing the first conduction member of the semiconductor device in the ninth embodiment of the present disclosure.

The first conduction member 3B shown in FIGS. 72 to 74 further includes a third linkage part 30B in addition to the first conduction member 3B of the above-described semiconductor device B1 (refer to FIG. 32). The third linkage part 30B is joined to a one-side portion of the first joint 35B in the y-direction and a one-side portion of the third joint 37B in the y-direction. The third linkage part 30B extends in the x-direction. The third linkage part 30B is located at substantially the same position as the first joint 35B, the second joint 36B, the third joint 37B, and the first linkage 38B in the z-direction.

In the present embodiment, the first linkage 38B joins part of the second joint 36B and part of the third joint 37B at the other side in the y-direction. The width of the first linkage 38B in the y-direction (width of the path through which current flows) is greater than the width of the third linkage part 30B in the y-direction (width of the path through which current flows). The third semiconductor element 23B, which is located farthest from the terminal extension 34B (refer to FIG. 24), is located at the other side in the y-direction. The third extension 33B, which corresponds to the third semiconductor element 23B, is joined to the first linkage 38B. The first linkage 38B extends from the other side in the y-direction toward the one side in the y-direction by a dimension y1 (refer to FIG. 73).

In FIG. 73, the dimension y1 is the dimension of the first linkage 38B in the y-direction. The gap (distance) between the third linkage part 30B and the first extension 31B in the y-direction is a dimension y2. To obtain a uniform resistance, which will be described later, it is preferred that the dimension y1 is greater than the dimension y2. More preferably, the ratio of the dimension y1 to the dimension y2 is 1.5 to 3.0:1.0 and is, for example, 2.5:1.0.

In the present embodiment, inductance is reduced. Thus, the control voltage is further evenly applied to the first semiconductor element 21A, the second semiconductor element 22A, the third semiconductor element 23A, the first semiconductor element 21B, the second semiconductor element 22B, and the third semiconductor element 23B. In addition, the third linkage parts 30A and 30B of the first conduction members 3A and 3B reduce the electric resistance value in the conduction paths extending from the first extensions 31A and 31B to the terminal extensions 34A and 34B. In addition, the first linkages 38A and 38B are portions that are joined to the third extensions 33A and 33B, which are located farthest from the terminal extensions 34A and 34B, and have a large dimension in the y-direction (width of the path through which current flows). This reduces the electric resistance value in the conduction paths extending from the third extensions 33A and 33B to the terminal extensions 34A and 34B. In addition, when the dimension y1 is greater than the dimension y2 and the dimension y2 is set to an appropriate length, an excess decrease in the electric resistance value in the conduction paths extending from the first extensions 31A and 31B to the terminal extensions 34A and 34B is avoided. This is effective for a uniform electric resistance value in the conduction paths. In order for the conduction paths extending from the first extensions 31A and 31B, the second extensions 32A and 32B, and the third extensions 33A and 33B to the terminal extensions 34A and 34B to have a uniform electric resistance value, it is preferred that the ratio of the dimension y1 to the dimension y2 is 1.5 to 3.0:1.0.

Clauses

The technical aspects that are understood from the above embodiments will hereafter be described.

1. A semiconductor device, including:

first switching elements, each of the first switching elements including a first element main surface and a first element back surface that face in opposite directions and further including a first control electrode and a first main surface drive electrode that are formed on the first element main surface and a first back surface drive electrode that is formed on the first element back surface, second switching elements, each of the second switching elements including a second element main surface and a second element back surface that face in opposite directions and further including a second control electrode and a second main surface drive electrode that are formed on the second element main surface and a second back surface drive electrode that is formed on the second element back surface;

a first die pad including a first main surface to which the first back surface drive electrodes of the first switching elements are connected;

a second die pad including a second main surface facing in the same direction as the first main surface and disposed in a direction parallel to the first main surface, the second back surface drive electrodes of the second switching elements being connected to the second main surface;

a first control lead located separate from the first die pad;

a second control lead located separate from the second die pad;

a first control connection member connecting the first control electrodes of the first switching elements to the first control lead; and a second control connection member connecting the second control electrodes of the second switching elements to the second control lead, where the first control connection member includes a lead connector and first electrode connectors, where the lead connector includes a first end and a second end, the first end of the lead connector is connected to the first control lead, and the first electrode connectors are connected between the second end of the lead connector and the first control electrodes of the first switching elements, the second control connection member includes a lead connector and second electrode connectors, where the lead connector includes a first end and a second end, the first end of the lead connector is connected to the second control lead, and the second electrode connectors are connected between the second end of the lead connector and the second control electrodes of the second switching elements, the first electrode connectors of the first control connection member are equal in length, and the second electrode connectors of the second control connection member are qual in length.

2. The semiconductor device according to clause 1, where two of the first switching elements are connected to the first die pad, two of the second switching elements are connected to the second die pad, the second end of the lead connector of the first control connection member is disposed between the two first switching elements, and the second end of the lead connector of the second control connection member is disposed between the two second switching elements.

3. The semiconductor device according to clause 1 or 2, where the second end of the lead connector of the first control connection member is disposed on a line extending between the first control electrodes of the two first switching elements, the first electrode connectors of the first control connection member extend in opposite directions, the second end of the lead connector of the second control connection member is disposed on a line extending between the second control electrodes of the two second switching elements, and the first electrode connectors of the second control connection member extend in opposite directions.

4. A semiconductor device, including:

first switching elements, each of the first switching elements including a first element main surface and a first element back surface that face in opposite directions and further including a first control electrode and a first main surface drive electrode that are formed on the first element main surface and a first back surface drive electrode that is formed on the first element back surface, second switching elements, each of the second switching elements including a second element main surface and a second element back surface that face in opposite directions and further including a second control electrode and a second main surface drive electrode that are formed on the second element main surface and a second back surface drive electrode that is formed on the second element back surface;

a first die pad including a first main surface to which the first back surface drive electrodes of the first switching elements are connected;

a second die pad including a second main surface facing in the same direction as the first main surface and disposed parallel in a direction parallel to the first main surface, the second back surface drive electrodes of the second switching elements being connected to the second main surface;

a first control lead located separate from the first die pad;

a second control lead located separate from the second die pad;

a first control connection member connecting the first control electrodes of the first switching elements to the first control lead; and a second control connection member connecting the second control electrodes of the second switching elements to the second control lead, where the first switching elements are disposed so that the first control electrodes align in a first direction that is parallel to the first main surface, the second switching elements are disposed so that the second control electrodes align in the first direction, the first control connection member includes
a first electrode connector linearly extending in the first direction and connected to the first control electrodes of the first switching elements,
a first lead connector disposed parallel to the first electrode connector and connected to the first control lead, and
a first joint joining an end of the first electrode connector and an end of the first lead connector located opposite from the first control lead, and the second control connection member includes
a second electrode connector linearly extending in the first direction and connected to the second control electrodes of the second switching elements,
a second lead connector disposed parallel to the second electrode connector and connected to the second control lead, and
a second joint joining an end of the second electrode connector and an end of the second lead connector located opposite from the second control lead.

5. The semiconductor device according to clause 4, where the first joint of the first control connection member overlaps the first control electrodes of the first switching elements as viewed in a direction orthogonal to the first main surface, and the second joint of the second control connection member overlaps the second control electrodes of the second switching elements as viewed in a direction orthogonal to the second main surface.

6. A semiconductor device, including:

first switching elements, each of the first switching elements including a first element main surface and a first element back surface that face in opposite directions and further including a first control electrode and a first main surface drive electrode that are formed on the first element main surface and a first back surface drive electrode that is formed on the first element back surface, second switching elements, each of the second switching elements including a second element main surface and a second element back surface that face in opposite directions and further including a second control electrode and a second main surface drive electrode that are formed on the second element main surface and a second back surface drive electrode that is formed on the second element back surface;

a first die pad including a first main surface to which the first back surface drive electrodes of the first switching elements are connected;

a second die pad including a second main surface facing in the same direction as the first main surface and disposed in a direction parallel to the first main surface, the second back surface drive electrodes of the second switching elements being connected to the second main surface;

a first control lead located separate from the first die pad;

a second control lead located separate from the second die pad;

a first control connection member connecting the first control electrodes of the first switching elements to the first control lead; and a second control connection member connecting the second control electrodes of the second switching elements to the second control lead, where the first switching elements include a first element, a second element, and a third element that are disposed so that the first control electrodes align in a first direction parallel to the first main surface and so that the second element and the third element are located at opposite sides of the first element, the first control connection member includes
a first lead connector connected to the first control lead,
a first branch part and a second branch part connected to a distal end of the first lead connector,
a first connection part connected between a distal end of the first branch part and the first control electrode of the first element,
a second connection part connected between a distal end of the second branch part and the first control electrode of the first element,
a third connection part connected between the distal end of the first branch part and the first control electrode of the second element, and
a fourth connection part connected between the distal end of the second branch part and the first control electrode of the third element, the second switching elements include a fourth element, a fifth element, and a sixth element disposed so that the second control electrodes align in the first direction and so that the fifth element and the sixth element are locate at opposite sides of the fourth element, the second control connection member includes
a second lead connector connected to the second control lead,
a third branch part and a fourth branch part connected to a distal end of the second lead connector,
a fifth connection part connected between a distal end of the third branch part and the second control electrode of the fourth element,
a sixth connection part connected between a distal end of the fourth branch part and the second control electrode of the fourth element,
a seventh connection part connected between the distal end of the third branch part and the second control electrode of the fifth element, and
an eighth connection part connected to the distal end of the fourth branch part and the second control electrode of the sixth element.

7. The semiconductor device according to any one of clauses 1 to 6, further including a first drive connection member connecting the first main surface drive electrodes of the first switching elements to the second main surface.

8. The semiconductor device according to any one of clauses 1 to 7, further including:
a first drive lead connected to the first die pad;
a second drive lead located separate from the second die pad;
an output lead connected to the second die pad; and
a second drive connection member connecting the second main surface drive electrodes of the second switching elements to the second drive lead.

9. The semiconductor device according to clause 8, further including an encapsulation resin covering part of the die pad and the switching elements and including a resin side surface facing in a direction parallel to the main surface, where the first control lead, the second control lead, the first drive lead, the second drive lead, and the output lead project from the resin side surface and extend in a direction parallel to the main surface.

10. The semiconductor device according to clause 8, further including an encapsulation resin covering part of the die pad and the switching elements and including a first resin side surface facing in a direction parallel to the main surface and a second resin side surface facing in a direction opposite from the first resin side surface, where the first drive lead and the second drive lead project from the first resin side surface and extend in a direction parallel to the main surface, and the first control lead and the second control lead project from the second resin side surface and extend in a direction parallel to the main surface.

11. The semiconductor device according to clause 10, where the output lead projects from one of the first resin side surface and the second resin side surface.

12. The semiconductor device according to any one of clauses 1 to 11, where
each of the first switching elements includes a first source electrode electrically connected to the first main surface drive electrode,
each of the second switching elements includes a second source electrode electrically connected to the second main surface drive electrode,
the semiconductor device further includes:
a first source lead disposed at an inner side of the first control lead;
a second source lead disposed at an inner side of the second control lead;
a first source connection member connecting the first source electrode to the first source lead; and
a second source connection member connecting the second source electrode to the second source lead.

13. The semiconductor device according to clause 12, where
the first source connection member is connected to the first source electrode of one of the first switching elements, and
the second source connection member is connected to the second source electrode of one of the second switching elements.

14. A semiconductor device, including:
a die pad including a main surface;
switching elements, each of the switching elements including an element main surface and an element back surface that face in opposite directions and further including a control electrode and a main surface drive electrode that are formed on the element main surface and a back surface drive electrode that is formed on the element back surface, the back surface drive electrode being connected to the main surface;
a control lead disposed separate from the die pad; and
a control connection member connecting the control electrodes of the switching elements to the control lead, where
the control connection member includes a lead connector and electrode connectors,
the lead connector includes a first end and a second end,
the first end of the lead connector is connected to the control lead,
the electrode connectors are connected between the second end of the lead connector and the control electrodes of the switching elements,
the electrode connectors differ in length, and
the electrode connectors have a width that is set to decrease as the length increases.

15. The semiconductor device according to clause 14, where the width of the electrode connections is set to be inversely proportional to the length.

2-1. A semiconductor device, including:
a first semiconductor element having a switching function and including a first control electrode;
a second semiconductor element having a switching function and including a second control electrode;
a third semiconductor element having a switching function and including a third control electrode;
a control terminal; and
a first conduction member electrically connecting the first control electrode, the second control electrode, and the third control electrode to the control terminal, where
the first semiconductor element, the second semiconductor element, and the third semiconductor element are arranged in order from one side toward an other side in a first direction,
the control terminal is located at the one side of the first semiconductor element in the first direction,
the first conduction member includes a first extension bonded to the first control electrode, a second extension bonded to the second control electrode, a third extension bonded to the third control electrode, a terminal extension electrically connected to the control terminal, a first joint joining the first extension and the second extension, a second joint joining the second extension and the third extension, and a third joint disposed between the third extension and the terminal extension.

2-2. The semiconductor device according to clause 2-1, where the first joint extends in the first direction.

2-3. The semiconductor device according to clause 2-2, where the second joint extends in the first direction.

2-4. The semiconductor device according to clause 2-3, where the first joint and the second joint overlap each other as viewed in the first direction.

2-5. The semiconductor device according to clause 2-4, where the third joint extends in the first direction.

2-6. The semiconductor device according to clause 2-5, where the third joint is separate from the first joint and the second joint in a second direction that is orthogonal to the first direction.

2-7. The semiconductor device according to clause 2-6, where
the first conduction member includes a first linkage joined to an other-side portion of the second joint in the first direction and an other-side portion of the third joint in the first direction, and
the first linkage extends in the second direction.

2-8. The semiconductor device according to clause 2-7, where the first conduction member includes a second linkage joined to a one-side portion of the third joint in the first direction and an other-side portion of the terminal extension in the first direction, and the second linkage extends in the second direction.

2-9. The semiconductor device according to clause 2-8, where the control terminal occupies a region in the second direction, each of the first extension, the second extension, and the third extension occupies a region in the second direction, and the regions overlap with each other.

2-10. The semiconductor device according to any one of clauses 2-1 to 2-9, where the first conduction member is formed of a metal plate material.

2-11. The semiconductor device according to any one of clauses 2-6 to 2-9, where the first semiconductor element includes a first main surface electrode, the second semiconductor element includes a second main surface electrode, the third semiconductor element includes a third main surface electrode, the semiconductor device further includes:

an auxiliary terminal; and a second conduction member electrically connecting the first main surface electrode, the second main surface electrode, and the third main surface electrode to the auxiliary terminal, the auxiliary terminal is disposed at the one side of the first semiconductor element in the first direction, and the second conduction member includes a first extension bonded to the first main surface electrode, a second extension bonded to the second main surface electrode, a third extension bonded to the third main surface electrode, a terminal extension electrically connected to the auxiliary terminal, a first joint joining the first extension and the second extension, a second joint joining the second extension and the third extension, and a third joint disposed between the third extension and the terminal extension.

2-12. The semiconductor device according to clause 2-11, where the first joint of the second conduction member extends in the first direction.

2-13. The semiconductor device according to clause 2-12, where the second joint of the second conduction member extends in the first direction.

2-14. The semiconductor device according to clause 2-13, where the first joint and the second joint overlap each other as viewed in the first direction.

2-15. The semiconductor device according to clause 2-14, where the third joint of the second conduction member extends in the first direction.

2-16. The semiconductor device according to clause 2-15, where the third joint of the second conduction member is separate from the first joint and the second joint of the second conduction member in the second direction.

2-17. The semiconductor device according to clause 2-16, where the second conduction member includes a first linkage joined to an other-side portion of the second joint in the first direction and an other-side portion on the third joint in the first direction, and the first linkage extends in the second direction.

2-18. The semiconductor device according to clause 2-17, where the second conduction member includes a second linkage joined to a one-side portion of the third joint in the first direction and an other-side portion of the terminal extension in the first direction, and the second linkage extends in the second direction.

2-19. The semiconductor device according to any one of clauses 2-1 to 2-18, where the first conduction member further includes a third linkage joined to the first joint and the third joint.

2-20. The semiconductor device according to any one of clauses, where the third linkage is joined to a one-side portion of the first joint in the first direction and a one-side portion of the third joint in the first direction.

2-21. A semiconductor device, including:

a first semiconductor element having a switching function and including a first control electrode;

a second semiconductor element having a switching function and including a second control electrode;

a third semiconductor element having a switching function and including a third control electrode;

a control terminal; and a first conduction member electrically connecting the first control electrode, the second control electrode, and the third control electrode to the control terminal, where the first semiconductor element, the second semiconductor element, and the third semiconductor element are arranged in order from one side toward an other side in a first direction, the control terminal is located at the one side of the first semiconductor element in the first direction, the first conduction member includes a first extension, a second extension, a third extension, a terminal extension, a first joint, a second joint, a first linkage, a second linkage, a third joint, a third linkage, and a fourth joint, the first extension is bonded to the first control electrode, the second extension is bonded to the second control electrode, the third extension is bonded to the third control electrode, the terminal extension is electrically connected to the control terminal, the first joint joins the first extension and the second extension, the second joint joins the second extension and the third extension, the first linkage extends from the first joint in a second direction that is orthogonal to the first direction, the second linkage extends from the second joint in the second direction, the third joint joins the first linkage and the second linkage, the third linkage extends from the third joint in the second direction, and the fourth joint is disposed between the third linkage and the terminal extension.

2-22. The semiconductor device according to clause 2-21, where the first joint extends in the first direction.

2-23. The semiconductor device according to clause 2-22, where the second joint extends in the first direction.

2-24. The semiconductor device according to clause 2-23, where the third joint extends in the first direction.

2-25. The semiconductor device according to clause 2-24, where the second joint extends in the first direction.

3-1. A semiconductor device, including:

a first semiconductor element having a switching function and including a first control electrode;

a second semiconductor element having a switching function and including a second control electrode;

a third semiconductor element having a switching function and including a third control electrode;

a control terminal; and a first conduction member electrically connecting the first control electrode, the second control electrode, and the third control electrode to the control terminal, where the first semiconductor element, the second semiconductor element, and the third semiconductor element are arranged in order from one side toward an other side in a first direction, the control terminal is located at the one side of the first semiconductor element in the first direction, the first conduction member includes a first extension bonded to the first control electrode, a second extension bonded to the second control electrode, a third extension bonded to the third control electrode, a terminal extension electrically connected to the control terminal, a first joint joining the first extension and the second extension, a second joint joining the second extension and the third extension, and a third joint disposed between the third extension and the terminal extension.

3-2. The semiconductor device according to clause 3-1, where the first joint extends in the first direction.

3-3. The semiconductor device according to clause 3-2, where the second joint extends in the first direction.

3-4. The semiconductor device according to clause 3-3, where the first joint and the second joint overlap each other as viewed in the first direction.

3-5. The semiconductor device according to clause 3-4, where the third joint extends in the first direction.

3-6. The semiconductor device according to clause 3-5, where the third joint is separate from the first joint and the second joint in a second direction that is orthogonal to the first direction.

3-7. The semiconductor device according to clause 3-6, where the first conduction member includes a first linkage joined to an other-side portion of the second joint in the first direction and an other-side portion of the third joint in the first direction, and the first linkage extends in the second direction.

3-8. The semiconductor device according to clause 3-7, where the first conduction member includes a second linkage joined to a one-side portion of the third joint in the first direction and an other-side portion of the terminal extension in the first direction, and the second linkage extends in the second direction.

3-9. The semiconductor device according to clause 3-8, where the control terminal occupies a region in the second direction, each of the first extension, the second extension, and the third extension occupies a region in the second direction, and the regions overlap with each other.

3-10. The semiconductor device according to any one of clauses 3-1 to 3-9, where the first conduction member is formed of a metal plate material.

3-11. The semiconductor device according to any one of clauses 3-6 to 3-9, where the first semiconductor element includes a first main surface electrode, the second semiconductor element includes a second main surface electrode, the third semiconductor element includes a third main surface electrode, the semiconductor device further includes:

an auxiliary terminal; and a second conduction member electrically connecting the first main surface electrode, the second main surface electrode, the third main surface electrode, and the auxiliary terminal, the auxiliary terminal is disposed at the one side of the first semiconductor element in the first direction, and the second conduction member includes a first extension bonded to the first main surface electrode, a second extension bonded to the second main surface electrode, a third extension bonded to the third main surface electrode, a terminal extension electrically connected to the auxiliary terminal, a first joint joining the first extension and the second extension, a second joint joining the second extension and the third extension, and a third joint disposed between the third extension and the terminal extension.

3-12. The semiconductor device according to clause 3-11, where the first joint of the second conduction member extends in the first direction.

3-13. The semiconductor device according to clause 3-12, where the second joint of the second conduction member extends in the first direction.

3-14. The semiconductor device according to clause 3-13, where the first joint and the second joint overlap each other as viewed in the first direction.

3-15. The semiconductor device according to clause 3-14, where the third joint of the second conduction member extends in the first direction.

3-16. The semiconductor device according to clause 3-15, where the third joint of the second conduction member is separate from the first joint and the second joint of the second conduction member in the second direction.

3-17. The semiconductor device according to clause 3-16, where the second conduction member includes a first linkage joined to an other-side portion of the second joint in the first direction and an other-side portion on the third joint in the first direction, and the first linkage extends in the second direction.

3-18. The semiconductor device according to clause 3-17, where the second conduction member includes a second linkage joined to a one-side portion of the third joint in the first direction and an other-side portion of the terminal extension in the first direction, and the second linkage extends in the second direction.

REFERENCE SIGNS LIST

A10, A11, A20, A30, A31, A40, A50, A60) semiconductor device; 11) first die pad; 111) main surface; 12) second die pad; 121) main surface; 21) first control lead; 22) first source lead; 23) first drive lead; 24) second drive lead; 25) output lead; 26) second source lead; 27) second control lead; 30a) first switching element (second element); 30b) first switching element (first element); 30c) first switching element (third element); 301) first element main surface; 302) first element back surface; 31) first main surface drive electrode; 311) main source electrode; 312) source electrode; 32) first control electrode; 33) first back surface drive electrode; 40a) second switching element (fifth element); 40b) second switching element (fourth element); 40c) second switching element (sixth element); 401) second element main surface; 402) second element back surface; 41) second main surface drive electrode; 411)

main source electrode; 412) source electrode; 42) second control electrode; 43) second back surface drive electrode; 51, 51*a*) first control connection member; 511) lead connector; 512*a*) electrode connector; 512*b*) electrode connector; 513) lead connector; 514) electrode connector; 514*a*) electrode connector; 514*b*) electrode connector; 52, 52*a*) source connection member; 521) lead connector; 522*a*) electrode connector; 522*b*) electrode connector; 53) first drive connection member; 54) second drive connection member; 541) lead connector; 542) electrode connector; 543) joint; 561) lead connector; 562*a*) electrode connector; 562*b*) electrode connector; 57) second control connection member; 571) lead connector; 572*a*) electrode connector; 572*b*) electrode connector; 61) first control connection member; 611) lead connector (first lead connector); 612) joint (first joint); 613) electrode connector (first electrode connector); 63) first drive connection member; 64) second drive connection member; 67) second control connection member; 671) lead connector (second lead connector); 672) joint (second joint); 673) electrode connector (second electrode connector); 71) first control connection member; 71*a*) first control connection member; 721) first branch part; 722) second branch part; 731) first connection part; 732) second connection part; 733) third connection part; 734) fourth connection part; 741) electrode connector; 742) electrode connector; 743) electrode connector; 75) second control connection member; 75*a*) second control connection member; 781 to 783) electrode connector; 90) encapsulation resin; X) width-wise direction; Y) length-wise direction; Z) thickness-wise direction; A1, A2) semiconductor device; 1A) first lead; 1B) second lead; 1C) third lead; 1D) fourth lead; 1E) fifth lead; 1F) sixth lead; 1G) seventh lead; 3A, 3B) first conduction member; 4A, 4B) second conduction member; 5) third conduction member; 6) fourth conduction member; 3*a*A, 3*a*B, 3*b*A, 3*b*B, 3*d*A, 3*d*B, 4*a*A, 4*a*B, 4*b*A, 4*b*B, 4*d*A, 4*d*B) linkage part; 3*c*A, 3*c*B, 3*e*A, 3*e*B, 4*c*A, 4*c*B, 4*e*A, 4*e*B) joint; 7) encapsulation resin; 10) semiconductor element; 10A, 10B) island portion; 11A) output terminal; 11B) positive power input terminal; 11C) negative power input terminal; 11D) first gate terminal (control terminal); 11E) first source sense terminal (auxiliary terminal); 11F) second gate terminal (control terminal); 11G) second source sense terminal (auxiliary terminal); 12A, 12B, 13C, 13D, 13F) intermediate portion; 12C, 12D, 12E, 12F, 12G) bonding portion; 21A, 21B) first semiconductor element; 22A, 22B) second semiconductor element; 23A, 23B) third semiconductor element; 31A, 31B, 41A, 41B, 51C, 61C) first extension; 32A, 32B, 42A, 42B, 52C, 62C) second extension; 33A, 33B, 43A, 43B, 53C, 63C) third extension; 34A, 34B, 44A, 44B, 54C) terminal extension; 35A, 35B, 45A, 45B) first joint; 36A, 36B, 46A, 46B) second joint; 37A, 37B, 47A, 47B) third joint; 38A, 38B, 48A, 48B) first linkage; 39A, 39B, 49A, 49B) second linkage; 30A, 30B) third linkage; 64C) linkage extension; 65C) joint; 71C) main surface; 72) back surface; 73C) first side surface; 74C) second side surface; 92, 93) conductive bonding material; 211A, 211B, 221A, 221B, 231A, 231B) gate electrode; 212A, 212B, 222A, 222B, 232A, 232B) source electrode; 213A, 213B, 223A, 223B, 233A, 233B) drain electrode; 311A, 311B, 321A, 321B, 331A, 331B, 341A, 341B, 411A, 411B, 421A, 421B, 431A, 431B, 441A, 441B, 511C, 521C, 531C, 541C, 611C, 621C, 631C, 641C: bonding portion; 312A, 312B, 322A, 322B, 332A, 332B, 342A, 342B, 412A, 412B, 422A, 422B, 432A, 432B, 442A, 442B, 512C, 522C, 532C, 542C, 612C, 622C, 632C, 642C) inclined portion

The invention claimed is:

1. A semiconductor device, comprising:
a die pad including:
   a first die pad including a first main surface, and
   a second die pad including a second main surface;
switching elements including:
   first switching elements connected to the first main surface, and
   second switching elements connected to the second main surface,
     each of the switching elements including an element main surface and an element back surface that face in opposite directions, and further including a control electrode and a main surface drive electrode that are formed on the element main surface and a back surface drive electrode that is formed on the element back surface, the back surface drive electrode being connected to the main surface of the corresponding die pad;
a control lead disposed separate from the die pad, including:
   a first control lead, and
   a second control lead; and
a control connection member including:
   a first control connection member connecting the control electrodes of the first switching elements to the first control lead, and
   a second control connection member connecting the control electrodes of the second switching elements to the second control lead, wherein
     each of the first and second control connection members includes a lead connector and electrode connectors,
     the lead connector includes a first end and a second end,
     the first end of the lead connector is connected to the corresponding control lead,
     the electrode connectors are connected between the second end of the lead connector and the control electrodes of the corresponding switching elements,
     the electrode connectors are equal in length,
     the first main surface and the second main surface face in the same direction, and
     the first die pad and the second die pad are disposed in order in a second direction that intersects the first direction, the first direction being parallel to the first main surface and the second main surface.

2. The semiconductor device according to claim 1, wherein
  two of the switching elements are connected to the corresponding die pad, and
  the second end of the lead connector of the corresponding control connection member is disposed between the two switching elements.

3. The semiconductor device according to claim 1, wherein
  the second end of the lead connector is disposed on a line extending between the control electrodes of two of the corresponding switching elements, and
  the electrode connectors extend in opposite directions.

4. The semiconductor device according to claim 1, further comprising a first drive connection member connecting the main surface drive electrodes of the first switching elements to the second main surface.

5. The semiconductor device according to claim 1, further comprising:

a first drive lead connected to the first die pad;

a second drive lead located separate from the second die pad;

an output lead connected to the second die pad; and a second drive connection member connecting the main surface drive electrodes of the second switching elements to the second drive lead.

6. The semiconductor device according to claim 5, further comprising:

an encapsulation resin covering part of the first die pad and the second die pad, the first switching elements, and the second switching elements, the encapsulation resin including a resin side surface facing in a direction parallel to the first main surface and the second main surface, wherein the first control lead, the second control lead, the first drive lead, the second drive lead, and the output lead project from the resin side surface and extend in a direction that is parallel to the main surface of the corresponding die pad.

7. The semiconductor device according to claim 5, further comprising:

an encapsulation resin covering part of the first die pad and the second die pad, the first switching elements, and the second switching elements, the encapsulation resin including a first resin side surface facing in a direction parallel to the first main surface and the second main surface and a second resin side surface facing in a direction opposite from the first resin side surface, wherein the first drive lead and the second drive lead project from the first resin side surface and extend in a direction parallel to the main surface of the corresponding die pad, and the first control lead and the second control lead project from the second resin side surface and extend in a direction parallel to the main surface of the corresponding die pad.

8. The semiconductor device according to claim 7, wherein the output lead projects from one of the first resin side surface and the second resin side surface.

9. A semiconductor device, comprising:

a die pad including:

a first die pad including a first main surface, and a second die pad including a second main surface;

switching elements including:

first switching elements connected to the first main surface, and second switching elements connected to the second main surface each of the switching elements including an element main surface and an element back surface that face in opposite directions and further including a control electrode and a main surface drive electrode that are formed on the element main surface and a back surface drive electrode that is formed on the element back surface, the back surface drive electrode being connected to the main surface of the corresponding die pad;

a control lead disposed separate from the die pad, the control lead including:

a first control lead, and a second control lead; and a control connection member including:

a first control connection member connecting the control electrodes of the first switching elements to the first control lead, and a second control connection member connecting the control electrodes of the second switching elements to the second control lead, wherein the switching elements are disposed so that the control electrodes align in a first direction that is parallel to the main surface of the corresponding die pad, each of the first and second control connection members includes:

an electrode connector, a lead connector, and a joint, the electrode connector linearly extends in the first direction and is connected to the control electrodes of the corresponding switching elements, the lead connector is disposed parallel to the electrode connector and is connected to the corresponding control lead, the joint joins an end of the electrode connector and an end of the lead connector located opposite from the corresponding control lead, the first main surface and the second main surface face in the same direction, and and the first die pad and the second die pad are disposed in order in a second direction that intersects the first direction.

10. The semiconductor device according to claim 9, wherein the joint overlaps the control electrodes of the switching elements as viewed in a direction orthogonal to the main surface.

11. The semiconductor device according to claim 9, further comprising a first drive connection member connecting the main surface drive electrodes of the first switching elements to the second main surface.

12. The semiconductor device according to claim 9, further comprising:

a first drive lead connected to the first die pad;

a second drive lead located separate from the second die pad;

an output lead connected to the second die pad; and a second drive connection member connecting the main surface drive electrodes of the second switching elements to the second drive lead.

13. The semiconductor device according to claim 12, further comprising:

an encapsulation resin covering part of the first die pad and the second die pad, the first switching elements, and the second switching elements, the encapsulation resin including a resin side surface facing in a direction parallel to the first main surface and the second main surface, wherein the first control lead, the second control lead, the first drive lead, the second drive lead, and the output lead project from the resin side surface and extend in a direction that is parallel to the main surface of the corresponding die pad.

14. The semiconductor device according to claim 12, further comprising:

an encapsulation resin covering part of the first die pad and the second die pad, the first switching elements, and the second switching elements, the encapsulation resin including a first resin side surface facing in a direction parallel to the first main surface and the second main surface and a second resin side surface facing in a direction opposite from the first resin side surface, wherein the first drive lead and the second drive lead project from the first resin side surface and extend in a direction parallel to the main surface of the corresponding die pad, and the first control lead and the second control lead project from the second resin side surface and extend in a direction parallel to the main surface of the corresponding die pad.

15. The semiconductor device according to claim 14, wherein the output lead projects from one of the first resin side surface and the second resin side surface.

16. A semiconductor device, comprising:

a die pad including:

a first die pad including a first main surface, and a second die pad including a second main surface;

switching elements including:

first switching elements connected to the first main surface, and second switching elements connected to the second main surface, each of the switching elements including an element main surface and an element back surface that face in opposite directions and further including a control electrode and a main surface drive electrode that are formed on the element main surface and a back surface drive electrode that is formed on the element back surface, the back surface drive electrode being connected to the main surface of the corresponding die pad;

a control lead disposed separate from the die pad, the control lead including:

a first control lead, and a second control lead; and a control connection member including:

a first control connection member connecting the control electrodes of the first switching elements to the first control lead, and a second control connection member connecting the control electrodes of the second switching elements to the second control lead, wherein the switching elements are disposed so that the control electrodes align in a first direction that is parallel to the main surface of the corresponding die pad, each of the first and second switching elements includes:

a first element, a second element, and a third element, the second element and the third element are located at opposite sides of the first element in the first direction, and each of the first and second control connection members includes:

a lead connector including a distal end and a proximal end, the proximal end being connected to the corresponding control lead, a first branch part and a second branch part connected to the distal end of the lead connector,

76 a first connection part connected between a distal end of the first branch part and the control electrode of the first element of the corresponding switching elements, a second connection part connected between a distal end of the second branch part and the control electrode of the first element of the corresponding switching elements, a third connection part connected between the distal end of the first branch part and the control electrode of the second element of the corresponding switching elements, a fourth connection part connected between the distal end of the second branch part and the control electrode of the third element of the corresponding switching elements, the first main surface and the second main surface face in the same direction, and the first die pad and the second die pad are disposed in order in a second direction that intersects the first direction.

17. The semiconductor device according to claim 16, wherein the first branch part and the second branch part are equal in length, the first connection part and the second connection part are equal in length, and the third connection part and the fourth connection part are equal in length.

18. The semiconductor device according to claim 16, wherein the first branch part and the first connection part are disposed to be adjacent and parallel to each other, and the second branch part and the second connection part are disposed to be adjacent and parallel to each other.

19. The semiconductor device according to claim 16, further comprising a first drive connection member connecting the main surface drive electrodes of the first switching elements to the second main surface.

20. The semiconductor device according to claim 16, further comprising:

a first drive lead connected to the first die pad;

a second drive lead located separate from the second die pad;

an output lead connected to the second die pad; and a second drive connection member connecting the main surface drive electrodes of the second switching elements to the second drive lead.

21. The semiconductor device according to claim 20, further comprising:

an encapsulation resin covering part of the first die pad and the second die pad, the first switching elements, and the second switching elements, the encapsulation resin including a resin side surface facing in a direction parallel to the first main surface and the second main surface, wherein the first control lead, the second control lead, the first drive lead, the second drive lead, and the output lead project from the resin side surface and extend in a direction that is parallel to the main surface of the corresponding die pad.

22. The semiconductor device according to claim 20, further comprising:

an encapsulation resin covering part of the first die pad and the second die pad, the first switching elements, and the second switching elements, the encapsulation resin including a first resin side surface facing in a direction parallel to the first main surface and the
second main surface and a second resin side surface
facing in a direction opposite from the first resin side
surface, wherein the first drive lead and the second drive lead project 5
from the first resin side surface and extend in a
direction parallel to the main surface of the corre-
sponding die pad, and the first control lead and the second control lead project
from the second resin side surface and extend in a 10
direction parallel to the main surface of the corre-
sponding die pad.

23. The semiconductor device according to claim 22,
wherein the output lead projects from one of the first resin
side surface and the second resin side surface. 15

\* \* \* \* \*

78